(12) United States Patent
Gonion

(10) Patent No.: US 8,539,205 B2
(45) Date of Patent: *Sep. 17, 2013

(54) PROCESSING VECTORS USING WRAPPING MULTIPLY AND DIVIDE INSTRUCTIONS IN THE MACROSCALAR ARCHITECTURE

(71) Applicant: Apple Inc., Cupertino, CA (US)

(72) Inventor: Jeffry E. Gonion, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/625,131

(22) Filed: Sep. 24, 2012

(65) Prior Publication Data

US 2013/0024670 A1    Jan. 24, 2013

Related U.S. Application Data

(63) Continuation-in-part of application No. 12/541,526, filed on Aug. 14, 2009, now Pat. No. 8,364,938, and a continuation-in-part of application No. 13/188,737, filed on Jul. 22, 2011, now Pat. No. 8,447,956, which is a continuation-in-part of application No. 12/541,546, filed on Aug. 14, 2009, now Pat. No. 8,359,461.

(60) Provisional application No. 61/089,251, filed on Aug. 15, 2008, provisional application No. 61/089,251, filed on Aug. 15, 2008.

(51) Int. Cl.
*G06F 9/302*        (2006.01)

(52) U.S. Cl.
USPC .............................................. 712/222; 712/7

(58) Field of Classification Search
None
See application file for complete search history.

(56) References Cited

U.S. PATENT DOCUMENTS

| | | |
|---|---|---|
| 4,873,630 A | 10/1989 | Rusterholz et al. |
| 5,151,991 A | 9/1992 | Iwasawa et al. |
| 5,430,884 A | 7/1995 | Beard et al. |
| 5,548,768 A | 8/1996 | Gallup et al. |
| 5,553,309 A | 9/1996 | Asai et al. |
| 6,098,162 A | 8/2000 | Schiffleger et al. |
| 6,301,706 B1 * | 10/2001 | Maslennikov et al. ....... 717/160 |
| 6,308,250 B1 | 10/2001 | Klausler |
| 6,959,378 B2 | 10/2005 | Nickolls et al. |
| 7,307,453 B1 | 12/2007 | Maitland et al. |
| 7,725,520 B2 | 5/2010 | Sakaguchi et al. |
| 7,873,812 B1 | 1/2011 | Mimar |
| 7,900,025 B2 | 3/2011 | Gschwind |
| 8,010,953 B2 | 8/2011 | Gschwind |

(Continued)

OTHER PUBLICATIONS

Young (NRL Connection Machine Fortran Library); Naval Research Laboratory; NRL Memorandum Report 6807; Apr. 16, 1991; 193 pages.*

(Continued)

*Primary Examiner* — Keith Vicary
(74) *Attorney, Agent, or Firm* — Anthony M. Petro; Meyertons, Hood, Kivlin, Kowert & Goetzel, P.C.

(57) ABSTRACT

Embodiments of a system and a method in which a processor may execute instructions that cause the processor to receive an input vector and a control vector are disclosed. The executed instructions may also cause the processor to perform a product or quotient operation on another input vector dependent upon the input vector and the control vector.

17 Claims, 18 Drawing Sheets

(56) References Cited

U.S. PATENT DOCUMENTS

| | | |
|---|---|---|
| 8,078,847 B2 | 12/2011 | Gonion et al. |
| 8,131,979 B2 | 3/2012 | Gonion et al. |
| 8,243,100 B2 | 8/2012 | Krithivasan et al. |
| 8,261,043 B2 | 9/2012 | Inoue et al. |
| 2003/0167460 A1 | 9/2003 | Desai et al. |
| 2004/0073773 A1 | 4/2004 | Demjanenko |
| 2005/0240644 A1 | 10/2005 | Van Berkel et al. |
| 2006/0004996 A1* | 1/2006 | Gonion .................. 712/241 |
| 2006/0041610 A1* | 2/2006 | Hokenek et al. ............ 708/620 |
| 2008/0317150 A1* | 12/2008 | Alexander et al. ............ 375/260 |
| 2010/0058037 A1 | 3/2010 | Gonion et al. |
| 2010/0095087 A1 | 4/2010 | Eichenberger et al. |
| 2010/0115233 A1 | 5/2010 | Brewer et al. |
| 2010/0274988 A1 | 10/2010 | Mimar |

OTHER PUBLICATIONS

Sheffler (A Portable MPI-Based Parallel Vector Template Library); Research Institute for Advanced Computer Science—NASA Ames Research Center; RIACS Technical Report 95.04, Feb. 1995; 32 pages.*

Cray (Cray SVI Application Optimization Guide S-2312-36); Jun. 2002; 7 pages.*

* cited by examiner

| x = 0,  | A[x] = 1,  | r = 1,  | s = 0,  | B[x] = 1  |
| x = 1,  | A[x] = 10, | r = 1,  | s = 16, | B[x] = 17 |
| x = 2,  | A[x] = 16, | r = 1,  | s = 16, | B[x] = 17 |
| x = 3,  | A[x] = 16, | r = 1,  | s = 26, | B[x] = 27 |
| x = 4,  | A[x] = 26, | r = 1,  | s = 29, | B[x] = 30 |
| x = 5,  | A[x] = 29, | r = 1,  | s = 9,  | B[x] = 10 |
| x = 7,  | A[x] = 9,  | r = 13, | s = 9,  | B[x] = 22 |
| x = 7,  | A[x] = 1,  | r = 0,  | s = 9,  | B[x] = 9  |
| x = 8,  | A[x] = 20, | r = 0,  | s = 20, | B[x] = 20 |
| x = 9,  | A[x] = 0,  | r = 17, | s = 20, | B[x] = 37 |
| x = 10, | A[x] = 16, | r = 17, | s = 9,  | B[x] = 26 |
| x = 11, | A[x] = 14, | r = 17, | s = 1,  | B[x] = 18 |
| x = 12, | A[x] = 20, | r = 17, | s = 17, | B[x] = 34 |
| x = 13, | A[x] = 14, | r = 17, | s = 19, | B[x] = 36 |
| x = 14, | A[x] = 22, | r = 17, | s = 15, | B[x] = 32 |
| x = 15, | A[x] = 13, | r = 17, | s = 30, | B[x] = 47 |

*FIG. 4A*

| x =          | 0  | 1  | 2  | 3  | 4  | 5  | 6  | 7  |
|---|---|---|---|---|---|---|---|---|
| A[x] =       | 1  | 10 | 16 | 16 | 26 | 29 | 9  | 1  |
| r = A[x+s] = | 1  |    |    |    |    |    |    |    |
| s = A[x+r] = |    | 16 | 16 | 26 | 29 | 9  |    |    |
| r = A[x+s] = |    |    |    |    |    |    | 13 | 0  |
| B[x] =       | 1  | 17 | 17 | 27 | 30 | 10 | 22 | 9  |

| x =          | 8  | 9  | 10 | 11 | 12 | 13 | 14 | 15 |
|---|---|---|---|---|---|---|---|---|
| A[x] =       | 20 | 0  | 16 | 14 | 20 | 14 | 22 | 13 |
| s = A[x+r] = | 20 |    |    |    |    |    |    |    |
| r = A[x+s] = |    | 17 |    |    |    |    |    |    |
| s = A[x+r] = |    |    | 9  | 1  | 17 | 19 | 15 | 30 |
| B[x] =       | 20 | 37 | 26 | 18 | 34 | 36 | 32 | 47 |

*FIG. 4B*

SOURCE CODE

```
r = 0 ;
s = 0 ;
for (x=0; x<KSIZE; ++x)
{
    if (A[x] < FACTOR)
    {
        r = A[x+s] ;
    {
    else
    {
        s = A[x+r] ;
    }
    B[x] = r + s ;
}
```

FIG. 5A

VECTORIZED CODE

```
r = 0 ;
s = 0 ;
x = VectorIndex (0,1) ;
goto Loop1Tail ;
Loop1:
    s = PropagatePriorF (s,p0) ;
    ~p0; t = VectorReadInt (A, x) ;
    p1 = (t < FACTOR) ;
    i2 = ConditionalStop (p1, kTF | kFT) ;
    p2 = 0 ;
Loop2:
    !p0; p2 = GeneratePredicates (p2, i2) ;
    ~p2; t = VectorTest (p1) ;
    if ( !FIRST () ) goto Skip1 ;
    t1 = x + s ;
    ~p2; r = VectorReadInt (A, t1) ;
    goto Skip2 ;
Skip1 :
    r = PropagatePriorF (r, p2) ;
    t2 = x + r ;
    ~p2; s = VectorReadInt (A, t2) ;
    s = PropagatePostT (s, s, p2) ;
Skip2 :
    if ( !CARRY () ) goto Loop2 ;
    v = r + s ;
    ~p0; s = VectorWriteInt (B, x, v) ;
    x += VECLEN ;
Loop1Tail:
    p0 = (x < KSIZE) ;
    if ( FIRST (p0) ) goto Loop1 ;
```

FIG. 5B

EXAMPLE 2A
VECTORIZED
(NON-SPECULATIVE)

```
j = 0;
x = VectorIndex (0,1) ;
goto Loop1Tail;
Loop1:
    p3 = 0;
    j = PropagatePriorF (j, p0) ;
    ~p0; t = VectorReadInt (A, x) ;
    p1 = t < FACTOR;
    p2 = ConditionalStop (p1, kTT | kTF) ;
Loop2:
    t = x + j ;
    !p0; p3 = GeneratePredicates (p3, p2) ;
    ~p3; t = VectorTest (p1) ;
    if ( NONE () ) goto Loop2Tail ;
    !p3; p4 = p1 + 0;
    ~p4; j = VectorRead (A, t) ;
    j = PropagatePostT (j, j, p4) ;
Loop2Tail:
    if ( !CARRY () ) goto Loop2
    ~p0; VectorWrite (B, x, j) ;
    x += VECLEN;
Loop1Tail:
    p0 = (x < KSIZE) ;
    if ( FIRST () ) goto Loop1;
```

FIG. 6A

EXAMPLE 2B
VECTORIZED
(SPECULATIVE)

```
j = 0;
x = VectorIndex (0,1) ;
goto Loop1Tail ;
Loop1:
    p3 = 0 ;
    j = PropagatePriorF (j, p0) ;
Loop2:
    !p0; p5 = Remaining (p3) ;
    ~p5; t = x + j ;
    ~p5; t = VectorReadIntFF (A, t, ps) ;
    ~p5; p5 &= ps ;
    ~p5; p1 (t < FACTOR) ;
    !p5; i2 = ConditionalStop (p1, kTT | kTF) ;
    !p0; p3 = GeneratePredicates (p3, i2) ;
    ~p3; VectorTest (p1) ;
    ~p3; if (NONE () ) goto Loop2Tail ;
    !p3; p4 = p1 + 0 ;
    ~p4; j = VectorRead (A, x) ;
    j = PropagatePostT (j, j, p4) ;
Loop2Tail:
    ~p0; VectorTest (p3) ;
    if ( !LAST () ) goto Loop2 ;
    ~p0; VectorWrite (B, x, j) ;
    x += VECLEN ;
Loop1Tail:
    p0 = (x < KSIZE) ;
    if ( FIRST () ) goto Loop1 ;
```

FIG. 6B

EXAMPLE 3
VECTORIZED

```
        x = VectorIndex (0,1) ;
        goto Loop1Tail ;
Loop1:
    ~p0; r = VectorReadInt(C,x);
    ~p0; s = VectorReadInt (D, x) ;
    i1 = CheckHazardP(r,x,p0);
    i2 = CheckHazardP(s,x,p0);
    i3 = VectorMax(i1,i2);
    p4 = 0 ;
Loop2:
    ~p0; p4 = GeneratePredicates (p4, i3) ;
    ~p4; t1 = VectorReadInt(A,r) ;
    ~p4; t2 = VectorReadInt(A,s);
    ~p4; t3 = t1 + t2 ;
    ~p4; VectorWriteInt(A,x,t3);
    ~p0; if (!CARRY( )) goto Loop2;
    x += VECLEN;
Loop1Tail:
    p0 = (x < KSIZE) ;
    if ( FIRST (p0) ) goto Loop1 ;
```

FIG. 7

*EXAMPLE 4*
*VECTORIZED*

```
        x = VectorIndex (0,1) ;
        goto Loop1Tail ;
Loop1:
        j = PropagatePriorF(j,p0);
        ~p0; f = VectorReadInt(A,x);
        ~p0; g = VectorReadInt (B, x) ;
        !p0; p1 = (f < FACTOR);
        !p0; p2 = (g < FACTOR);
        ~p1; h = VectorReadInt(C,x);
        ~p2; i = VectorReadInt(D,x);
        !p1; ix = CheckHazardP(h,i,p2);
        p3 = 0 ;
Loop2:
        p3 = GeneratePredicates (p3, ix) ;
        !p3; p4 = p1 + 0;
        !p3; p5 = p2 + 0;
        ~p4; j = VectorReadInt(E,h);
        j = CopyPropagate(j,j,p4);
        ~p5; VectorWriteInt(E,i,j);
        ~p0; if (!LAST(p3)) goto Loop2;
        x += VECLEN;
Loop1Tail:
        p0 = (x < KSIZE) ;
        if ( FIRST (p0) ) goto Loop1 ;
```

FIG. 8

PROCESSING VECTORS USING WRAPPING MULTIPLY AND DIVIDE INSTRUCTIONS IN THE MACROSCALAR ARCHITECTURE

PRIORITY CLAIM

This application is a continuation-in-part of U.S. patent application Ser. No. 12/541,505, filed on Aug. 14, 2009, which claims priority to U.S. Provisional Patent Application No. 61/089,251, filed Aug. 15, 2008, and this application is also a continuation in-part of U.S. patent application Ser. No. 13/188,737, filed on Jul. 22, 2011, which is a continuation-in-part of U.S. patent application Ser. No. 12/541,546, filed on Aug. 14, 2009, which claims priority to U.S. Provisional Patent Application No. 61/089,251, filed Aug. 15, 2008.

BACKGROUND

1. Technical Field

This disclosure relates to vector processing, and more particularly to the processing of particular vector instructions that perform certain arithmetic and logical operations.

2. Description of the Related Art

In a conventional vector processor that exploits data-level parallelism (DLP), vectorization of loops in program code may affect the widespread adoption of DLP processors. In a typical program, a large portion of execution time is spent in loops. Unfortunately, many of these loops have characteristics that render them unvectorizable in conventional DLP processors. Thus, the performance benefits gained from attempting to vectorize program code can be limited.

One obstacle to vectorizing loops in program code in conventional systems is dependencies between iterations of the loop. For example, loop-carried data dependencies and memory-address aliasing are two such dependencies. These dependencies can be identified by a compiler during the compiler's static analysis of program code, but they cannot be completely resolved until runtime data is available. Thus, because the compiler cannot conclusively determine that runtime dependencies will not be encountered, the compiler cannot vectorize the loop. Hence, because existing systems require that the compiler determine the extent of available parallelism during compilation, relatively little code can be vectorized.

SUMMARY OF THE EMBODIMENTS

Various embodiments of recurrent product and quotient instructions are disclosed. Broadly speaking, a system and method are contemplated in which a processor may execute instructions that cause the processor to receive an operand vector and a control vector and to optionally receive a basis vector and a selection vector, and to perform a product or quotient operation dependent upon these vectors.

In one embodiment, the method includes a processor receiving an input vector and a control vector. The processor may also generate a result vector. Each of the input vectors, the control vector, and the result vector may include a respective number of elements that occupy ordered element positions. For each given one of the ordered element positions, the processor may perform a product or quotient operation dependent upon the control vector and the input vector.

In one specific implementation, the method may also include the processor receiving a selection vector that may include a number of ordered elements. The processor may also select a basis value from a basis vector at an element position corresponding to the first active element in the selection vector.

In another specific implementation, the method may also include the processor selecting the basis value from the last element of the basis vector when the first active element of the selection vector occurs in the first element position of the selection vector.

BRIEF DESCRIPTION OF THE DRAWINGS

FIG. 4A is a diagram illustrating a sequence of variable states during scalar execution of the loop shown in Example 1.

FIG. 4B is a diagram illustrating a progression of execution for Macroscalar vectorized program code of the loop of Example 1.

FIG. 5A and FIG. 5B are diagrams illustrating one embodiment of the vectorization of program source code.

FIG. 6A is a diagram illustrating one embodiment of non-speculative vectorized program code.

FIG. 6B is a diagram illustrating another embodiment of speculative vectorized program code.

FIG. 7 is a diagram illustrating one embodiment of vectorized program code.

FIG. 8 is a diagram illustrating another embodiment of vectorized program code.

Figure 1:
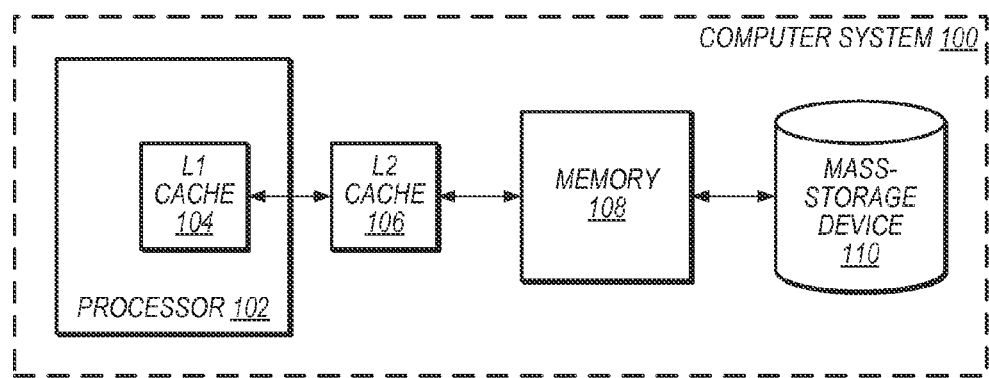
FIG. 1 is a block diagram of one embodiment of a computer system.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Computer System Overview

Turning now to FIG. 1, a block diagram of one embodiment of a computer system is shown. Computer system 100 includes a processor 102, a level two (L2) cache 106, a memory 108, and a mass-storage device 110. As shown, processor 102 includes a level one (L1) cache 104. It is noted that although specific components are shown and described in computer system 100, in alternative embodiments different components and numbers of components may be present in computer system 100. For example, computer system 100 may not include some of the memory hierarchy (e.g., memory 108 and/or mass-storage device 110). Alternatively, although the L2 cache 106 is shown external to the processor 102, it is contemplated that in other embodiments, the L2 cache 106 may be internal to the processor 102. It is further noted that in such embodiments, a level three (L3) cache (not shown) may be used. In addition, computer system 100 may include graphics processors, video cards, video-capture devices, user-interface devices, network cards, optical drives, and/or other peripheral devices that are coupled to processor 102 using a bus, a network, or another suitable communication channel (all not shown for simplicity).

In various embodiments, processor 102 may be representative of a general-purpose processor that performs computational operations. For example, processor 102 may be a central processing unit (CPU) such as a microprocessor, a microcontroller, an application-specific integrated circuit (ASIC), or a field-programmable gate array (FPGA). However, as described further below, processor 102 may include one or more mechanisms for vector processing (e.g., vector execution units). An example vector execution unit of processor 102 is described in greater detail below in conjunction with the description of FIG. 2.

The mass-storage device 110, memory 108, L2 cache 106, and L1 cache 104 are storage devices that collectively form a memory hierarchy that stores data and instructions for processor 102. More particularly, the mass-storage device 110 may be a high-capacity, non-volatile memory, such as a disk drive or a large flash memory unit with a long access time, while L1 cache 104, L2 cache 106, and memory 108 may be smaller, with shorter access times. These faster semiconductor memories store copies of frequently used data. Memory 108 may be representative of a memory device in the dynamic random access memory (DRAM) family of memory devices. The size of memory 108 is typically larger than L1 cache 104 and L2 cache 106, whereas L1 cache 104 and L2 cache 106 are typically implemented using smaller devices in the static random access memories (SRAM) family of devices. In some embodiments, L2 cache 106, memory 108, and mass-storage device 110 are shared between one or more processors in computer system 100.

In some embodiments, the devices in the memory hierarchy (i.e., L1 cache 104, etc.) can access (i.e., read and/or write) multiple cache lines per cycle. These embodiments may enable more effective processing of memory accesses that occur based on a vector of pointers or array indices to non-contiguous memory addresses.

It is noted the data structures and program instructions (i.e., code) described below may be stored on a non-transitory computer-readable storage device, which may be any device or storage medium that can store code and/or data for use by a computer system (e.g., computer system 100). Generally speaking, a non-transitory computer-readable storage device includes, but is not limited to, volatile memory, non-volatile memory, magnetic and optical storage devices such as disk drives, magnetic tape, compact discs (CDs), digital versatile discs or digital video discs (DVDs), or other media capable of storing computer-readable media now known or later developed. As such, mass-storage device 110, memory 108, L2 cache 106, and L1 cache 104 are all examples of non-transitory computer readable storage devices.

Processor

Figure 2:
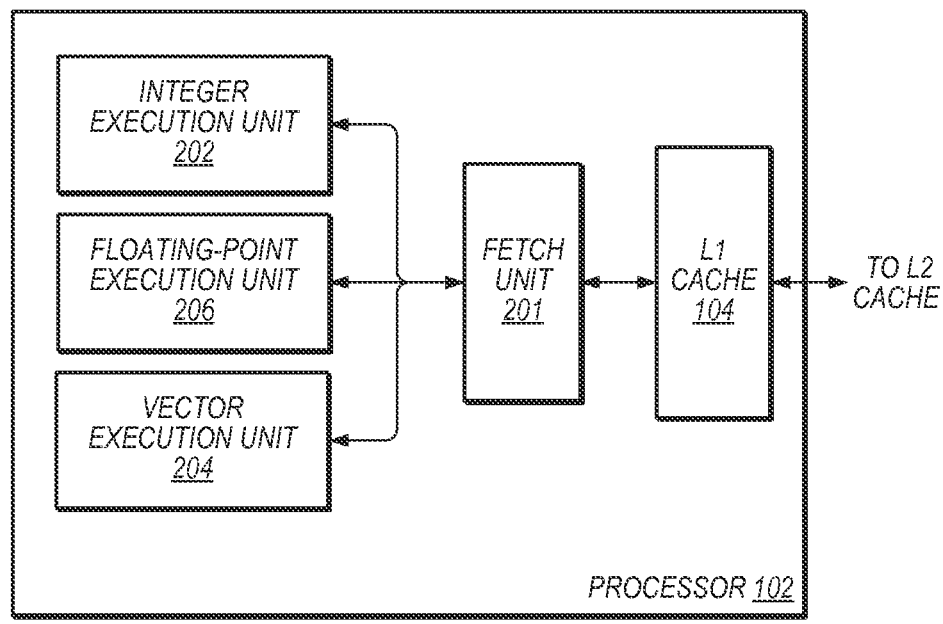
FIG. 2 is a block diagram illustrating additional details of an embodiment of the processor shown in FIG. 1.

Referring to FIG. 2, a block diagram illustrating additional details of an embodiment of the processor of FIG. 1 is shown. In the embodiment shown in FIG. 2, processor 102 may include a number of pipeline stages, although for brevity not all are shown in FIG. 2. Accordingly, as shown, processor 102 includes L1 cache 104, an instruction fetch unit 201, an integer execution unit 202, a floating-point execution unit 206, and a vector execution unit 204. It is noted that integer execution unit 202, floating-point execution unit 206, and vector execution unit 204 as a group may be interchangeably referred to as "the execution units."

In various embodiments, the execution units may perform computational operations such as logical operations, mathematical operations, or bitwise operations, for example, for an associated type of operand. More specifically, integer execution unit 202 may perform computational operations that involve integer operands, floating-point execution unit 206 may perform computational operations that involve floating-point operands, and vector execution unit 204 may perform computational operations that involve vector operands. Any suitable configurations may be employed for integer execution unit 202 and floating-point execution unit 206, depending on the particular configuration of architectural and performance parameters governing a particular processor design. As noted above, although the embodiment of processor 102 shown in FIG. 2 includes a particular set of components, it is contemplated that in alternative embodiments processor 102 may include different numbers or types of execution units, functional units, and pipeline stages such as an instruction decode unit, a scheduler or reservations station, a reorder buffer, a memory management unit, I/O interfaces, etc. that may be coupled to the execution units.

The vector execution unit 204 may be representative of a single-instruction-multiple-data (SIMD) execution unit in the classical sense, in that it may perform the same operation on multiple data elements in parallel. However, it is noted that in some embodiments, the vector instructions described here may differ from other implementations of SIMD instructions. For example, in an embodiment, elements of a vector operated on by a vector instruction may have a size that does not vary with the number of elements in the vector. By contrast, in some SIMD implementations, data element size does vary with the number of data elements operated on (e.g., a SIMD architecture might support operations on eight 8-bit elements, but only four 16-bit elements, two 32-bit elements, etc.). In one embodiment, the vector execution unit 204 may operate on some or all of the data elements that are included in vectors of operands. More particularly, the vector execution unit 204 may be configured to concurrently operate on different elements of a vector operand of a vector program instruction.

In one embodiment, the vector execution unit 204 may include a vector register file (not shown) which may include vector registers that can hold operand vectors and result vectors for the vector execution unit 204. In some embodiments, there may be 32 vector registers in the vector register file, and each vector register may include 128 bits. However, in alternative embodiments, there may be different numbers of vector registers and/or different numbers of bits per register.

The vector execution unit 204 may be configured to retrieve operands from the vector registers and to execute vector instructions that cause vector execution unit 204 to perform operations in parallel on some or all of the data elements in the operand vector. For example, vector execution unit 204 can perform logical operations, mathematical operations, or bitwise operations on the elements in the vector. Vector execution unit 204 may perform one vector operation per instruction cycle (although as described above, a "cycle" may include more than one clock cycle that may be used to trigger, synchronize, and/or control vector execution unit 204's computational operations).

In one embodiment, vector execution unit 204 may support vectors that hold N data elements (e.g., bytes, words, doublewords, etc.), where N may be any positive whole number. In these embodiments, vector execution unit 204 may perform operations on N or fewer of the data elements in an operand vector in parallel. For example, in an embodiment where the vector is 256 bits in length, the data elements being operated on are four-byte elements, and the operation is adding a value to the data elements, these embodiments can add the value to any number of the elements in the vector. It is noted that N may be different for different implementations of processor 102.

The vector execution unit 204 may, in various embodiments, include at least one control signal that enables the dynamic limitation of the data elements in an operand vector on which vector execution unit 204 operates. Specifically, depending on the state of the control signal, vector execution unit 204 may selectively operate on any or all of the data elements in the vector. For example, in an embodiment where the vector is 512 bits in length and the data elements being operated on are four-byte elements, the control signal can be asserted to prevent operations from being performed on some or all of 16 data elements in the operand vector. Note that "dynamically" limiting the data elements in the operand vector upon which operations are performed can involve asserting the control signal separately for each cycle at runtime.

In some embodiments, as described in greater detail below, based on the values contained in a vector of predicates or one or more scalar predicates, vector execution unit 204 applies vector operations to selected vector data elements only. In some embodiments, the remaining data elements in a result vector remain unaffected (which may also be referred to as "predication") or are forced to zero (which may also be referred to as "zeroing" or "zeroing predication"). In some embodiments, the clocks for the data element processing subsystems ("lanes") that are unused due to predication or zeroing in vector execution unit 204 can be power and/or clock-gated, thereby reducing dynamic power consumption in vector execution unit 204.

In various embodiments, the architecture may be vector-length agnostic to allow it to adapt parallelism at runtime. More particularly, when instructions or operations are vector-length agnostic, the operation (i.e., instruction, etc.) may be executed using vectors of any length, up to the limitations imposed by the supporting hardware. For example, in embodiments in which vector execution hardware supports vectors that can include eight separate four-byte elements (thus having a vector length of eight elements), a vector-length agnostic operation can operate on any number of the eight elements in the vector. On a different hardware implementation that supports a different vector length (e.g., four elements), the vector-length agnostic operation may operate on the different number of elements made available to it by the underlying hardware. Thus, a compiler or programmer need not have explicit knowledge of the vector length supported by the underlying hardware (e.g., vector execution unit 204). In such embodiments, a compiler generates or a programmer writes program code that need not rely on (or use) a specific vector length. In some embodiments it may be forbidden to specify a specific vector size in program code. Thus, the compiled code in these embodiments (i.e., binary code) runs on other execution units that may have differing vector lengths, while potentially realizing performance gains from processors that support longer vectors. In such embodiments, the vector length may for a given hardware unit such as a processor may be read from a system register during runtime. Consequently, as process technology allows longer vectors, execution of legacy binary code simply speeds up without any effort by software developers.

Generally, vector lengths may be implemented as powers of two (e.g., two, four, eight, etc.). However, in some embodiments, vector lengths need not be powers of two. Specifically, vectors of three, seven, or another number of data elements can be used in the same way as vectors with power-of-two numbers of data elements.

In various embodiments, each data element in the vector can contain an address that is used by vector execution unit 204 for performing a set of memory accesses in parallel. In such embodiments, if one or more elements of the vector contain invalid memory addresses, invalid memory-read operations can occur. Accordingly, invalid memory-read operations that would otherwise result in program termination may instead cause any elements with valid addresses to be read and elements with invalid elements to be flagged, allowing program execution to continue in the face of speculative, and in hindsight illegal, read operations.

In some embodiments, processor 102 (and hence vector execution unit 204) is able to operate on and use vectors of pointers. In such embodiments, the number of data elements per vector is the same as the number of pointers per vector, regardless of the size of the data type. Instructions that operate on memory may have variants that indicate the size of the memory access, but elements in processor registers should be the same as the pointer size. In these embodiments, processors that support both 32-bit and 64-bit addressing modes may choose to allow twice as many elements per vector in 32-bit mode, thereby achieving greater throughput. This implies a distinct throughput advantage to 32-bit addressing, assuming the same width data path. Implementation-specific techniques can be used to relax the requirement. For example, double-precision floating-point numbers can be supported in 32-bit mode through register pairing or some other specialized mechanism.

Macroscalar Architecture Overview

An instruction set architecture (referred to as the Macroscalar Architecture) and supporting hardware may allow compilers to generate program code for loops without having to completely determine parallelism at compile-time, and without discarding useful static analysis information. Various embodiments of the Macroscalar Architecture will now be described. Specifically, as described further below, a set of instructions is provided that does not mandate parallelism for loops but, instead, enables parallelism to be exploited at runtime if dynamic conditions permit. Accordingly, the architecture includes instructions that enable code generated by the compiler to dynamically switch between non-parallel (scalar) and parallel (vector) execution for loop iterations depending on conditions at runtime by switching the amount of parallelism used.

Thus, the architecture provides instructions that enable an undetermined amount of vector parallelism for loop iterations but do not require that the parallelism be used at runtime. More specifically, the architecture includes a set of vector-length agnostic instructions whose effective vector length can vary depending on runtime conditions. Thus, if runtime dependencies demand non-parallel execution of the code, then execution occurs with an effective vector length of one element. Likewise, if runtime conditions permit parallel execution, the same code executes in a vector-parallel manner to whatever degree is allowed by runtime dependencies (and the vector length of the underlying hardware). For example, if two out of eight elements of the vector can safely execute in parallel, a processor such as processor 102 may execute the two elements in parallel. In these embodiments, expressing program code in a vector-length agnostic format enables a broad range of vectorization opportunities that are not present in existing systems.

In various embodiments, during compilation, a compiler first analyzes the loop structure of a given loop in program code and performs static dependency analysis. The compiler then generates program code that retains static analysis information and instructs a processor such as processor 102, for example, how to resolve runtime dependencies and to process the program code with the maximum amount of parallelism possible. More specifically, the compiler may provide vector instructions for performing corresponding sets of loop iterations in parallel, and may provide vector-control instructions for dynamically limiting the execution of the vector instructions to prevent data dependencies between the iterations of the loop from causing an error. This approach defers the determination of parallelism to runtime, where the information on runtime dependencies is available, thereby allowing the software and processor to adapt parallelism to dynamically changing conditions. An example of a program code loop parallelization is shown in FIG. 3.

Figure 3:
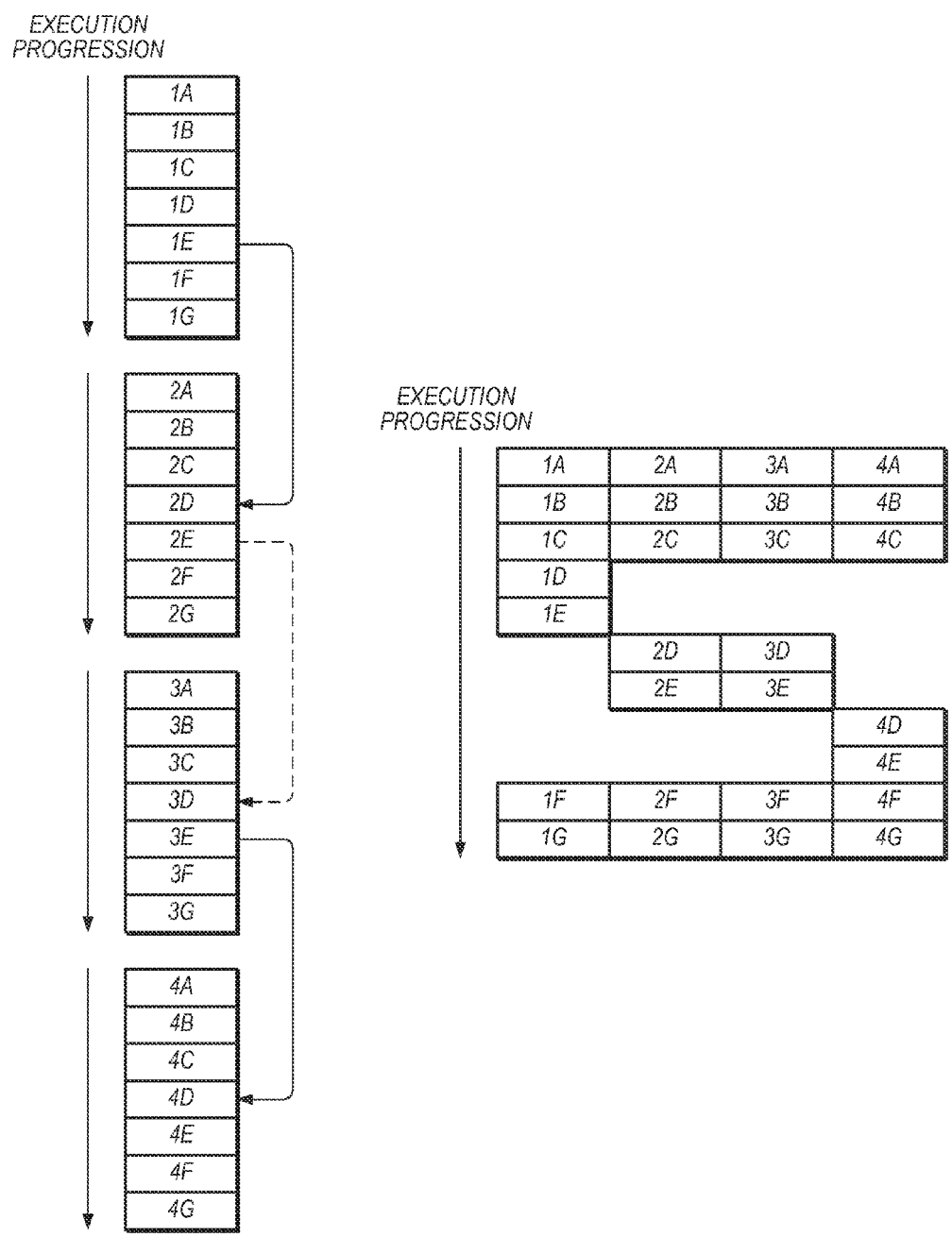
FIG. 3 is a diagram illustrating an example parallelization of a program code loop.

Referring to the left side of FIG. 3, an execution pattern is shown with four iterations (e.g., iterations 1-4) of a loop that have not been parallelized, where each loop includes instructions A-G. Serial operations are shown with instructions vertically stacked. On the right side of FIG. 3 is a version of the loop that has been parallelized. In this example, each instruction within an iteration depends on at least one instruction before it, so that there is a static dependency chain between the instructions of a given iteration. Hence, the instructions within a given iteration cannot be parallelized (i.e., instructions A-G within a given iteration are always serially executed with respect to the other instructions in the iteration). However, in alternative embodiments the instructions within a given iteration may be parallelizable.

As shown by the arrows between the iterations of the loop in FIG. 3, there is a possibility of a runtime data dependency between instruction E in a given iteration and instruction D of the subsequent iteration. However, during compilation, the compiler can only determine that there exists the possibility of data dependency between these instructions, but the compiler cannot tell in which iterations dependencies will actually materialize because this information is only available at runtime. In this example, a data dependency that actually materializes at runtime is shown by the solid arrows from 1E to 2D, and 3E to 4D, while a data dependency that doesn't materialize at runtime is shown using the dashed arrow from 2E to 3D. Thus, as shown, a runtime data dependency actually occurs between the first/second and third/fourth iterations.

Because no data dependency exists between the second and third iterations, the second and third iterations can safely be processed in parallel. Furthermore, instructions A-C and F-G of a given iteration have dependencies only within an iteration and, therefore, instruction A of a given iteration is able to execute in parallel with instruction A of all other iterations, instruction B can also execute in parallel with instruction B of all other iterations, and so forth. However, because instruction D in the second iteration depends on instruction E in the first iteration, instructions D and E in the first iteration must be executed before instruction D for the second iteration can be executed.

Accordingly, in the parallelized loop on the right side, the iterations of such a loop are executed to accommodate both the static and runtime data dependencies, while achieving maximum parallelism. More particularly, instructions A-C and F-G of all four iterations are executed in parallel. But, because instruction D in the second iteration depends on instruction E in the first iteration, instructions D and E in the first iteration must be executed before instruction D for the second iteration can be executed. However, because there is no data dependency between the second and third iterations, instructions D and E for these iterations can be executed in parallel.

Examples of the Macroscalar Architecture

The following examples introduce Macroscalar operations and demonstrate their use in vectorizing loops such as the loop shown in FIG. 3 and described above in the parallelized loop example. For ease of understanding, these examples are presented using pseudocode in the C++ format.

It is noted that the following example embodiments are for discussion purposes. The instructions and operations shown and described below are merely intended to aid an understanding of the architecture. However, in alternative embodiments, instructions or operations may be implemented in a different way, for example, using a microcode sequence of more primitive operations or using a different sequence of sub-operations. Note that further decomposition of instructions is avoided so that information about the macro-operation and the corresponding usage model is not obscured.

Notation

In describing the below examples, the following format is used for variables, which are vector quantities unless otherwise noted:

p5=a<b;

Elements of vector p5 are set to 0 or 1 depending on the result of testing a<b. Note that vector p5 can be a "predicate vector," as described in more detail below. Some instructions that generate predicate vectors also set processor status flags to reflect the resulting predicates. For example, the processor status flags or condition-codes can include the FIRST, LAST, NONE, and/or ALL flags.

p5; a=b+c;

Only elements in vector 'a' designated by active (i.e., non-zero) elements in the predicate vector p5 receive the result of b+c. The remaining elements of a are unchanged. This operation is called "predication," and is denoted using the tilde ("~") sign before the predicate vector.

!p5; a=b+c;

Only elements in vector 'a' designated by active (i.e., non-zero) elements in the predicate vector p5 receive the result of b+c. The remaining elements of a are set to zero. This operation is called "zeroing," and is denoted using the exclamation point ("!") sign before the predicate vector.

```
if (FIRST( )) goto ...; // Also LAST( ), ANY( ), ALL( ),
    CARRY( ), ABOVE( ), or NONE( ), (where ANY( ) ==
    !NONE( ))
```

The preceding instructions test the processor status flags and branch accordingly.

x+=VECLEN;

VECLEN is a machine value that communicates the number of elements per vector. The value is determined at runtime by the processor executing the code, rather than being determined by the assembler.

//Comment

In a similar way to many common programming languages, the following examples use the double forward slash to indicate comments. These comments can provide information regarding the values contained in the indicated vector or explanation of operations being performed in a corresponding example.

In these examples, other C++-formatted operators retain their conventional meanings, but are applied across the vector on an element-by-element basis. Where function calls are employed, they imply a single instruction that places any value returned into a destination register. For simplicity in understanding, all vectors are vectors of integers, but alternative embodiments support other data formats.

Structural Loop-Carried Dependencies

In the code Example 1 below, a program code loop that is "non-vectorizable" using conventional vector architectures is shown. (Note that in addition to being non-vectorizable, this loop is also not multi-threadable on conventional multi-threading architectures due to the fine-grain nature of the data dependencies.) For clarity, this loop has been distilled to the fundamental loop-carried dependencies that make the loop unvectorizable.

In this example, the variables r and s have loop-carried dependencies that prevent vectorization using conventional architectures. Notice, however, that the loop is vectorizable as long as the condition (A[x]<FACTOR) is known to be always true or always false. These assumptions change when the condition is allowed to vary during execution (the common case). For simplicity in this example, we presume that no aliasing exists between A[ ] and B[ ].

EXAMPLE 1

| Program Code Loop |
|---|
| ```
r = 0;
s = 0;
for (x=0; x<KSIZE; ++x)
{
    if (A[x] < FACTOR)
    {
        r = A[x+s];
    }
    else
    {
        s = A[x+r];
    }
    B[x] = r + s;
}
``` |

Using the Macroscalar architecture, the loop in Example 1 can be vectorized by partitioning the vector into segments for which the conditional (A[x]<FACTOR) does not change. Examples of processes for partitioning such vectors, as well as examples of instructions that enable the partitioning, are presented below. It is noted that for this example the described partitioning need only be applied to instructions within the conditional clause. The first read of A[x] and the final operation B[x]=r+s can always be executed in parallel across a full vector, except potentially on the final loop iteration.

Instructions and examples of vectorized code are shown and described to explain the operation of a vector processor such as processor 102 of FIG. 2, in conjunction with the Macroscalar architecture. The following description is generally organized so that a number of instructions are described and then one or more vectorized code samples that use the instructions are presented. In some cases, a particular type of vectorization issue is explored in a given example.

dest=VectorReadInt(Base, Offset)

VectorReadInt is an instruction for performing a memory read operation. A vector of offsets, Offset, scaled by the data size (integer in this case) is added to a scalar base address, Base, to form a vector of memory addresses which are then read into a destination vector. If the instruction is predicated or zeroed, only addresses corresponding to active elements are read. In the described embodiments, reads to invalid addresses are allowed to fault, but such faults only result in program termination if the first active address is invalid.

VectorWriteInt(Base, Offset, Value)

VectorWriteInt is an instruction for performing a memory write operation. A vector of offsets, Offset, scaled by the data size (integer in this case) is added to a scalar base address, Base, to form a vector of memory addresses. A vector of values, Value, is written to these memory addresses. If this instruction is predicated or zeroed, data is written only to active addresses. In the described embodiments, writes to illegal addresses always generate faults.

dest=VectorIndex(Start, Increment)

VectorIndex is an instruction for generating vectors of values that monotonically adjust by the increment from a scalar starting value specified by Start. This instruction can be used for initializing loop index variables when the index adjustment is constant. When predication or zeroing is applied, the first active element receives the starting value, and the increment is only applied to subsequent active elements. For example:

x=VectorIndex(0,1); // x={0 1 2 3 4 5 6 7} dest=PropagatePostT(dest, src, pred)

The PropagatePostT instruction propagates the value of active elements in src, as determined by pred, to subsequent inactive elements of dest. Active elements, and any inactive elements that precede the first active element, remain unchanged in dest. The purpose of this instruction is to take a value that is conditionally calculated, and propagate the conditionally calculated value to subsequent loop iterations as occurs in the equivalent scalar code. For example:

Entry: dest={8 9 A B C D E F}
 src={1 2 3 4 5 6 7 8}
 pred={0 0 1 1 0 0 1 0}
Exit: dest={8 9 A B 4 4 E 7} dest=PropagatePriorF(src, pred)

The PropagatePriorF instruction propagates the value of the inactive elements of src, as determined by pred, into subsequent active elements in dest. Inactive elements are copied from src to dest. If the first element of the predicate is active, then the last element of src is propagated to that position. For example:

Entry: src={1 2 3 4 5 6 7 8}
 pred={1 0 1 1 0 0 1 0}
Exit: dest={8 2 2 2 5 6 6 8} dest=ConditionalStop(pred, deps)

The ConditionalStop instruction evaluates a vector of predicates, pred, and identifies transitions between adjacent predicate elements that imply data dependencies as specified by deps. The scalar value deps can be thought of as an array of four bits, each of which designates a possible transition between true/false elements in pred, as processed from left to right. These bits convey the presence of the indicated dependency if set, and guarantee the absence of the dependency if not set. They are:

kTF—Implies a loop-carried dependency from an iteration for which the predicate is true, to the subsequent iteration for which the value of the predicate is false.

kFF—Implies a loop-carried dependency from an iteration for which the predicate is false, to the subsequent iteration for which the value of the predicate is false.

kFT—Implies a loop-carried dependency from an iteration for which the predicate is false, to the subsequent iteration for which the value of the predicate is true.

kTT—Implies a loop-carried dependency from an iteration for which the predicate is true, to the subsequent iteration for which the value of the predicate is true.

The element position corresponding to the iteration that generates the data that is depended upon is stored in the destination vector at the element position corresponding to the iteration that depends on the data. If no data dependency exists, a value of 0 is stored in the destination vector at that element. The resulting dependency index vector, or DIV, contains a vector of element-position indices that represent dependencies. For the reasons described below, the first element of the vector is element number 1 (rather than 0).

As an example, consider the dependencies in the loop of Example 1 above. In this loop, transitions between true and false iterations of the conditional clause represent a loop-carried dependency that requires a break in parallelism. This can be handled using the following instructions:

```
p1 = (t < FACTOR);              // p1 = {00001100}
p2 = ConditionalStop(p1, kTF|kFT);  // p2 = {00004060}
```

Because the 4th iteration generates the required data, and the 5th iteration depends on it, a 4 is stored in position 5 of the output vector p2 (which is the DIV). The same applies for the 7th iteration, which depends on data from the 6th iteration. Other elements of the DIV are set to 0 to indicate the absence of dependencies. (Note that in this example the first element of the vector is element number 1.)

dest=GeneratePredicates(Pred, DIV)

GeneratePredicates takes the dependency index vector, DIV, and generates predicates corresponding to the next group of elements that may safely be processed in parallel, given the previous group that was processed, indicated by pred. If no elements of Pred are active, predicates are generated for the first group of elements that may safely be processed in parallel. If Pred indicates that the final elements of the vector have been processed, then the instruction generates a result vector of inactive predicates indicating that no elements should be processed and the ZF flag is set. The CF flag is set to indicate that the last element of the results is active. Using the values in the first example, GeneratePredicates operates as follows:

```
Entry Conditions:      // i2 =    {0 0 0 0 4 0 6 0}
p2 = 0;                // p2 =    {0 0 0 0 0 0 0 0}
Loop2:
p2 = GeneratePredicates(p2,i2);   // p2' =   {1 1 1 1 0 0 0 0}
CF = 0, ZF = 0
if(!PLAST( )) goto Loop2          // p2" =   {0 0 0 0 1 1 0 0}
CF = 0, ZF = 0                    // p2'" =  {0 0 0 0 0 0 1 1}
CF = 1, ZF = 0
```

From an initialized predicate p2 of all zeros, GeneratePredicates generates new instances of p2 that partition subsequent vector calculations into three sub-vectors (i.e., p', p", and p'"). This enables the hardware to process the vector in groups that avoid violating the data dependencies of the loop.

In FIG. 4A a diagram illustrating a sequence of variable states during scalar execution of the loop in Example 1 is shown. More particularly, using a randomized 50/50 distribution of the direction of the conditional expression, a progression of the variable states of the loop of Example 1 is shown. In FIG. 4B a diagram illustrating a progression of execution for Macroscalar vectorized program code of the loop of Example 1 is shown. In FIG. 4A and FIG. 4B, the values read from A[ ] are shown using leftward-slanting hash marks, while the values written to B[ ] are shown using rightward-slanting hash marks, and values for "r" or "s" (depending on which is changed in a given iteration) are shown using a shaded background. Observe that "r" never changes while "s" is changing, and vice-versa.

Nothing prevents all values from being read from A[ ] in parallel or written to B[ ] in parallel, because neither set of values participates in the loop-carried dependency chain. However, for the calculation of r and s, elements can be processed in parallel only while the value of the conditional expression remains the same (i.e., runs of true or false). This pattern for the execution of the program code for this loop is shown in of FIG. 4B. Note that the example uses vectors having eight elements in length. When processing the first vector instruction, the first iteration is performed alone (i.e., vector execution unit 204 processes only the first vector element), whereas iterations 1-5 are processed in parallel by vector execution unit 204, and then iterations 6-7 are processed in parallel by vector execution unit 204.

Referring to FIG. 5A and FIG. 5B, diagrams illustrating one embodiment of the vectorization of program code are shown. FIG. 5A depicts the original source code, while FIG. 5B illustrates the vectorized code representing the operations that may be performed using the Macroscalar architecture. In the vectorized code of FIG. 5B, Loop 1 is the loop from the source code, while Loop 2 is the vector-partitioning loop that processes the sub-vector partitions.

In the example, array A[ ] is read and compared in full-length vectors (i.e., for a vector of N elements, N positions of array A[ ] are read at once). Vector i2 is the DIV that controls partitioning of the vector. Partitioning is determined by monitoring the predicate p1 for transitions between false and true, which indicate loop-carried dependencies that should be observed. Predicate vector p2 determines which elements are to be acted upon at any time. In this particular loop, p1 has the same value in all elements of any sub-vector partition; therefore, only the first element of the partition needs to be checked to determine which variable to update.

After variable "s" is updated, the PropagatePostT instruction propagates the final value in the active partition to subsequent elements in the vector. At the top of the loop, the PropagatePriorF instruction copies the last value of "s" from the final vector position across all elements of the vector in preparation for the next pass. Note that variable "r" is propagated using a different method, illustrating the efficiencies of using the PropagatePriorF instruction in certain cases.

Software Speculation

In the previous example, the vector partitions prior to the beginning of the vector-partitioning loop could be determined because the control-flow decision was independent of the loop-carried dependencies. However, this is not always the case. Consider the following two loops shown in Example 2A and Example 2B:

EXAMPLE 2A

Program Code Loop 1

```
j = 0;
for (x=0; x<KSIZE; ++x)
{
    if (A[x] < FACTOR)
```

-continued

Program Code Loop 1

```
    {
        j = A[x+j];
    }
    B[x] = j;
}
```

EXAMPLE 2B

Program Code Loop 2

```
j = 0;
for (x=0; x<KSIZE; ++x)
{
    if (A[x+j] < FACTOR)
    {
        j = A[x];
    }
    B[x] = j;
}
```

In Example 2A, the control-flow decision is independent of the loop-carried dependency chain, while in Example 2B the control flow decision is part of the loop-carried dependency chain. In some embodiments, the loop in Example 2B may cause speculation that the value of "j" will remain unchanged and compensate later if this prediction proves incorrect. In such embodiments, the speculation on the value of "j" does not significantly change the vectorization of the loop.

In some embodiments, the compiler may be configured to always predict no data dependencies between the iterations of the loop. In such embodiments, in the case that runtime data dependencies exist, the group of active elements processed in parallel may be reduced to represent the group of elements that may safely be processed in parallel at that time. In these embodiments, there is little penalty for mispredicting more parallelism than actually exists because no parallelism is actually lost (i.e., if necessary, the iterations can be processed one element at a time, in a non-parallel way). In these embodiments, the actual amount of parallelism is simply recognized at a later stage.

dest=VectorReadIntFF(Base, Offset, pf)

VectorReadIntFF is a first-faulting variant of VectorReadInt. This instruction does not generate a fault if at least the first active element is a valid address. Results corresponding to invalid addresses are forced to zero, and flags pf are returned that can be used to mask predicates to later instructions that use this data. If the first active element of the address is unmapped, this instruction faults to allow a virtual memory system in computer system 100 (not shown) to populate a corresponding page, thereby ensuring that processor 102 can continue to make forward progress.

dest=Remaining(Pred)

The Remaining instruction evaluates a vector of predicates, Pred, and calculates the remaining elements in the vector. This corresponds to the set of inactive predicates following the last active predicate. If there are no active elements in Pred, a vector of all active predicates is returned. Likewise, if Pred is a vector of all active predicates, a vector of inactive predicates is returned. For example:

Entry: pred={0 0 1 0 1 0 0 0}
Exit: dest={0 0 0 0 0 1 1 1}

FIG. 6A and FIG. 6B are diagrams illustrating embodiments of example vectorized program code. More particularly, the code sample shown in FIG. 6A is a vectorized version of the code in Example 2A (as presented above). The code sample shown in FIG. 6B is a vectorized version of the code in Example 2B. Referring to FIG. 6B, the read of A[ ] and subsequent comparison have been moved inside the vector-partitioning loop. Thus, these operations presume (speculate) that the value of "j" does not change. Only after using "j" is it possible to determine where "j" may change value. After "j" is updated, the remaining vector elements are re-computed as necessary to iterate through the entire vector. The use of the Remaining instruction in the speculative code sample allows the program to determine which elements remain to be processed in the vector-partitioning loop before the program can determine the sub-group of these elements that are actually safe to process (i.e., that don't have unresolved data dependencies).

In various embodiments fault-tolerant read support is provided. Thus, in such embodiments, processor 102 may speculatively read data from memory using addresses from invalid elements of a vector instruction (e.g., VectorReadFF) in an attempt to load values that are to be later used in calculations. However, upon discovering that an invalid read has occurred, these values are ultimately discarded and, therefore, not germane to correct program behavior. Because such reads may reference non-existent or protected memory, these embodiments may be configured to continue normal execution in the presence of invalid but irrelevant data mistakenly read from memory. (Note that in embodiments that support virtual memory, this may have the additional benefit of not paging until the need to do so is certain.)

In the program loops shown in FIG. 6A and FIG. 6B, there exists a loop-carried dependency between iterations where the condition is true, and subsequent iterations, regardless of the predicate value for the later iterations. This is reflected in the parameters of the ConditionalStop instruction.

The sample program code in FIG. 6A and FIG. 6B highlights the differences between non-speculative and speculative vector partitioning. More particularly, in Example 2A memory is read and the predicate is calculated prior to the ConditionalStop. The partitioning loop begins after the ConditionalStop instruction. However, in Example 2B, the ConditionalStop instruction is executed inside the partitioning loop, and serves to recognize the dependencies that render earlier operations invalid. In both cases, the GeneratePredicates instruction calculates the predicates that control which elements are used for the remainder of the partitioning loop.

In the previous examples, the compiler was able to establish that no address aliasing existed at the time of compilation. However, such determinations are often difficult or impossible to make. The code segment shown in Example 3 below illustrates how loop-carried dependencies occurring through memory (which may include aliasing) are dealt with in various embodiments of the Macroscalar architecture.

EXAMPLE 3

| Program Code Loop 3 |
| --- |
| for (x=0; x<KSIZE; ++x)<br>{<br>    r = C[x];<br>    s = D[x]; |

-continued

| Program Code Loop 3 |
| --- |
|     A[x] = A[r] + A[s];<br>} |

In the code segment of EXAMPLE 3, the compiler cannot determine whether A[x] aliases with A[r] or A[s]. However, with the Macroscalar architecture, the compiler simply inserts instructions that cause the hardware to check for memory hazards at runtime and partitions the vector accordingly at runtime to ensure correct program behavior. One such instruction that checks for memory hazards is the CheckHazardP instruction which is described below.

dest=CheckHazardP (first, second, pred)

The CheckHazardP instruction examines two vectors of a memory address (or indices) corresponding to two memory operations for potential data dependencies through memory. The vector 'first' holds addresses for the first memory operation, and vector 'second' holds the addresses for the second operation. The predicate 'pred' indicates or controls which elements of 'second' are to be operated upon. As scalar loop iterations proceed forward in time, vector elements representing sequential iterations appear left to right within vectors. The CheckHazardP instruction may evaluate in this context. The instruction may calculate a DIV representing memory hazards between the corresponding pair of first and second memory operations. The instruction may correctly evaluate write-after-read, read-after-write, and write-after-write memory hazards.

As with the ConditionalStop instruction described above, the element position corresponding to the iteration that generates the data that is depended upon may be stored in the destination vector at the element position corresponding to the iteration that is dependent upon the data. If no data dependency exists, a zero may be stored in the destination vector at the element position corresponding to the iteration that does not have the dependency. For example:

Entry: first={2 3 4 5 6 7 8 9}
    second={8 7 6 5 4 3 2 1}
    pred={1 1 1 1 1 1 1 1}
Exit: dest={0 0 0 0 3 2 1 0}

As shown above, element 5 of the first vector ("first") and element 3 of the second vector ("second") both access array index 6. Therefore, a 3 stored in position 5 of DIV. Likewise, element 6 of first and element 2 of second both access array index position 7, causing a 2 to be stored in position 6 of DIV, and so forth. A zero is stored in the DIV where no data dependencies exist.

In some embodiments, the CheckHazardP instruction may account for various sizes of data types. However, for clarity we describe the function of the instruction using only array index types.

The memory access in the example above has three memory hazards. However, in the described embodiments, only two partitions may be needed to safely process the associated memory operations. More particularly, handling the first hazard on element position 3 renders subsequent dependencies on lower or equally numbered element positions moot. For example:

| Entry Conditions: | //DIV = | {0 0 0 0 3 2 1 0} |
| --- | --- | --- |
|  | // p2 = | {0 0 0 0 0 0 0 0} |
| p2 = GeneratePredicates(p2,DIV); | // p2 = | {1 1 1 1 0 0 0 0} |
| P2 = GeneratePredicates(p2,DIV) | // p2 = | {0 0 0 0 1 1 1 1} |

The process used by the described embodiments to analyze a DIV to determine where a vector should be broken is shown in pseudocode below. In some embodiments, the vector execution unit 204 of processor 102 may perform this calculation in parallel. For example:

```
List = <empty>;
for (x=STARTPOS; x<VECLEN; ++x)
{
    if(DIV[x] in List)
        Break from loop;
    else if(DIV[x]>0)
        Append <x> to List;
}
```

The vector may safely be processed in parallel over the interval [STARTPOS,x], where x is the position where DIV[x]>0. That is, from STARTPOS up to (but not including) position x, where STARTPOS refers to the first vector element after the set of elements previously processed. If the set of previously processed elements is empty, then STARTPOS begins at the first element.

In some embodiments, multiple DIVs may be generated in code using ConditionalStop and/or CheckHazardP instructions. The GeneratePredicates instruction, however, uses a single DIV to partition the vector. There are two methods for dealing with this situation: (1) partitioning loops can be nested; or (2) the DIVs can be combined and used in a single partitioning loop. Either approach yields correct results, but the optimal approach depends on the characteristics of the loop in question. More specifically, where multiple DIVS are expected not to have dependencies, such as when the compiler simply cannot determine aliasing on input parameters, these embodiments can combine multiple DIVs into one, thus reducing the partitioning overhead. On the other hand, in cases with an expectation of many realized memory hazards, these embodiments can nest partitioning loops, thereby extracting the maximum parallelism possible (assuming the prospect of additional parallelism exists).

In some embodiments, DIVs may be combined using a VectorMax(A,B) instruction as shown below.

```
i2 = CheckHazardP(a,c,p0);   //i2 = {0 0 2 0 2 4 0 0}
i3 = CheckHazardP(b,c,p0);   //i3 = {0 0 1 3 3 0 0 0}
ix = VectorMax(i2,i3);       //ix = {0 0 2 3 3 4 0 0}
```

Because the elements of a DIV should only contain numbers less than the position of that element, which represent dependencies earlier in time, later dependencies only serve to further constrain the partitioning, which renders lower values redundant from the perspective of the GeneratePredicates instruction. Thus, taking the maximum of all DIVs effectively causes the GeneratePredicates instruction to return the intersection of the sets of elements that can safely be processed in parallel.

FIG. 7 is a diagram illustrating one embodiment of example vectorized program code. More particularly, the code sample shown in FIG. 7 is a vectorized version of the code in Example 3 (as presented above). Referring to FIG. 7, no aliasing exists between C[ ] or D[ ] and A[ ], but operations on A[ ] may alias one another. If the compiler is unable to rule out aliasing with C[ ] or D[ ], the compiler can generate additional hazard checks. Because there is no danger of aliasing in this case, the read operations on arrays C[ ] and D[ ] have been positioned outside the vector-partitioning loop, while operations on A[ ] remain within the partitioning loop. If no aliasing actually exists with A[ ], the partitions retain full vector size, and the partitioning loop simply falls through without iterating. However, for iterations where aliasing does occur, the partitioning loop partitions the vector to respect the data dependencies thereby ensuring correct operation.

In the embodiment shown in the code segment of FIG. 7, the hazard check is performed across the entire vector of addresses. In the general case, however, it is often necessary to check hazards between conditionally executed memory operations. The CheckHazardP instruction takes a predicate that indicates which elements of the second memory operation are active. If not all elements of the first operation are active, the CheckHazardP instruction itself can be predicated with a zeroing predicate corresponding to those elements of the first operand which are active. (Note that this may yield correct results for the cases where the first memory operation is predicated.)

The code segment in Example 4 below illustrates a loop with a memory hazard on array E[ ]. The code segment conditionally reads and writes to unpredictable locations within the array. In FIG. 8 a diagram illustrating one embodiment of example vectorized program code is shown. More particularly, the code sample shown in FIG. 8 is a vectorized Macroscalar version of the code in Example 4 (as presented above).

EXAMPLE 4

Program Code Loop 4

```
j = 0;
for (x=0; x<KSIZE; ++x)
{
    f = A[x];
    g = B[x];
    if (f < FACTOR)
    {
        h = C[x];
        j = E[h];
    }
    if (g < FACTOR)
    {
        i = D[x];
        E[i] = j;
    }
}
```

Referring to FIG. 8, the vectorized loop includes predicates p1 and p2 which indicate whether array E[ ] is to be read or written, respectively. The CheckHazardP instruction checks vectors of addresses (h and i) for memory hazards. The parameter p2 is passed to CheckHazardP as the predicate controlling the second memory operation (the write). Thus, CheckHazardP identifies the memory hazard(s) between unconditional reads and conditional writes predicated on p2. The result of CheckHazardP is zero-predicated in p1. This places zeroes in the DIV(ix) for element positions that are not to be read from E[ ]. Recall that a zero indicates no hazard. Thus, the result, stored in ix, is a DIV that represents the hazards between conditional reads predicated on p1 and conditional writes predicated on p2. This is made possible because non-hazard conditions are represented with a zero in the DIV.

It is noted that in the above embodiments, to check for memory-based hazards, the CheckHazardP instruction was used. As described above, the CheckHazardP instruction takes a predicate as a parameter that controls which elements of the second vector are operated upon. However, in other embodiments other types of CheckHazard instructions may be used. In one embodiment, this version of the CheckHazard instruction may simply operate unconditionally on the two input vectors. Regardless of which version of the CheckHazard instruction is employed, it is noted that as with any Macroscalar instruction that supports result predication and/or zeroing, whether or not a given element of a result vector is modified by execution of the CheckHazard instruction may be separately controlled through the use of a predicate vector or zeroing vector, as described above. That is, the predicate parameter of the CheckHazardP instruction controls a different aspect of instruction execution than the general predicate/zeroing vector described above.

Instruction Definitions

The following sections include additional example instructions used in various embodiments of the Macroscalar architecture. The example instructions demonstrate various concepts used in implementing the Macroscalar architecture and therefore do not comprise a complete list of the possible instructions. Accordingly, it is contemplated that these concepts may be implemented using different arrangements or types of instructions without departing from the spirit of the described embodiments.

Unlike conventional single-instruction-multiple-data (SIMD) coding, in some embodiments, Macroscalar code can combine vector variables with scalar registers or immediate values. Thus, in these embodiments, Macroscalar instructions can directly reference scalar registers and immediate values without making unnecessary vector copies of them. As such, this may help avoid unnecessary vector-register pressure within a loop because more vector registers may be available rather than being required for making vector copies of scalars or immediate values.

The instructions are described using a signed-integer data type. However, in alternative embodiments, other data types or formats may be used. Moreover, although Macroscalar instructions may take vector, scalar, or immediate arguments in practice, only vector arguments are shown here to avoid redundancy.

The descriptions of the instructions reference vector elements with a zero-based numbering system (i.e., element "0" is the first element). However, as mentioned above, certain instructions, such as those involved in the processing of DIVs, express dependencies using 1-based element numbering, even though they are actually implemented using 0-based element numbering. Because of this, care should be taken to avoid confusing the language that the results are expressed in from the language used to implement the instructions.

For the purposes of discussion, the vector data type is defined as a C++ class containing an array v[ ] of elements that comprise the vector. Within these descriptions, as above, the variable VECLEN indicates the size of the vector. In some embodiments, VECLEN may be a constant.

Running and Wrapping Instructions

When vectorizing loops, it is common to encounter expressions that reference a value from the same expression in a previous iteration of the loop. In software, the required calculation can only be performed by iteration across the vector, destroying parallelism. However, this serialization can be avoided in expressions that satisfy certain mathematical properties. For commonly-used expressions that meet the above criteria, hardware is able to calculate a full vector of results without iteration or serialization that software would require. For example, consider the loop in code example 5 below.

EXAMPLE 5

| Program Code Loop 5 |
|---|
| for (x=0; x<lim; ++x)<br>{<br>   if (A[x] == K)<br>      y = −y;<br>   B[x] = C[x] + y;<br>} |

The specified conditional recurrence operation shown in the above code may be implemented using instructions in the Macroscalar architecture. More particularly, the conditional recurrence operations may be implemented in what are generally referred to as running instructions and wrapping instructions. In some embodiments, the running and wrapping instructions operate by conditionally performing the specified recurrent operation on elements of a vector in ascending order, corresponding to a series of iterations of a scalar version of the operation. However, in other embodiments and as described further below, the execution of the instruction may not necessarily iterate, but may instead operate in parallel to process a vector. It is noted that the specific arithmetic operation shown in program loop 5 (i.e., negation) may be replaced by any type of operation as desired.

In addition, as described further below, the running and wrapping instructions include both an 'A' variant and a 'B' variant. In the 'A' variant instructions, specific operations are performed after a result or intermediate value is stored in a destination vector, and in the 'B' variant, specific operations are performed before the result or the intermediate value is stored in the destination vector.

Further, in some embodiments, the instruction destinations (e.g., result or destination vector) may be explicitly specified, in which case they may be independent of the input operands, or they may be implicitly specified by reusing and overwriting one or more of the input operands. However, in yet other embodiments, the instructions may have an implicit destination that is distinct from the input operands. For example, a special result register that the instruction always writes into may be used. In other words, some embodiments of the Running instructions may specify dst in the header but do not reference dst in the code. Accordingly, in some embodiments, r may be written to dst while in other embodiments, dst may be omitted and r may instead be written to src1 (or, equivalently, src2), as desired. Thus in the example execution results shown below, the results may be written to a vector such as a. In some cases, vector a may be explicitly identified as the input vector that was overwritten with the result, while in other cases a may be a destination vector.

It is noted that in the embodiments of the Running and Wrapping instructions illustrated in following code examples, element positions are processed in a sequential fashion. However, in other embodiments, some or all of the element positions may actually be processed in parallel. That is, although the code examples depict iterative operation in order to simplify their explanation, any given hardware implementation of a particular instruction may be configured to concurrently operate on some or all element positions instead of iteratively operating on a single element position at a time. For example, in one embodiment of the RunSumA instruction below, duplicate adder hardware may be employed so that all previous element positions may be added simultaneously. (As an example, in a four-element machine, a two-input adder might be provided to compute the sum of the first two elements, and distinct three- and four-input adders might be provided to compute the sum of the first three and four elements concurrently.) Alternatively, partial concurrency may be achieved by operating on groups of elements rather than all elements concurrently, which may provide better performance than purely sequential operation with less hardware cost than fully concurrent operation. The following code and execution examples for the Running and Wrapping instructions are not intended to limit the possible combinations of software and hardware that may be used to implement the running instructions, but merely to illustrate possible embodiments.

In the code examples that follow, predication may be communicated to the instructions via the vectors: p and gp. In addition, in the Running instructions, a scalar predication mode, designated Z/M, is used to indicate the effect of the gp vector on the result of the instruction. In some embodiments, the predication mode may be encoded by the instruction, for example as part of the opcode or an encoded field within the instruction. The vector p is the predicate vector that determines which elements participate in the operation being performed by the instruction. As discussed in greater detail below, the gp vector has a different use in the Running instructions than in the Wrapping instructions. In the Running instructions, the gp vector is a predicate that will affect the instruction and/or the assignment of the result vector. More particularly, if an instruction is not predicated, then as above, all elements of the gp vector may be set to a 1. When the instruction is predicated by gp, the mode Z/M indicates whether gp functions in one of a predication or a zeroing capacity. More particularly, if a given element in gp is set to 0, and the Z/M mode indicates that zeroing should be performed, then instruction operation is not performed, and the corresponding input vector element is zeroed. In contrast, if the gp element is set to 0, and the Z/M indicates that predication should be performed, then the corresponding input vector element may either be copied to the result vector, or in embodiments in which the input vector is used as the result vector, the input vector element may be left unaffected. This operation is described in more detail in reference to the specific program code EXAMPLE 6, as well as in the specific execution results, below. In the execution results below, the predication mode is indicated within the instruction mnemonic by using the suffixes Z and M for zeroing and predication, respectively. However, in the Wrapping instructions, the gp vector may be used to determine to select which element of the input vector will be the basis value. This operation is described in more detail in reference to the specific program code EXAMPLE 12, below.

It is noted that in some embodiments, the basis value may be implied, and an explicit indication of the basis via the gp vector may correspondingly be omitted. For example, if the basis is not explicitly indicated, the basis value may be assumed to come from a default element position, or may be assumed to have a default initial value (such as, e.g., zero). Also, in some embodiments, the predication/zeroing effect of the gp vector for the Running instructions may be replaced by a basis selection function for the Wrapping instructions, and predication/zeroing may not be available for the latter. In other embodiments, the Wrapping instructions may be configured to receive an additional operand so that both basis selection and predication/zeroing may be performed.

In the following examples, the Running instructions operate by conditionally performing the specified operation on elements of a vector in ascending order, corresponding to a series of iterations of a scalar version of the operation. The Wrapping instructions perform a similar operation. More particularly, as mentioned above in regard to the Wrapping instructions, in addition to being used as a predicate vector, the gp vector selects the initial or basis value for the operation being performed, and as described further below, if the first element position of the gp vector is active, then the basis value is selected from the last element of the input vector. Further, the Running instructions may require additional program code to maintain basis values, which is not necessary for the Wrapping instructions. For example, the Running instructions may require additional code (e.g., the PRIORF instruction in each pass of the loop in EXAMPLE 5A) to set-up and maintain the propagation of data across passes of the vectorized loop. The PRIORF instruction may propagate values from an input vector, as determined by active elements in p3, into selected elements in the destination. These additional instructions access all elements of the vector, and are wasteful from a power standpoint. Thus, as shown in EXAMPLE 5B, the PRIORF instruction is not used before the Wrapping instruction.

EXAMPLE 5A

Program code using PRIORF prior to using RunSumB

```
void AlgTest3(int *a, int *b) // Algorithm using
RunSum
{
    int j = 0;
    PredV p3,p2,p4;
    Vec s1,s5,s6;
    p2 = VecPTrue( );
    s1 = VecU32IndexIIZ(p2, 0, 1);
    p3 = VecS32CmpLTVSZ(p2, s1, KSIZE);
    s5 = VecU32SplatSZ(p2, j);
    while (VecTFirst(p2, p3) != 0)
    {
        s5 = VecU32PriorFVM(s5, p3, s5, p3);
        s6 = VecU32Read4SVZ(p3, unsigned(a), s1);
        p4 = VecU32CmpLTVSZ(p3, s6, FACTOR);
        s5 = VecU32RunSumBVVM(s5,p3,s5,s6,p4);
        VecU32Write4SVZ(p3, unsigned(b), s1, s5);
        s1 = VecU32AddVL1V(s1);
        p3 = VecS32CmpLTVSZ(p2, s1, KSIZE);
    }
    Return;
}
```

EXAMPLE 5B

Program code using WAddB

```
void AlgTest2(int *a, int *b) // Algorithm using WAdd
{
    int j = 0;
    PredV p3,p2,p4;
    Vec s1,s5,s6;
    p2 = VecPTrue( );
    s1 = VecU32IndexIIZ(p2, 0, 1);
    p3 = VecS32CmpLTVSZ(p2, s1, KSIZE);
    s5 = VecU32SplatSZ(p2, j);
    while (VecTFirst(p2, p3) != 0)
```

-continued

Program code using WAddB

```
{
        s6 = VecU32Read4SVZ(p3, unsigned(a), s1);
        p4 = VecU32CmpLTVSZ(p3, s6, FACTOR);
        s5 = VecU32WAddBVV(p3,s5,s6,p4);
        VecU32Write4SVZ(p3, unsigned(b), s1, s5);
        s1 = VecU32AddVL1V(s1);
        p3 = VecS32CmpLTVSZ(p2, s1, KSIZE);
    }
    return;
}
```

It is noted that the following code examples are merely illustrative examples and that, in some embodiments, the instructions may be implemented in hardware, software, or a combination thereof. For example, in some embodiments, the functionality expressed by the code example for a given instruction may be implemented entirely by hardware control logic and/or iterative state machines that are not programmer visible. Alternatively, the given instruction may be implemented using microcode that is similarly not programmer visible. Whether implemented entirely in hardware or via microcode, the given instruction may be implemented in an atomic fashion (e.g., such that the given instruction must complete execution on all relevant vector elements without interruption) or in an interruptible fashion (e.g., such that the given instruction may be interrupted before all relevant vector elements have been processed and may gracefully be resumed or restarted without resulting in inconsistent processor behavior). In some embodiments, the functionality expressed by the code example for a given instruction may be implemented by other programmer-visible instructions defined within an instruction set architecture. For example, the given instruction may be implemented as an emulated instruction that is not directly executed, but instead causes a defined set of other programmer-visible instructions (e.g., defined as part of a routine, fault handler, or similar code construct) to be executed, for example by raising a fault or otherwise passing control to the instructions that perform the emulation.

Running Summation

In some embodiments, conditional recurrent sum operations may be implemented using instructions in the Macroscalar architecture. More particularly, as described further below, running summation (RunSum) may be implemented.

The RunSum instruction operates by conditionally performing the specified recurrent sum operation on elements of a vector in ascending order, corresponding to a series of iterations of a scalar version of the operation. However, the execution of the instruction may not necessarily iterate, but may instead operate in parallel to process a vector. As described above, the RunSum instruction includes both the 'A' variant (e.g., RunSumA) and the 'B' variant (e.g., RunSumB). Accordingly, the instructions are:

Vec RunSumA(PredV gp, Vec src1, Vec src2, PredV p)
  Vec RunSumB(PredV gp, Vec src1, Vec src2, PredV p)

Below are code examples that illustrate instruction definitions of the RunSum instruction including the A and B variants. It is noted, that in some embodiments, additional arguments to the instruction such as, for example, a destination vector may be possible, and in some embodiments, either input vector src1 or input vector src2 may also function as a destination vector. In some embodiments, src1 and/or src2 could be scalar sources rather than vector sources. In such embodiments, the code examples should be understood to utilize a scalar value rather than a vector value. In addition to the code examples, the results of executing the instructions on a given set of input vectors are also illustrated below.

One embodiment of a RunSumA instruction is shown in program code example 6. In this embodiment, using a first selected active element from input vector src1 as a basis, the RunSumA instruction calculates a cumulative sum with active elements from input vector src2 and the basis. In the illustrated example code, the RunSumA instruction stores intermediate value s into destination vector r prior to performing the sum operation. It is noted that although the sum operation may be arithmetic addition, as shown in program code example 6, it is contemplated that other sum operations such as, for example, modulo addition are possible.

As mentioned above, in the embodiment of the RunSumA instruction illustrated in code example 6, element positions are processed in a sequential fashion. However, in other embodiments, some or all of the element positions may be processed in parallel. For example, in an embodiment of the RunSumA instruction, duplicate hardware may be employed such that each element position is processed using duplicate adders so that all previous element positions may be added simultaneously. In such an embodiment, element position three may require a three-input adder, element position four may require a four-input adder, and so forth. The following code and execution examples are not intended to limit the possible combinations of software and hardware that may be used to implement the RunSumA instruction, but merely to illustrate one possible embodiment of the instruction.

The operation of the instruction may be dependent on the state of the predication mode, which is illustrated in code example 6 by the '<Z/M>' notation. In general, for active elements prior to the first selected active element, the destination vector r receives corresponding elements of input vector src1. For inactive elements, when predication is indicated (the 'M' option), inactive elements in input vector src1 are copied into the corresponding element position in destination vector r. When zeroing is indicated (the 'Z' option), a zero is forced into destination vector r at element positions corresponding to inactive elements in input vector src1.

EXAMPLE 6

Program code RunSumA

```
Vec RunSumA(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x])
            r.v[x] = s;
        else
            r.v[x] = <Z/M>;
        if(gp.v[x] && p.v[x])
```

-continued

Program code RunSumA

```
        s = s + src2.v[x];
    }
    return(r);
}
```

An example of the RunSumA instruction operating with predication is shown in execution example 7. For purposes of exposition, the element positions are examined in a serial fashion. It is noted that in some embodiments, the various element positions may be processed in parallel. Referring collectively to the execution example 7 and code example 6, the execution of the instruction begins at element position one. The first element in input vector a (0) is selected as a basis value and copied into intermediate value s, since predicate gp and predicate p are both 1. Intermediate value s (0) is copied into element position one of destination vector r. The sum operation is then performed, adding the value at element position one of input vector b (1) to intermediate value s, resulting in a value of 1 being stored in intermediate value s.

Turning to element position two, predicate gp is 1, so intermediate value s (1) is copied into element position two of destination vector r. Since predicate p is 0, the sum operation is not performed. At element position three, both predicate gp and predicate p are 1, so intermediate value s (1) is copied into element position two of destination vector r. The sum operation is then performed, adding the value at element position three of input vector b (3) to intermediate value s (1), resulting in a value of 4 being stored in intermediate value s.

Moving to element position four, predicate gp is 1, resulting in intermediate value s (4) being copied into element position four of destination vector r. Since the value of predicate p is 0 at element position four, the sum operation is not performed, resulting in intermediate value s retaining the value of 4. At element position five, both predicate gp and predicate p are 0, so intermediate value s (4) is copied into element position five of destination vector r. The sum operation is then performed, adding the value of input vector b at element position five (5) to intermediate value s (4), resulting in a value of 9 being stored in intermediate value s.

Turning to element position six, predicate gp is 0, which activates predication, resulting the value of input vector a at element position six (5) being copied into element position six of destination vector r. Since predicate gp is 0, the sum operation is not performed. At element position seven, predicate gp and predicate p are both 1, resulting in intermediate value s (9) being copied into element position seven of destination vector r. The sum operation is then performed, adding the value of input vector b at element position seven (7) to intermediate value s (9), resulting in a value of 16 being stored in intermediate value s.

Moving to element position 8, predicate gp is again 0, so predication is again performed resulting in the value of input vector a at element position eight (7) being copied into element position eight of destination vector r. With all of the elements processed, instruction RunSumA then returns the value of destination vector r to complete the execution of the instruction. While the above example was explained as if the element positions were processed in a sequential fashion to aid in exposition, in other embodiments, the element positions may be processed in parallel.

EXAMPLE 7

Program code RunSumA with predication

```
a = RunSumAM(gp,a,b,p);
On Entry:  gp = {1 1 1 1 1 0 1 0}
           p  = {1 0 1 0 1 1 1 0}
           a  = {0 1 2 3 4 5 6 7}
           b  = {1 2 3 4 5 6 7 8}
On Exit:   a  = {0 1 1 4 4 5 9 7}
```

An example of the RunSumA instruction operating with zeroing is shown in execution example 8. The execution with zeroing is similar to the execution with predication as described above in reference to execution example 7. When functioning in zeroing mode, however, the RunSumA instruction copies a zero into the element position of destination vector r corresponding to element positions of predicate gp that contain a 0 value. For example, at element position six of execution example 7, the predicate gp is 0, resulting in a 0 being stored in element position six of destination vector r. The same occurs at element position eight.

EXAMPLE 8

Program code RunSumA with zeroing

```
a = RunSumAZ(gp,a,b,p);
On Entry:  gp = {1 1 1 1 1 0 1 0}
           p  = {1 0 1 0 1 1 1 0}
           a  = {0 1 2 3 4 5 6 7}
           b  = {1 2 3 4 5 6 7 8}
On Exit:   a  = {0 1 1 4 4 0 9 0}
```

An embodiment of the RunSumB instruction is illustrated in code example 9. The illustrated embodiment functions in a similar fashion to the RunSumA instruction described above in reference to code example 6. In the case of the RunSumB instruction, the sum operation is performed before the intermediate value s is stored in destination vector r.

EXAMPLE 9

Program code RunSumB

```
Vec RunSumB(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
```

-continued

Program code RunSumB

```
        r.v[x] = <Z/M>;
    }
    for(; x<VECLEN; ++x)
    {
        if(gp.v[x] && p.v[x])
            s = s + src2.v[x];
        if(gp.v[x])
            r.v[x] = s;
        else
            r.v[x] = <Z/M>;
    }
    return(r);
}
```

An example of the RunSumB instruction with predication is shown in execution example 10. The execution of the RunSumB instruction with predication is similar to the execution of the RunSumA instruction with predication as described above in reference to execution example 7.

EXAMPLE 10

Program code RunSumB with predication

```
a = RunSumBM(gp,a,b,p);
On Entry: gp = {1  1  1  1  1  0  1  0}
          p  = {1  0  1  0  1  1  1  0}
          a  = {0  1  2  3  4  5  6  7}
          b  = {1  2  3  4  5  6  7  8}
On Exit:  a  = {1  1  4  4  9  5  16 7}
```

An example of the RunSumB instruction with zeroing is shown in execution example 11. The execution of the RunSumB instruction with zeroing is similar to the execution of the RunSumB with predication as described above in reference to execution example 10. In the case of executing the RunSumB instruction with zeroing, when an element of predicate gp is 0, a value of 0 is copied into destination vector r rather than copying the corresponding element from input vector a into destination vector r. For example, in element position six, predicate gp is 0, and a value of 0 is forced into destination vector r at element position six. The same occurs at element position eight.

EXAMPLE 11

Program code RunSumB with zeroing

```
a = RunSumBZ(gp,a,b,p);
On Entry: gp = {1  1  1  1  1  0  1  0}
          p  = {1  0  1  0  1  1  1  0}
          a  = {0  1  2  3  4  5  6  7}
          b  = {1  2  3  4  5  6  7  8}
On Exit:  a  = {1  1  4  4  9  0  16 0}
```

Wrapping Addition

In some embodiments, conditional recurrent summation calculations may be performed using the Macroscalar instruction wrapping add (WAdd). As described above in reference to the RunSum instruction, the WAdd instruction also includes A and B variants. The instructions are:

Vec WAddA(PredV gp, Vec src1, Vec src2, PredV p)
Vec WAddB(PredV gp, Vec src1, Vec src2, PredV p)

One embodiment of a WAddA instruction is shown in code example 12. In this embodiment, using a first active element from input vector src1 as a basis, the WAddA instruction calculates a cumulative sum with active elements from input vector src2 and the basis. In the case where the first active element from input vector src1 is located in element position one of input vector src1, the value from the last element position of input vector src1 (commonly referred to as "wrapping") is used as the basis. Elements in input vector src1 prior to the first active element are copied into destination vector r at the corresponding element position. Although arithmetic addition is shown in code example 12, it is noted that other sum operations such as, for example, modulo addition are possible and contemplated.

In the illustrated embodiment, the WAdd instructions (and more generally, the various Wrapping instructions described herein) may differ from their Running counterparts in their utilization of the gp vector. As discussed above, in the context of Running instructions, gp may be used to control whether element positions of the result vector receive newly calculated results, or instead retain their prior values or are zeroed (i.e., via predication or zeroing). In the context of Wrapping instructions, gp may be used instead to determine what element will be selected as the basis, and may not control predication or zeroing of the result on a per-element basis as in the context of the Running instructions.

It is noted that in the Wrapping code examples listed below, src1 elements prior to the first active element of gp are copied to the result vector unmodified, thus effectively behaving as if those elements were predicated based on gp. However, elements following the first active element that would be considered "inactive" based on gp may not exhibit the same behavior for Wrapping instructions as for Running instructions. It is noted that in some embodiments, any of the Wrapping instructions could be defined to receive an additional input dedicated to basis selection. In such embodiments, gp could be employed for predication/zeroing of the output in a manner similar to that shown for the Running instructions, and the basis selection input could be used to determine the basis in a manner similar to that described below with respect to gp.

EXAMPLE 12

Program code WAddA

```
Vec WAddA(PredV gp, Vec src1, Vec src2, PredV p)
{
    Vector r;
    int x;
    Scalar<F/U><32/64> s;
    s = src1.v[VECLEN-1];
    for(x=0;x<VECLEN;++x)
    {
        if (x)
            s = src1.v[x];
        if(gp.v[x])
            break;
        r.v[x] = src1.v[v];
    }
    for(; x<VECLEN; ++x)
    {
        r.v[x] = s;
        if(gp.v[x] && p.v[x])
            s = s + src2.v[x];
    }
```

| Program code WAddA |
| --- |
| return(r);<br>} |

An example of the WaddA instruction operation with wrapping is shown in execution example 13. Referring collectively to execution example 13 and code example 12, the execution of the WAddA instruction begins by storing the last element from input vector a (8) in intermediate value s. The first element position is then processed. Since predicate gp is 1, the previously stored value for intermediate value s, becomes the basis for the operation and is copied to element position one of destination vector r. The sum operation is then performed using intermediate value s and the value at element position one of input vector b (2), resulting in a value of 10 being stored in intermediate value s.

Turning to element position two, both predicate gp and predicate p are 1, resulting in intermediate value s (10) being copied into element position two of destination vector r. The sum operation is then performed using the intermediate value s (10) and the value at element position two of input vector b (3), resulting in a value of 13 being stored in intermediate value s.

Moving to element position three, predicate gp and predicate p are both 0, resulting in intermediate value s (13) being copied into element position three of destination vector r, and the sum operation not being performed. At element position four, predicate gp is 1 and predicate p is 0, which again prevents the sum operation from being performed, but allows intermediate value s (13) to be stored in element position four of destination vector r.

Turning to element position five, intermediate value s (13) is copied into element position five of destination vector r. Since both predicate gp and predicate p are 1, the sum operation is performed using the intermediate value s (13) and the value at element position five of input vector b (2), resulting in a value of 15 being stored in intermediate value s.

Moving to element position six, the intermediate value s (15) is copied into element position six of destination vector r. At element position six, both predicates, gp and p, are 1, so the sum operation is performed using intermediate value s (15) and the value at element position six of input vector b (3), resulting in a value of 18 being stored in intermediate value s.

At the last two element positions (i.e., positions seven and eight), either one of both of predicates gp and p are 0, so the sum operation is not performed. At both element positions, intermediate value s (18) is copied into the corresponding position in destination vector r. With all of the element positions processed, the WMulA instruction then returns destination vector r, completing the execution of the instruction. It is noted that in other embodiments, the element positions may be processed concurrently or in a different order from the order illustrated in execution example 13.

EXAMPLE 13

| Execution of WAddA with wrapping |
| --- |
| a = WaddA(gp,a,b,p);<br>On Entry:   gp = {1 1 0 1 1 1 0 0}<br>               p = {1 1 0 0 1 1 1 0} |

| Execution of WAddA with wrapping |
| --- |
|            a = {1 2 3 4 5 6 7 8}<br>           b = {2 3 2 3 2 3 2 3}<br>On Exit:   a = {8 10 13 13 13 15 18 18} |

An example of the WAddA instruction without wrapping is shown in execution example 14. The execution of the WAddA instruction without wrapping is similar to the execution of the WAddA instruction with wrapping as described above in reference to execution example 13. In the case without wrapping, the basis is selected from the first active element from input vector a.

EXAMPLE 14

| Execution of WAddA without wrapping |
| --- |
| a = WaddA(gp,a,b,p);<br>On Entry:   gp = {0 1 0 1 1 1 1 1}<br>               p = {0 0 1 0 1 1 1 1}<br>               a = {1 2 3 4 5 6 7 8}<br>               b = {2 3 2 3 2 3 2 3}<br>On Exit:   a = {1 2 2 2 2 2 4 7 9} |

An embodiment of the WAddB instruction is illustrated in code example 15. The illustrated embodiment functions in a similar fashion to WAddA instruction described above in reference to code example 12. In the case of the WAddB instruction, the sum operation is performed before intermediate value s is stored in destination vector, and when the first active element of input vector src1 is not in the first element position, the basis is selected from the preceding element position of input vector src1.

EXAMPLE 15

| Program code WAddB |
| --- |
| Vec WAddB(PredV gp, Vec src1, Vec src2, PredV p)<br>{<br>  Vector r;<br>  int x;<br>  Scalar<F/U><32/64> s;<br>  s = src1.v[VECLEN−1];<br>  for(x=0;x<VECLEN;++x)<br>  {<br>    if(gp.v[x])<br>      break;<br>    s = src1.v[x];<br>    r.v[x] = src1.v[x];<br>  }<br>  for(; x<VECLEN; ++x)<br>  {<br>    if(gp.v[x] && p.v[x])<br>      s = s + t2;<br>    r.v[x] = s;<br>  }<br>  return(r);<br>} |

An example of the WAddB instruction with wrapping is shown in execution example 16. The execution of the WAddB instruction with wrapping is similar to the execution of the WAddA instruction with wrapping as described above in reference to execution example 13. In the case of the B variant of the WAdd instruction, the sum operation is performed before the intermediate value s is copied into destination vector r.

EXAMPLE 16

| Execution of WAddB with wrapping |
|---|
| a = WAddB(gp,a,b,p);<br>On Entry:  gp = {1  1  0  1  1  1  0  0}<br>            p  = {1  1  0  0  1  1  1  0}<br>            a  = {1  2  3  4  5  6  7  8}<br>            b  = {2  3  2  3  2  3  2  3}<br>On Exit:   a = {10 13 13 13 15 18 18 18} |

An example of the WAddB instruction without wrapping is shown in execution example 17. The execution of the WAddB instruction without wrapping is similar to the execution of the WAddA instruction without wrapping as described above in reference to execution example 14. In the case of the B variant of the WAdd instruction, the sum operation is performed before the intermediate value s is copied into destination vector r, and the basis is selected from the preceding active element position.

EXAMPLE 17

| Execution of WAddB without wrapping |
|---|
| a = WAddB(gp,a,b,p);<br>On Entry:  gp = {0  1  0  1  1  1  1  1}<br>            p  = {0  0  1  0  1  1  1  1}<br>            a  = {1  2  3  4  5  6  7  8}<br>            b  = {2  3  2  3  2  3  2  3}<br>On Exit:   a = {1  1  1  1  3  6  8  11} |

Figure 9:
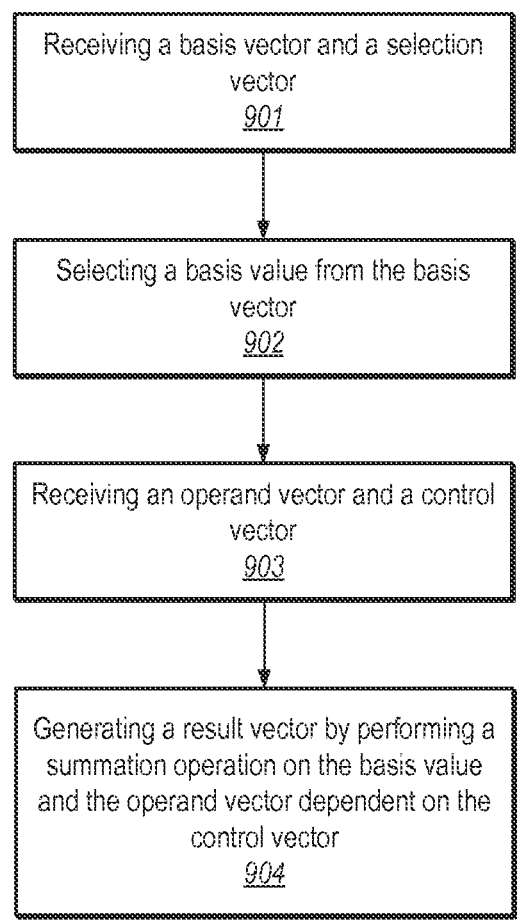
FIG. 9 is a flow diagram depicting the operation of one embodiment of the processor of FIG. 2 during execution of program instructions that implement a wrapping summation operation.

In FIG. 9, a flow diagram depicting the operation of one embodiment of the processor of FIG. 2 during execution of program instructions that implement a running/wrapping summation operation is shown. Referring collectively to FIG. 1, FIG. 2 and Examples 6-17, and beginning in block 901 of FIG. 9, processor 102 may receive a basis vector (e.g., vector src1 of code example 15) and a selection vector (e.g., vector gp of code example 15). In some embodiments, the basis vector and the selection vector may be received from L1 cache 104 or L2 cache 106, while in other embodiments, the vectors may reside in memory 108 or mass storage device 110.

A basis value may then be selected from the basis vector (block 902). For example, as described above in regards to the WAddB instruction, the element preceding the first active element of the basis vector is selected as the basis unless the first active element is in the first element position. In some embodiments, when the first active element is in the first element position, the basis value may be selected from the last element position of the basis vector. (It is contemplated that in some embodiments, for any of the instructions described herein, selection of the basis value may be dependent upon both the selection vector and the control vector described below. For example, various embodiments of Running instructions described herein select the basis value s dependent upon both gp and p.)

Processor 102 may also receive an operand vector and a control vector, such as, e.g., vectors src2 and p from code example 15 (block 903). As described above, processor 102 may receive the operand vector from L1 cache 104, L2 cache 106, memory 108, or mass storage device 110. In some embodiments, the operand vector and/or control vector may be received concurrently with other inputs to instruction execution (e.g., the basis and selection vectors) or in any other suitable order. It is noted that the basis and operand vectors may be generally considered to be input vectors, and may be referred to as such.

A result vector (e.g., vector r of code example 15) may then be generated by performing a summation operation using the basis value and the operand vector dependent upon the control vector (block 904). In some embodiments, the summation operation may be arithmetic addition, although other types of summation operations (e.g., modulo arithmetic) are possible and contemplated. Additionally, in some embodiments, the summation operation may also depend on the selection vector (e.g., vector gp of code example 15). It is noted that flow diagram depicted in FIG. 9 is merely an example and that additional operations and/or a different order of operations are possible and contemplated.

Running Subtraction

In some embodiments, conditional recurrent difference operations may be implemented using instructions in the Macroscalar architecture. More particularly, as described further below, running subtraction (RunSub) may be implemented.

The RunSub instruction operates by conditionally performing the specified recurrent difference operation on elements of a vector in ascending order, corresponding to a series of iterations of a scalar version of the operation. As with previously described instructions, the RunSub instruction may have two embodiments. The instructions are:

Vec RunSubA(PredV gp, Vec src1, Vec src2, PredV p)
    Vec RunSubB(PredV gp, Vec src1, Vec src2, PredV p)

One embodiment of a RunSubA instruction is shown in code example 18. In this embodiment, using a first selected active element from input vector src1 as a basis, the RunSubA instruction calculates a cumulative difference with active elements from input vector src2 and the basis. In the illustrated example code, the RunSubA instruction stores intermediate value s into destination vector r prior to performing the difference operation.

EXAMPLE 18

| Program code RunSubA |
|---|
| Vec RunSubA(PredV gp, Vec src1, Vec src2, PredV p)<br>{<br>  Vector r;<br>  int x;<br>  Scalar<F/U><32/64> s;<br>  for(x=0;x<VECLEN;++x)<br>  {<br>    if(gp.v[x] && p.v[x])<br>    {<br>      s = src1.v[x];<br>      break;<br>    }<br>    else if(gp.v[x])<br>      r.v[x] = src1.v[x];<br>    else<br>      r.v[x] = <Z/M>;<br>  }<br>  for(; x<VECLEN; ++x)<br>  { |

-continued

Program code RunSubA

```
    if(gp.v[x])
       r.v[x] = s;
    else
       r.v[x] = <Z/M>;
    if(gp.v[x] && p.v[x])
       s = s - src2.v[x];
  }
  return(r);
}
```

An example of the RunSubA instruction operating with predication is shown in execution example 19. The RunSubA instruction proceeds in a similar fashion to the execution example described above in reference to the RunAddA instruction. In the case of the RunSubA instruction, each time the operation is performed, it is arithmetic subtraction as opposed to arithmetic addition.

EXAMPLE 19

Program code RunSubA with predication

```
a = RunSubAM(gp,a,b,p);
On Entry:  gp =  {1 1 1 1 1 0 1 0}
           p  =  {1 0 1 0 1 1 1 0}
           a  =  {14 1 2 3 4 5 6 7}
           b  =  {1 2 3 4 5 6 7 8}
On Exit:   a  =  {14 13 13 10 10 5 5 7}
```

An example of the RunSubA instruction operating with zeroing is shown in execution example 20. The execution with zeroing is similar to the execution with predication as described above in reference to execution example 19. When functioning in zeroing mode, however, the RunSubA instruction copies a zero into the element position of destination vector r corresponding to element positions of predicate gp that contain a 0 value. For example, at element position six of execution example 20, the predicate gp is 0, resulting in a 0 being stored in element position six of destination vector r. The same occurs at element position eight.

EXAMPLE 20

Program code RunSubA with zeroing

```
a = RunSubAZ(gp,a,b,p);
On Entry:  gp =  {1 1 1 1 1 0 1 0}
           p  =  {1 0 1 0 1 1 1 0}
           a  =  {14 1 2 3 4 5 6 7}
           b  =  {1 2 3 4 5 6 7 8}
On Exit:   a  =  {14 13 13 10 10 0 5 0}
```

An embodiment of the RunSubB instruction is illustrated in code example 21. The illustrated embodiment functions in a similar fashion to the RunSubA instruction described above in reference to code example 18. In the case of the RunSubB instruction, the difference operation is performed before the intermediate value s is stored in destination vector r.

EXAMPLE 21

Program code RunSubB

```
Vec RunSubB(PredV gp, Vec src1, Vec src2, PredV p)
{
  Vector r;
  int x;
  Scalar<F/U><32/64> s;
  for(x=0;x<VECLEN;++x)
  {
    if(gp.v[x] && p.v[x])
    {
       s = src1.v[x];
       break;
    }
    else if(gp.v[x])
       r.v[x] = src1.v[x];
    else
       r.v[x] = <Z/M>;
  }
  for(; x<VECLEN; ++x)
  {
    if(gp.v[x] && p.v[x])
       s = s - src2.v[x];
    if(gp.v[x])
       r.v[x] = s;
    else
       r.v[x] = <Z/M>;
  }
  return(r);
}
```

An example of the RunSubB instruction with predication is shown in execution example 22. The execution of the RunSubB instruction with predication is similar to the execution of the RunSubA instruction with predication as described above in reference to execution example 19.

EXAMPLE 22

Program code RunSubB with predication

```
a = RunSubBM(gp,a,b,p);
On Entry:  gp =  {1 1 1 1 1 0 1 0}
           p  =  {1 0 1 0 1 1 1 0}
           a  =  {14 1 2 3 4 5 6 7}
           b  =  {1 2 3 4 5 6 7 8}
On Exit:   a  =  {13 13 10 10 5 5 -2 7}
```

An example of the RunSubB instruction with zeroing is shown in execution example 23. The execution of the RunSubB instruction with zeroing is similar to the execution of the RunSubB with predication as described above in reference to execution example 22. In the case of executing the RunSubB instruction with zeroing, when an element of predicate gp is 0, a value of 0 is copied into destination vector r rather than copying the corresponding element from input vector a into destination vector r. For example, in element position six, predicate gp is 0, and a value of 0 is forced into destination vector r at element position six. The same occurs at element position eight.

EXAMPLE 23

| Program code RunSubB with zeroing |
|---|
| a = RunSubBZ(gp,a,b,p);<br>On Entry:  gp =   {1 1 1 1 1 0 1 0}<br>              p =   {1 0 1 0 1 1 1 0}<br>              a =   {14 1 2 3 4 5 6 7}<br>              b =   {1 2 3 4 5 6 7 8}<br>On Exit:   a =   {13 13 10 10 5 0 −2 0} |

Wrapping Subtraction

In some embodiments, conditional recurrent difference calculations may be performed using the Macroscalar instruction wrapping sub (WSub). As described above in reference to the RunSum instruction, the WSub instruction also includes A and B variants. The instructions are:

Vec WSubA(PredV gp, Vec src1, Vec src2, PredV p)

Vec WSubB(PredV gp, Vec src1, Vec src2, PredV p)

One embodiment of a WSubA instruction is shown in code example 24. The illustrated embodiment operates as described above in reference to the WAddA instruction. In this embodiment, however, a cumulative difference is calculated rather than the cumulative sum of the WAddA instruction.

EXAMPLE 24

| Program code WSubA |
|---|
| Vec WSubA(PredV gp, Vec src1, Vec src2, PredV p)<br>{<br>  Vector r;<br>  int x;<br>  Scalar<F/U><32/64> s;<br>  s = src1.v[VECLEN−1];<br>  for(x=0;x<VECLEN;++x)<br>  {<br>    if(x)<br>      s = src1.v[x];<br>    if(gp.v[x])<br>      break;<br>    r.v[x] = src1.v[v];<br>  }<br>  for(; x<VECLEN; ++x)<br>  {<br>    r.v[x] = s;<br>    if(gp.v[x] && p.v[x])<br>      s = s − src2.v[x];<br>  }<br>  return(r);<br>} |

An example of the WSubA instruction operation with wrapping is shown in execution example 25. The WSubA instruction operates in a fashion similar to the WAddA instruction as described above in reference to execution example 13.

EXAMPLE 25

| Execution of WSubA with wrapping |
|---|
| a = WSubA(gp,a,b,p);<br>On Entry:  gp =   {1 1 0 1 1 1 0 0}<br>              p =   {1 1 0 0 1 1 1 0}<br>              a =   {1 2 3 4 5 6 7 8}<br>              b =   {2 3 2 3 2 3 2 3}<br>On Exit:   a =   {8 6 3 3 3 1 −2 −2} |

An example of the WSubA instruction without wrapping is shown in execution example 26. The execution of the WSubA instruction without wrapping is similar to the execution of the WSubA instruction with wrapping as described above in reference to execution example 25. In the case without wrapping, the basis is selected from the first active element from input vector a.

EXAMPLE 26

| Execution of WSubA without wrapping |
|---|
| a = WSubA(gp,a,b,p);<br>On Entry:  gp =   {0 1 0 1 1 1 1 1}<br>              p =   {0 0 1 0 1 1 1 1}<br>              a =   {1 2 3 4 5 6 7 8}<br>              b =   {2 3 2 3 2 3 2 3}<br>On Exit:   a =   {1 2 2 2 2 0 −3 −5} |

An embodiment of the WSubB instruction is illustrated in code example 27. The illustrated embodiment functions in a similar fashion to WSubA instruction described above in reference to code example 24. In the case of the WSubB instruction, the difference operation is performed before intermediate value s is stored in destination vector, and when the first active element of input vector src1 is not in the first element position, the basis is selected from the preceding element position of input vector src1.

EXAMPLE 27

| Program code WSubB |
|---|
| Vec WSubB(PredV gp, Vec src1, Vec src2, PredV p)<br>{<br>  Vector r;<br>  int x;<br>  Scalar<F/U><32/64> s;<br>  s = src1.v[VECLEN−1];<br>  for(x=0;x<VECLEN;++x)<br>  {<br>    if(gp.v[x])<br>      break;<br>    s = src1.v[x];<br>    r.v[x] = src1.v[x];<br>  }<br>  for(; x<VECLEN; ++x)<br>  { |

-continued

Program code WSubB

```
    if(gp.v[x] && p.v[x])
        s = s − t2;
    r.v[x] = s;
    }
    return(r);
}
```

An example of the WSubB instruction with wrapping is shown in execution example 28. The execution of the WSubB instruction with wrapping is similar to the execution of the WSubA instruction with wrapping as described above in reference to execution example 25. In the case of the B variant of the WSub instruction, the difference operation is performed before the intermediate value s is copied into destination vector r.

EXAMPLE 28

Execution of WSubB with wrapping

```
a = WSubB(gp,a,b,p);
On Entry:  gp =  {1 1 0 1 1 1 0 0}
            p =  {1 1 0 0 1 1 1 0}
            a =  {1 2 3 4 5 6 7 8}
            b =  {2 3 2 3 2 3 2 3}
On Exit:    a =  {6 3 3 3 1 −2 −2 −2}
```

An example of the WSubB instruction without wrapping is shown in execution example 29. The execution of the WSubB instruction with wrapping is similar to the execution of the WSubA instruction without wrapping as described above in reference to execution example 26. In the case of the B variant of the WSub instruction, the difference operation is performed before the intermediate value s is copied into destination vector r, and the basis is selected from the preceding active element position.

EXAMPLE 29

Execution of WSubB without wrapping

```
a = WSubB(gp,a,b,p);
On Entry:  gp =  {0 1 0 1 1 1 1 1}
            p =  {0 0 1 0 1 1 1 1}
            a =  {1 2 3 4 5 6 7 8}
            b =  {2 3 2 3 2 3 2 3}
On Exit:    a =  {1 1 1 1 −1 −4 −6 −9}
```

Figure 10:
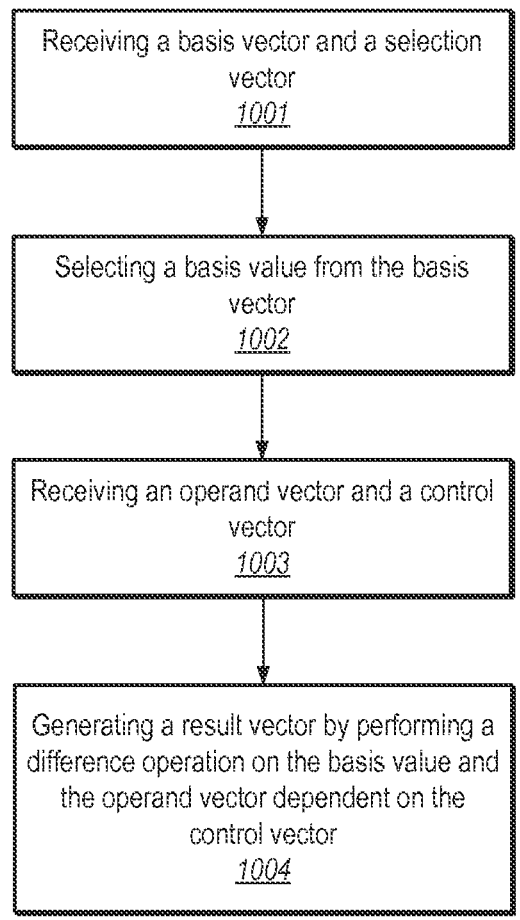
FIG. 10 is a flow diagram depicting the operation of one embodiment of the processor of FIG. 2 during execution of program instructions that implement a wrapping difference operation.

In FIG. 10, a flow diagram depicting the operation of one embodiment of the processor of FIG. 2 during execution of program instructions that implement a running/wrapping difference operation is shown. Referring collectively to FIG. 1, FIG. 2 and Examples 24-29, and beginning in block 1001 of FIG. 10, processor 102 may receive a basis vector (e.g., vector src1 of code example 27) and a selection vector (e.g., vector gp of code example 27). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1002). For example, as described above in reference to the WSubB instruction, the element preceding the first active element of the basis vector is selected as the basis value unless the first active element is in the first element position. In some embodiments, when the first active element is in the first element position, the basis value may be selected from the last element position of the basis vector.

Processor 102 may also receive an operand vector and a control vector, such as, e.g., vectors src2 and p of code example 27 (block 1003). As described above, processor 102 may receive the operand vector from L1 cache 104, L2 cache 106, memory 108, or mass storage device 110. As noted previously, the operand vector and/or control vector may be received concurrently with other inputs to instruction execution (e.g., the basis and selection vectors) or in any other suitable order.

A result vector (e.g., vector r of code example 27) may then be generated by performing a difference operation using the basis value and the operand vector dependent upon the control vector (block 1004). In some embodiments, the difference operation may be arithmetic subtraction, although other types of difference operations (e.g., modulo arithmetic) are possible and contemplated. Additionally, in some embodiments, the difference operation may also depend on the selection vector (e.g., vector gp of code example 27). It is noted that the flow diagram depicted in FIG. 10 is merely an example and that additional operations and different orders of operations are possible and contemplated.

Running Multiply

In some embodiments, conditional recurrent product operations may be implemented using instructions in the Macroscalar architecture. More particularly, as described further below, running multiply (RunMul) may be implemented.

The RunMul instruction operates by conditionally performing the specified recurrent product operation on elements of a vector in ascending order, corresponding to a series of iterations of a scalar version of the operation. As with previously described instructions, the RunMul instruction may have the A and B variants. The variants are:

Vec RunMulA(PredV gp, Vec src1, Vec src2, PredV p)
Vec RunMulB(PredV gp, Vec src1, Vec src2, PredV p)

One embodiment of a RunMulA instruction is shown in code example 30. In this embodiment, using a first selected active element from input vector src1 as a basis, the RunMulA instruction calculates a cumulative product with active elements from input vector src2 and the basis in a similar fashion to how the RunSumA instruction calculates a cumulative sum as described above. It is noted that in code example 30, that while the product operation is shown as arithmetic multiplication, other product operations, such as, e.g., modulo multiplication, are possible and contemplated.

EXAMPLE 30

Program code RunMulA

```
Vec RunMulA(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
```

-continued

Program code RunMulA

```
{
        s = src1.v[x];
        break;
    }
    else if(gp.v[x])
        r.v[x] = src1.v[x];
    else
        r.v[x] = <Z/M>;
}
for(; x<VECLEN; ++x)
{
    if(gp.v[x])
        r.v[x] = s;
    else
        r.v[x] = <Z/M>;
    if(gp.v[x] && p.v[x])
        s = s * src2.v[x];
}
return(r);
}
```

An example of the RunMulA instruction operating with predication is shown in execution example 31. The details of the example, such as, e.g., the selection of the basis, are similar as described above in reference to execution example 7 of the RunSumA instruction. In the case of the RunMulA instruction, however, the operation performed is arithmetic multiplication as opposed to arithmetic addition.

EXAMPLE 31

Execution of RunMulA with predication

```
a = RunMulAM(gp,a,b,p);
On Entry:   gp =   {1 1 1 1 1 0 1 0}
            p  =   {0 1 1 0 1 1 1 0}
            a  =   {7 6 5 4 3 2 1 0}
            b  =   {7 2 1 2 3 4 2 6}
On Exit:    a  =   {7 6 12 12 12 2 36 0}
```

An example of the RunMulA instruction operating with zeroing is shown in execution example 32. The execution with zeroing is similar to the execution with predication as described above in reference to execution example 31. When functioning in zeroing mode, however, the RunMulA instruction copies a zero into the element position of destination vector r corresponding to element positions of predicate gp that contain a 0 value. For example, at element position six of execution example 32, the predicate gp is 0, resulting in a 0 being stored in element position six of destination vector r. The same occurs at element position eight.

EXAMPLE 32

Execution of RunMulA with zeroing

```
a = RunMulAZ(gp,a,b,p);
On Entry:   gp =   {1 1 1 1 1 0 1 0}
            p  =   {0 1 1 0 1 1 1 0}
            a  =   {7 6 5 4 3 2 1 0}
            b  =   {7 2 1 2 3 4 2 6}
On Exit:    a  =   {7 6 12 12 12 0 36 0}
```

An embodiment of the RunMulB instruction is illustrated in code example 33. The illustrated embodiment functions in a similar fashion to the RunMulA instruction described above in reference to code example 30. In the case of the RunMulB instruction, the product operation is performed before the intermediate value s is stored in destination vector r.

EXAMPLE 33

Program code RunMulB

```
Vec RunMulB(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x] && p.v[x])
            s = s * src2.v[x];
        if(gp.v[x])
            r.v[x] = s;
        else
            r.v[x] = <Z/M>;
    }
    return(r);
}
```

An example of the RunMulB instruction with predication is shown in execution example 34. The execution of the RunMulB instruction with predication is similar to the execution of the RunMulA instruction with predication as described above in reference to execution example 31. In the case of the B variant of the RunMul instruction, the product operation is performed before the intermediate value s is copied into destination vector r. For example, at element position five, both predicate gp and predicate p are 1, so the product operation between the intermediate value s (12) and element five of input vector b (3), resulting in a value of 36 being stored into intermediate value s. The intermediate value s is then copied into element position six of destination vector r.

EXAMPLE 34

Execution of RunMulB with predication

```
a = RunMulBM(gp,a,b,p);
On Entry:   gp =   {1 1 1 1 1 0 1 0}
            p  =   {0 1 1 0 1 1 1 0}
            a  =   {7 6 5 4 3 2 1 0}
            b  =   {7 2 1 2 3 4 2 6}
On Exit:    a  =   {7 12 12 12 36 2 72 0}
```

An example of the RunMulB instruction with zeroing is shown in execution example 35. The execution of the Run- MulB instruction with zeroing is similar to the execution of the RunMulB with predication as described above in reference to execution example 34. In the case of executing the RunMulB instruction with zeroing, when an element of predicate gp is 0, a value of 0 is copied into destination vector r rather than copying the corresponding element from input vector a into destination vector r. For example, in element position six, predicate gp is 0, and a value of 0 is forced into destination vector r at element position six.

EXAMPLE 35

| Execution of RunMulB with zeroing |
|---|
| a = RunMulBM(gp,a,b,p); |
| On Entry: gp = {1 1 1 1 1 0 1 0} |
| p = {0 1 1 0 1 1 1 0} |
| a = {7 6 5 4 3 2 1 0} |
| b = {7 2 1 2 3 4 2 6} |
| On Exit: a = {7 12 12 12 36 0 72 0} |

Wrapping Multiply

In some embodiments, conditional recurrent product calculations may be performed using the Macroscalar instruction wrapping multiply (WMul). As with the previously described instructions, the WMul instruction may have the A and B variants. The variants are:

Vec WMulA(PredV gp, Vec src1, Vec src2, PredV p)
Vec WMulB(PredV gp, Vec src1, Vec src2, PredV p)

One embodiment of a WMulA instruction is shown in code example 36. In this embodiment, using a first active element from input vector src1 as a basis, the WMulA instruction calculates a cumulative product with active elements from input vector src2 and the basis in a similar fashion to how the WAddA instruction calculates a cumulative sum as described above. It is noted that in code example 36, that while the product operation is shown as arithmetic multiplication, other product operations, such as, e.g., modulo multiplication, are possible and contemplated.

EXAMPLE 36

| Program code WMulA |
|---|
| Vec WMulA(PredV gp, Vec src1, Vec src2, PredV p) |
| { |
|   Vector r; |
|   int x; |
|   Scalar<F/U><32/64> s; |
|   s = src1.v[VECLEN−1]; |
|   for(x=0;x<VECLEN;++x) |
|   { |
|     if(x) |
|       s = src1.v[x]; |
|     if(gp.v[x]) |
|       break; |
|     r.v[x] = src1.v[x]; |
|   } |
|   for(; x<VECLEN; ++x) |
|   { |
|     r.v[x] = s; |
|     if(gp.v[x] && p.v[x]) |
|       s = s * src2.v[x]; |
|   } |
|   return(r); |
| } |

An example of the WMulA instruction operating with wrapping is shown in execution example 37. The details of the example, such as, e.g., the selection of the basis, are similar to those of the WAddA in execution example 13. In the case of WMulA, however, the operation performed is arithmetic multiplication as opposed to arithmetic addition.

EXAMPLE 37

| Execution of WMulA with wrapping |
|---|
| a = WMulA(gp,a,b,p); |
| On Entry: gp = {1 1 0 1 1 1 0 0} |
| p = {1 1 0 0 1 1 1 0} |
| a = {1 2 3 4 5 6 7 8} |
| b = {2 3 2 3 2 3 2 3} |
| On Exit: a = {8 16 48 48 48 96 288 288} |

An example of the WMulA instruction without wrapping is illustrated in execution example 38. The illustrated embodiment operates in a similar fashion to the WMulA instruction with wrapping as described above in reference to execution example 37. In the non-wrapping case, predicate gp and predicate p are both 0 at element position one which indicates that element position one of input vector a is not an active element and, therefore, is not selected as the basis for the operation. The first active element is found at element position two where predicate gp is 1. The remaining portion of the execution of the WMulA instruction without wrapping then proceeds as described above in reference to the WMulA instruction with wrapping.

EXAMPLE 38

| Execution of WMulA without wrapping |
|---|
| a = WMulA(gp,a,b,p); |
| On Entry: gp = {0 1 0 1 1 1 1 1} |
| p = {0 0 1 0 1 1 1 1} |
| a = {1 2 3 4 5 6 7 8} |
| b = {2 3 2 3 2 3 2 3} |
| On Exit: a = {1 2 2 2 2 4 12 24} |

An embodiment of the WMulB instruction is illustrated in code example 39. The illustrated embodiment functions in a similar fashion to the WMulA instruction described above in reference to code example 36. In the case of the WMulB instruction, the product operation is performed before the intermediate value s is stored in destination vector r.

EXAMPLE 39

| Program code WMulB |
|---|
| Vec WMulB(PredV gp, Vec src1, Vec src2, PredV p) |
| { |
|   Vector r; |
|   int x; |
|   Scalar<F/U><32/64> s; |
|   s = src1.v[VECLEN−1]; |
|   for(x=0;x<VECLEN;++x) |
|   { |

-continued

Program code WMulB

```
    if(gp.v[x])
        break;
    r.v[x] = src1.v[x];
    s = src1.v[x];
  }
  for(; x<VECLEN; ++x)
  {
    if(gp.v[x] && p.v[x])
      s = s * src2.v[x];
    r.v[x] = s;
  }
  return(r);
}
```

An example of the WMulB instruction with wrapping is shown in execution example 40. The execution of the WMulB instruction with wrapping is similar to the execution of the WMulA instruction with wrapping as described above in reference to execution example 37. In the case of the B variant of the WMul instruction, the product operation is performed before the intermediate value s is copied into destination vector r.

EXAMPLE 40

Execution of WMulB with wrapping

```
a = WMulB(gp,a,b,p);
  On Entry:  gp  =  {1 1 0 1 1 1 0 0}
             p   =  {1 1 0 0 1 1 1 0}
             a   =  {1 2 3 4 5 6 7 8}
             b   =  {2 3 2 3 2 3 2 3}
  On Exit:   a = {16 48 48 48 96 288 288 288}
```

An example of the WMulB instruction without wrapping is shown in execution example 41. The execution of the WMulB instruction without wrapping is similar to the execution of the WMulB with wrapping as described above in reference to execution example 40. In the non-wrapping case, predicate gp and predicate p are both 0 at element position one which indicates that element position one of input vector a is not an active element and, therefore, the last element of input vector a is not selected as the basis for the operation. The first active element is found at element position two where predicate gp is 1. The remaining portion of the execution of the WMulB instruction without wrapping then proceeds as described above in reference to the WMulB instruction with wrapping.

EXAMPLE 41

Execution of WMulB without wrapping

```
a = WMulB(gp,a,b,p);
  On Entry:  gp  =  {0 1 0 1 1 1 1 1}
             p   =  {0 0 1 0 1 1 1 1}
             a   =  {1 2 3 4 5 6 7 8}
             b   =  {2 3 2 3 2 3 2 3}
  On Exit:   a = {1 1 1 1 2 6 12 36}
```

Figure 11:
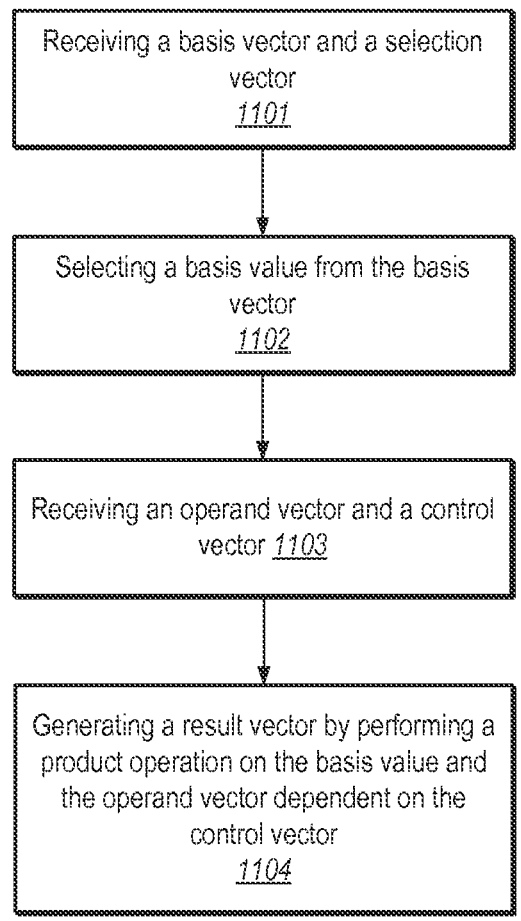
FIG. 11 is a flow diagram depicting the operation of one embodiment of the processor of FIG. 2 during execution of program instructions that implement a wrapping product operation.

In FIG. 11, a flow diagram depicting the operation of one embodiment of the processor of FIG. 2 during execution of program instructions that implement a running/wrapping product operation is shown. Referring collectively to FIG. 1, FIG. 2 and Examples 30-41, and beginning in block 1101 of FIG. 11, processor 102 may receive a basis vector (e.g., vector src1 of code example 39) and a selection vector (e.g., vector gp of code example 39). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1102). For example, as described above in reference to the WMulB instruction, the element preceding the first active element of the basis vector is selected as the basis value unless the first active element is in the first element position. In some embodiments, when the first active element is in the first element position, the basis value may be selected from the last element position of the basis vector.

Processor 102 may also receive an operand vector and a control vector, such as, e.g., vectors src2 and p of code example 39 (block 1103). As described above, processor 102 may receive the operand vector from L1 cache 104, L2 cache 106, memory 108, or mass storage device 110. As noted previously, the operand vector and/or control vector may be received concurrently with other inputs to instruction execution (e.g., the basis and selection vectors) or in any other suitable order.

A result vector (e.g., vector r of code example 39) may then be generated by performing a product operation using the basis value and the operand vector dependent upon the control vector (block 1104). In some embodiments, the product operation may be arithmetic multiplication, although other types of product operations (e.g., Galois field operations or modulo arithmetic) are possible and contemplated. In some embodiments, the product operation may also depend on the selection vector (e.g., vector gp of code example 39). It is noted that the flow diagram depicted in FIG. 11 is merely an example and that additional operations and different orders or operations are possible and contemplated.

Running Divide

In some embodiments, conditional recurrent quotient operations may be implemented using instructions in the Macroscalar architecture. More particularly, as described further below, running divide (RunDiv) may be implemented.

The RunDiv instruction operates by conditionally performing the specified recurrent quotient operation on elements of a vector in ascending order, corresponding to a series of iterations of a scalar version of the operation. As with previously described instructions, the RunDiv instruction may have the A and B variants. The variants are:

Vec RunDivA(PredV gp, Vec src1, Vec src2, PredV p)

Vec RunDivB(PredV gp, Vec src1, Vec src2, PredV p)

One embodiment of a RunDivA instruction is shown in code example 42. In this embodiment, using a first selected active element from input vector src1 as a basis, the RunDivA instruction calculates a cumulative quotient with active elements from input vector src2 and the basis in a similar fashion to how the RunSumA instruction calculates a cumulative sum as described above. It is noted that in code example 42, that while the quotient operation is shown as arithmetic division, other quotient operations, such as, e.g., modulo division, are possible and contemplated.

EXAMPLE 42

---
Program code RunDivA

```
Vec RunDivA(PredV gp, Vec src1, Vec src2, PredV p)
{
  Vector r;
  int x;
  Scalar<F/U><32/64> s;
  for(x=0;x<VECLEN;++x)
  {
    if(gp.v[x] && p.v[x])
    {
      s = src1.v[x];
      break;
    }
    else if(gp.v[x])
      r.v[x] = src1.v[x];
    else
      r.v[x] = <Z/M>;
  }
  for(; x<VECLEN; ++x)
  {
    if(gp.v[x])
      r.v[x] = s;
    else
      r.v[x] = <Z/M>;
    if(gp.v[x] && p.v[x])
      s = s * src2.v[x];
  }
  return(r);
}
```
---

An example of the RunDivA instruction operating with predication is shown in execution example 43. The details of the example, such as, e.g., the selection of the basis, are similar as described above in reference to execution example 7 of the RunSumA instruction. In the case of the RunDivA instruction, however, the operation performed is arithmetic division as opposed to arithmetic addition.

EXAMPLE 43

---
Execution of RunDivA with predication

```
a = RunDivAM(gp,a,b,p);
On Entry:  gp  =  {1 1 1 1 1 0 1 0}
           p   =  {0 1 1 0 1 1 1 0}
           a   =  {12 64 5 4 3 9 1 7}
           b   =  {2 2 4 2 2 2 2 2}
On Exit:   a = {12 64 32 8 8 9 4 7}
```
---

An example of the RunDivA instruction operating with zeroing is shown in execution example 44. The execution with zeroing is similar to the execution with predication as described above in reference to execution example 43. When functioning in zeroing mode, however, the RunDivA instruction copies a zero into the element position of destination vector r corresponding to element positions of predicate gp that contain a 0 value. For example, at element position six of execution example 44, the predicate gp is 0, resulting in a 0 being stored in element position six of destination vector r. The same occurs at element position eight.

EXAMPLE 44

---
Execution of RunDivA with zeroing

```
a = RunDivAZ(gp,a,b,p);
On Entry:  gp  =  {1 1 1 1 1 0 1 0}
           p   =  {0 1 1 0 1 1 1 0}
           a   =  {12 64 5 4 3 9 1 7}
           b   =  {2 2 4 2 2 2 2 2}
On Exit:   a = {12 64 32 8 8 0 4 0}
```
---

An embodiment of the RunDivB instruction is illustrated in code example 45. The illustrated embodiment functions in a similar fashion to the RunDivA instruction described above in reference to code example 42. In the case of the RunDivB instruction, the quotient operation is performed before the intermediate value s is stored in destination vector r.

EXAMPLE 45

---
Program code RunDivB

```
Vec RunDivB(PredV gp, Vec src1, Vec src2, PredV p)
{
  Vector r;
  int x;
  Scalar<F/U><32/64> s;
  for(x=0;x<VECLEN;++x)
  {
    if(gp.v[x] && p.v[x])
    {
      s = src1.v[x];
      break;
    }
    else if(gp.v[x])
      r.v[x] = src1.v[x];
    else
      r.v[x] = <Z/M>;
  }
  for(; x<VECLEN; ++x)
  {
    if(gp.v[x] && p.v[x])
      s = s * src2.v[x];
    if(gp.v[x])
      r.v[x] = s;
    else
      r.v[x] = <Z/M>;
  }
  return(r);
}
```
---

An example of the RunDivB instruction with predication is shown in execution example 46. The execution of the RunDivB instruction with predication is similar to the execution of the RunDivA instruction with predication as described above in reference to execution example 43. In the case of the B variant of the RunDiv instruction, the quotient operation is performed before the intermediate value s is copied into destination vector r.

EXAMPLE 46

| Execution of RunDivB with predication | | | |
|---|---|---|---|
| a = RunDivBM(gp,a,b,p); | | | |
| On Entry: | gp | = | {1 1 1 1 1 0 1 0} |
| | p | = | {0 1 1 0 1 1 1 0} |
| | a | = | {12 64 5 4 3 9 1 7} |
| | b | = | {2 2 4 2 2 2 2 2} |
| On Exit: | a = | | {12 32 8 8 4 9 2 7} |

An example of the RunDivB instruction with zeroing is shown in execution example 47. The execution of the RunDivB instruction with zeroing is similar to the execution of the RunDivB with predication as described above in reference to execution example 46. In the case of executing the RunDivB instruction with zeroing, when an element of predicate gp is 0, a value of 0 is copied into destination vector r rather than copying the corresponding element from input vector a into destination vector r. For example, in element position six, predicate gp is 0, and a value of 0 is forced into destination vector r at element position six.

EXAMPLE 47

| Execution of RunDivB with zeroing | | | |
|---|---|---|---|
| a = RunDivBM(gp,a,b,p); | | | |
| On Entry: | gp | = | {1 1 1 1 1 0 1 0} |
| | p | = | {0 1 1 0 1 1 1 0} |
| | a | = | {12 64 5 4 3 9 1 7} |
| | b | = | {2 2 4 2 2 2 2 2} |
| On Exit: | a = | | {12 32 8 8 4 0 2 0} |

Wrapping Divide

In some embodiments, conditional recurrent quotient calculations may be performed using the Macroscalar instruction wrapping divide (WDiv). As with the previously described instructions, the WDiv instruction may have the A and B variants. The variants are:

Vec WDivA(PredV gp, Vec src1, Vec src2, PredV p)

Vec WDivB(PredV gp, Vec src1, Vec src2, PredV p)

One embodiment of a WDivA instruction is shown in code example 48. In this embodiment, using a first active element from input vector src1 as a basis, the WDivA instruction calculates a cumulative quotient with active elements from input vector src2 and the basis in a similar fashion to how the WAddA instruction calculates a cumulative sum as described above. It is noted that in code example 48, that while the quotient operation is shown as arithmetic division, other quotient operations, such as, e.g., modulo division, are possible and contemplated.

EXAMPLE 48

| Program code WDivA |
|---|
| Vec WDivA(PredV gp, Vec src1, Vec src2, PredV p) |
| { |
|   Vector r; |
|   int x; |
|   Scalar<F/U><32/64> s; |
|   s = src1.v[VECLEN−1]; |
|   for(x=0;x<VECLEN;++x) |
|   { |
|     if(x) |
|       s = src1.v[x]; |
|     if(gp.v[x]) |
|       break; |
|     r.v.[x] = src1.v[x]; |
|   } |
|   for(; x<VECLEN; ++x) |
|   { |
|     r.v.[x] = s; |
|     if(gp.v[x] && p.v.[x]) |
|       s = s / src2.v[x]; |
|   } |
|   return(r); |
| } |

An example of the WDivA instruction operating with wrapping is shown in execution example 49. The details of the example, such as, e.g., the selection of the basis, are similar to those of the WAddA in execution example 13. In the case of WDivA, however, the operation performed is arithmetic division as opposed to arithmetic addition. It is noted that this and similar examples of division use integers, with results reflecting integer precision (i.e., truncated before a fractional part).

EXAMPLE 49

| Execution of WDivA with wrapping | | | |
|---|---|---|---|
| a = WDivA(gp,a,b,p); | | | |
| On Entry: | gp = | | {1 1 0 1 1 1 0 0} |
| | p | = | {1 1 0 0 1 1 1 0} |
| | a | = | {1023 1022 3 4 5 6 7 1024} |
| | b | = | {2 3 2 3 2 3 2 3} |
| On Exit: | a = | | {1024 512 170 170 170 85 28 28} |

An example of the WDivA instruction without wrapping is illustrated in execution example 50. The illustrated embodiment operates in a similar fashion to the WDivA instruction with wrapping as described above in reference to execution example 49. In the non-wrapping case, predicate gp and predicate p are both 0 at element position one which indicates that element position one of input vector a is not an active element and, therefore, is not selected as the basis for the operation. The first active element is found at element position two where predicate gp is 1. The remaining portion of the execution of the WDivA instruction without wrapping then proceeds as described above in reference to the WDivA instruction with wrapping.

EXAMPLE 50

| Execution of WDivA without wrapping |
|---|
| a = WDivA(gp,a,b,p); |
| On Entry: gp = {0 1 0 1 1 1 1 1} |
| p = {0 0 1 0 1 1 1 1} |
| a = {1023 1022 3 4 5 6 7 1024} |
| b = {2 3 2 3 2 3 2 3} |
| On Exit: a = {1023 1022 1022 1022 1022 511 170 85} |

An embodiment of the WDivB instruction is illustrated in code example 51. The illustrated embodiment functions in a similar fashion to the WDivA instruction described above in reference to code example 48. In the case of the WDivB instruction, the quotient operation is performed before the intermediate value s is stored in destination vector r.

EXAMPLE 51

| Program code WDivB |
|---|

```
Vec WDivB(PredV gp, Vec src1, Vec src2, PredV p)
{
  Vector r;
  int x;
  Scalar<F/U><32/64> s;
  s = src1.v[VECLEN-1];
  for(x=0;x<VECLEN;++x)
  {
    if(gp.v[x])
      break;
    r.v[x] = src1.v[x];
    s = src1.v[x];
  }
  for(; x<VECLEN; ++x)
  {
    if(gp.v[x] && p.v[x])
      s = s / src2.v[x];
    r.v[x] = s;
  }
  return(r);
}
```

An example of the WDivB instruction with wrapping is shown in execution example 52. The execution of the WDivB instruction with wrapping is similar to the execution of the WDivA instruction with wrapping as described above in reference to execution example 49. In the case of the B variant of the WDiv instruction, the quotient operation is performed before the intermediate value s is copied into destination vector r.

EXAMPLE 52

| Execution of WDivB with wrapping |
|---|
| a = WDivB(gp,a,b,p); |
| On Entry: gp = {1 1 0 1 1 1 0 0} |
| p = {1 1 0 0 1 1 1 0} |
| a = {1023 1022 3 4 5 6 7 1024} |
| b = {2 3 2 3 2 3 2 3} |
| On Exit: a = {512 170 170 170 85 28 28 28} |

An example of the WDivB instruction without wrapping is shown in execution example 53. The execution of the WDivB instruction without wrapping is similar to the execution of the WDivB with wrapping as described above in reference to execution example 52. In the non-wrapping case, predicate gp and predicate p are both 0 at element position one which indicates that element position one of input vector a is not an active element and, therefore, the last element of input vector a is not selected as the basis for the operation. The first active element is found at element position two where predicate gp is 1. The remaining portion of the execution of the WDivB instruction without wrapping then proceeds as described above in reference to the WDivB instruction with wrapping.

EXAMPLE 53

| Execution of WDivB without wrapping |
|---|
| a = WDivB(gp,a,b,p); |
| On Entry: gp = {0 1 0 1 1 1 1 1} |
| p = {0 0 1 0 1 1 1 1} |
| a = {1023 1022 3 4 5 6 7 1024} |
| b = {2 3 2 3 2 3 2 3} |
| On Exit: a = {1023 1023 1023 1023 511 170 85 28} |

Figure 12:
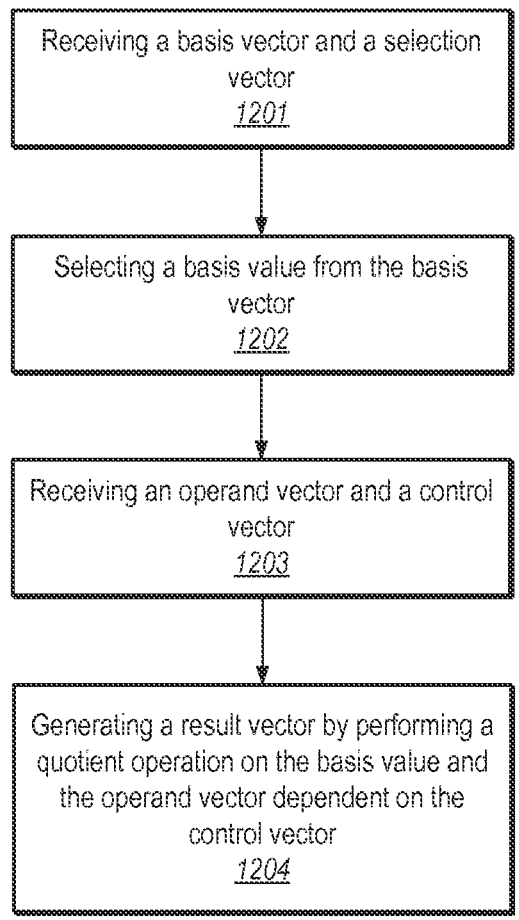
FIG. 12 is a flow diagram depicting the operation of one embodiment of the processor of FIG. 2 during execution of program instructions that implement a wrapping quotient operation.

In FIG. 12, a flow diagram depicting the operation of one embodiment of the processor of FIG. 2 during execution of program instructions that implement a wrapping quotient operation is shown. Referring collectively to FIG. 2 and Examples 42-53, and beginning in block 1201 of FIG. 12, processor 102 may receive a basis vector (e.g., vector src1 of code example 51) and a selection vector (e.g., vector gp of code example 51). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1202). For example, as described above in reference to the WDivB instruction, the element preceding the first active element of the basis vector is selected as the basis value unless the first active element is in the first element position. In some embodiments, when the first active element is in the first element position, the basis value may be selected from the last element position of the basis vector.

Processor 102 may also receive an operand vector and a control vector, such as, e.g., vectors src2 and p of code example 51 (block 1203). As described above, processor 102 may receive the operand vector from L1 cache 104, L2 cache 106, memory 108, or mass storage device 110. As noted previously, the operand vector and/or control vector may be received concurrently with other inputs to instruction execution (e.g., the basis and selection vectors) or in any other suitable order.

A result vector (e.g., vector r of code example 51) may then be generated by performing a quotient operation using the basis value and the operand vector dependent upon the control vector (block 1204). In some embodiments, the quotient operation may be arithmetic division, although other types of quotient operations (e.g., modulo arithmetic) are possible and contemplated. In some embodiments, the quotient operation may also depend on the selection vector (e.g., vector gp of code example 51). It is noted that the flow diagram depicted in FIG. 12 is merely an example and that additional operations and different orders of operations are possible and contemplated.

Running Maximum

In some embodiments, conditional recurrent maxima operations may be implemented using instructions in the Macroscalar architecture. More particularly, as described further below, running maximum (RunMax) may be implemented.

The RunMax instruction operates by conditionally performing the specified recurrent maxima operation on elements of a vector in ascending order, corresponding to a series of iterations of a scalar version of the operation. As with previously described instructions, the RunMax instruction may have the A and B variants. The variants are:

Vec RunMaxA(PredV gp, Vec src1, Vec src2, PredV p)
    Vec RunMaxB(PredV gp, Vec src1, Vec src2, PredV p)

One embodiment of a RunMaxA instruction is shown in code example 54. In this embodiment, using a first selected active element from input vector src1 as a basis, the RunMaxA instruction calculates cumulative maxima using the basis and active elements from input vector src2. It is noted that code example 54 depicts the various element positions of the input vectors being processed in a sequential fashion, in other embodiments, the element positions may be processed in parallel.

EXAMPLE 54

---
Program code RunMaxA
---

```
Vec RunMaxA(PredV gp, Vec src1, Vec src2, PredV p)
{
  Vector r;
  int x;
  Scalar<F/U><32/64> s;
  for(x=0;x<VECLEN;++x)
  {
    if(gp.v[x] && p.v[x])
    {
      s = src1.v[x];
      break;
    }
    else if(gp.v[x])
      r.v[x] = src1.v[x];
    else
      r.v[x] = <Z/M>;
  }
  for(; x<VECLEN; ++x)
  {
    if(gp.v[x])
      r.v[x] = s;
    else
      r.v[x] = <Z/M>;
    if(gp.v[x] && p.v[x])
      s = MAX(s,src2.v[x]);
  }
  return(r);
}
```

An example of the RunMaxA instruction operating with predication is shown in execution example 55. Portions of the execution of the RunMaxA instruction, such as, e.g., the selection of the basis, are similar as described above in reference to execution example 7 of the RunSumA instruction. In the case of the RunMaxA instruction, however, the operation performed is a maxima operation using the basis and active elements of input vector b, as opposed to arithmetic addition. For example, at element position six, intermediate value s (2) is compared to the value of input vector b at element position six (6), resulting in a value of 6 (the maximum of the two values) being stored in intermediate value s. The updated intermediate value s may then be copied into destination vector r when element position seven is processed.

EXAMPLE 55

---
Execution of RunMaxA with predication
---

```
a = RunMaxAM(gp,a,b,p);
On Entry:  gp = {0 0 1 1 0 1 1 1}
            p = {1 0 1 0 1 1 1 0}
            a = {6 7 2 3 4 5 6 7}
            b = {8 9 1 4 5 6 7 8}
On Exit:    a = {6 7 2 2 4 2 6 7}
```

An example of the RunMaxA instruction operating with zeroing is shown in execution example 56. The execution with zeroing is similar to the execution with predication as described above in reference to execution example 55. When functioning in zeroing mode, however, the RunMaxA instruction copies a zero into the element position of destination vector r corresponding to element positions of predicate gp that contain a 0 value. For example, at element position two of execution example 56, the predicate gp is 0, resulting in a 0 being stored in element position two of destination vector r.

EXAMPLE 56

---
Execution of RunMaxA with zeroing
---

```
a = RunMaxAZ(gp,a,b,p);
On Entry:  gp = {0 0 1 1 0 1 1 1}
            p = {1 0 1 0 1 1 1 0}
            a = {6 7 2 3 4 5 6 7}
            b = {8 9 1 4 5 6 7 8}
On Exit:    a = {0 0 2 2 0 2 6 7}
```

An embodiment of the RunMaxB instruction is illustrated in code example 57. The illustrated embodiment functions in a similar fashion to the RunMaxA instruction described above in reference to code example 54. In the case of the RunMaxB instruction, the maxima operation is performed before the intermediate value s is stored in destination vector r.

EXAMPLE 57

---
Program code RunMaxB
---

```
Vec RunMaxB(PredV gp, Vec src1, Vec src2, PredV p)
{
  Vector r;
  int x;
  Scalar<F/U><32/64> s;
  for(x=0;x<VECLEN;++x)
  {
```

-continued

Program code RunMaxB

```
    if(gp.v[x] && p.v[x])
    {
        s = src1.v[x];
        break;
    }
    else if(gp.v[x])
        r.v[x] = src1.v[x];
    else
        r.v[x] = <Z/M>;
    }
    for(; x<VECLEN; ++x)
    {
        if(gp.v[x] && p.v[x])
            s = MAX(s,src2.v[x]);
        if(gp.v[x])
            r.v[x] = s;
        else
            r.v[x] = <Z/M>;
    }
    return r;
}
```

An example of the RunMaxB instruction with predication is shown in execution example 58. The execution of the RunMaxB instruction with predication is similar to the execution of the RunMaxA instruction with predication as described above in reference to execution example 55. In the case of the B variant of the RunMax instruction, the maxima operation is performed before the intermediate value s is copied into destination vector r.

EXAMPLE 58

Execution of RunMaxB with predication

```
a = RunMaxBM(gp,a,b,p);
On Entry:  gp = {0 0 1 1 0 1 1 1}
           p  = {1 0 1 0 1 1 1 0}
           a  = {6 7 2 3 4 5 6 7}
           b  = {8 9 1 4 5 6 7 8}
On Exit:   a  = {6 7 2 2 4 6 7 7}
```

An example of the RunMaxB instruction with zeroing is shown in execution example 59. The execution of the RunMaxB instruction with zeroing is similar to the execution of the RunMaxB with predication as described above in reference to execution example 58. In the case of executing the RunMaxB instruction with zeroing, when an element of predicate gp is 0, a value of 0 is copied into destination vector r rather than copying the corresponding element from input vector a into destination vector r. For example, in element position two, predicate gp is 0, and a value of 0 is forced into destination vector r at element position two.

EXAMPLE 59

Execution of RunMaxB with zeroing

```
a = RunMaxBM(gp,a,b,p);
On Entry:  gp = {0 0 1 1 0 1 1 1}
           p  = {1 0 1 0 1 1 1 0}
           a  = {6 7 2 3 4 5 6 7}
           b  = {8 9 1 4 5 6 7 8}
On Exit:   a  = {0 0 2 2 0 6 7 7}
```

Wrapping Maximum

In some embodiments, conditional recurrent maxima operations may be performed using the Macroscalar instruction wrapping maximum (WMax). As with the previously described instructions, the WMax instruction may have the A and B variants. The variants are:

Vec WMaxA(PredV gp, Vec src1, Vec src2, PredV p)
Vec WMaxB(PredV gp, Vec src1, Vec src2, PredV p)

One embodiment of a WMaxA instruction is shown in code example 60. In this embodiment, using a first active element from input vector src1 as a basis, the WMaxA instruction calculates cumulative maxima using the basis and active elements from input vector src2. It is noted that code example 60 depicts the various element positions of the input vectors being processed in a sequential fashion, in other embodiments, the element positions may be processed in parallel.

EXAMPLE 60

Program code WMaxA

```
Vec WMaxA(PredV gp, Vec src1, Vec src2, PredV p)
{
    Vector r;
    int x;
    Scalar<F/U><32/64> s;
    s = src1.v[VECLEN-1];
    for(x=0;x<VECLEN;++x)
    {
        if(x)
            s = src1.v[x];
        if(gp.v[x])
            break;
        r.v[x] = src1.v[x];
    }
    for(; x<VECLEN; ++x)
    {
        r.v[x] = s;
        if(gp.v[x] && p.v[x])
            s = MAX(s,src2.v[x]);
    }
    return(r);
}
```

An example of the WMaxA instruction operating with wrapping is shown in execution example 61. Portions of the execution the WMaxA instruction, such as, e.g., the selection of the basis, are similar to portions of the execution of the WAddA instruction as described above in execution example 13. In the case of WMaxA, however, the operation performed is a maxima operation using the basis and active elements of input vector b, as opposed to arithmetic addition.

EXAMPLE 61

Execution of WMaxA with wrapping

```
a = WMaxA(gp,a,b,p);
On Entry:  gp = {1 1 0 1 1 1 0 0}
           p  = {1 1 0 0 1 1 1 0}
           a  = {1 2 3 4 5 6 7 8}
           b  = {9 10 11 12 13 14 15 16}
On Exit:   a  = {8 9 10 10 10 13 14 14}
```

An example of the WMaxA instruction without wrapping is illustrated in execution example 62. The illustrated embodiment operates in a similar fashion to the WMaxA instruction with wrapping as described above in reference to execution example 61. In the non-wrapping case, predicate gp and predicate p are both 0 at element position one which indicates that element position one of input vector a is not an active element and, therefore, is not selected as the basis for the operation. The first active element is found at element position two where predicate gp is 1, resulting in the value of input vector a (2) being selected as the basis. The remaining portion of the execution of the WMaxA instruction without wrapping then proceeds as described above in reference to the WMaxA instruction with wrapping.

EXAMPLE 62

| Execution of WMaxA without wrapping |
| --- |
| a = WMaxA(gp,a,b,p); |
| On Entry: gp = {0 1 0 1 1 1 1 1} |
| p = {0 0 1 0 1 1 1 1} |
| a = {1 2 3 4 5 6 7 8} |
| b = {9 10 11 12 13 14 15 16} |
| On Exit: a = {1 2 2 2 2 13 14 15} |

An embodiment of the WMaxB instruction is illustrated in code example 63. The illustrated embodiment functions in a similar fashion to the WMaxA instruction described above in reference to code example 60. In the case of the WMaxB instruction, the maxima operation is performed before the intermediate value s is stored in destination vector r.

EXAMPLE 63

| Program code WMaxB |
| --- |
| ```
Vec WMaxB(PredV gp, Vec src1, Vec src2, PredV p)
{
    Vector r;
    int x;
    Scalar<F/U><32/64> s;
    s = src1.v[VECLEN-1];
    for(x=0;x<VECLEN;++x)
    {
        if(gp.v[x])
            break;
        r.v[x] = src1.v[x];
        s = src1.v[x];
    }
    for(; x<VECLEN; ++x)
    {
        if(gp.v[x] && p.v[x])
            s = MAX(s,src2.v[x]);
        r.v[x] = s;
    }
    return(r);
}
``` |

An example of the WMaxB instruction with wrapping is shown in execution example 64. The execution of the WMaxB instruction with wrapping is similar to the execution of the WMaxA instruction with wrapping as described above in reference to execution example 61. In the case of the B variant of the WMax instruction, the maxima operation is performed before the intermediate value s is copied into destination vector r.

EXAMPLE 64

| Execution of WMaxB with wrapping |
| --- |
| a = WMaxB(gp,a,b,p); |
| On Entry: gp = {1 1 0 1 1 1 0 0} |
| p = {1 1 0 0 1 1 1 0} |
| a = {1 2 3 4 5 6 7 8} |
| b = {9 10 11 12 13 14 15 16} |
| On Exit: a = {9 10 10 10 13 14 14 14} |

An example of the WMaxB instruction without wrapping is shown in execution example 65. The execution of the WMaxB instruction without wrapping is similar to the execution of the WMaxB with wrapping as described above in reference to execution example 64. In the non-wrapping case, predicate gp and predicate p are both 0 at element position one. The predicate gp is 1 at element position two, resulting in the selection of the value of input vector a (1) at the preceding element position, i.e., element position one, as the basis. The remaining portion of the execution of the WMaxB instruction without wrapping then proceeds as described above in reference to the WMaxB instruction with wrapping.

EXAMPLE 65

| Execution of WMaxB without wrapping |
| --- |
| a = WMaxB(gp,a,b,p); |
| On Entry: gp = {0 1 0 1 1 1 1 1} |
| p = {0 0 1 0 1 1 1 1} |
| a = {1 2 3 4 5 6 7 8} |
| b = {9 10 11 12 13 14 15 16} |
| On Exit: a = {1 1 1 1 13 14 15 16} |

Figure 13:
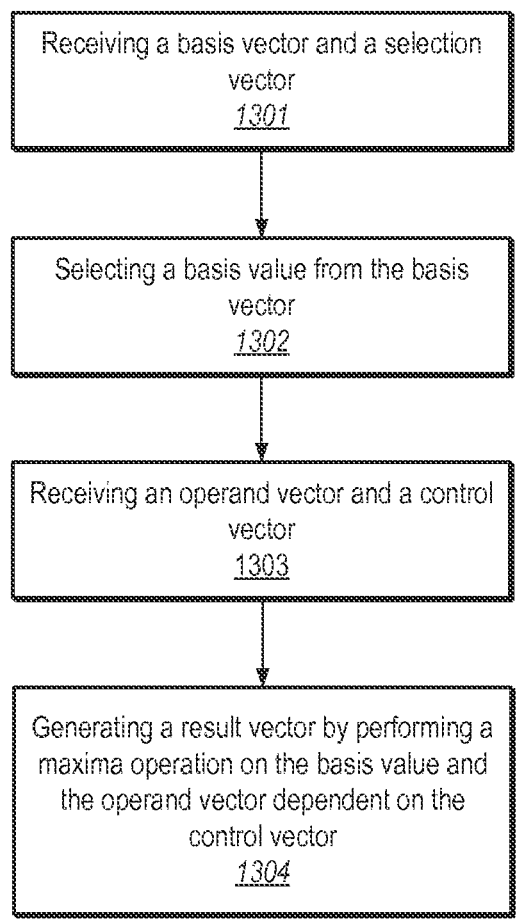
FIG. 13 is a flow diagram depicting the operation of one embodiment of the processor of FIG. 2 during execution of program instructions that implement a wrapping maxima operation.

In FIG. 13, a flow diagram depicting the operation of one embodiment of the processor of FIG. 2 during execution of program instructions that implement a running/wrapping maxima operation is shown. Referring collectively to FIG. 1, FIG. 2 and Examples 54-65, and beginning in block 1301 of FIG. 13, processor 102 receives a basis vector (e.g., vector src1 of code example 63) and a selection vector (e.g., vector gp of code example 63). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1302). For example, as described above in reference to the WMaxB instruction, the element preceding the first active element of the basis vector is selected as the basis value unless the first active element is in the first element position. In some embodiments, when the first active element is in the first element position, the basis value may be selected from the last position of the basis vector.

Processor 102 may also receive an operand vector and a control vector, such as, e.g., vectors src2 and p of code example 63 (block 1303). As described above, processor 102 may receive the operand vector from L1 cache 104, L2 cache 106, memory 108, or mass storage device 110. As noted previously, the operand vector and/or control vector may be received concurrently with other inputs to instruction execution (e.g., the basis and selection vectors) or in any other suitable order.

A result vector (e.g., vector r of code example 63) may then be generated by performing a maxima operation using the basis value and the operand vector dependent upon the control vector (block 1304). In some embodiments, the maxima operation may involve determining an arithmetically maximal value, although any suitable criterion for identifying an extremum according to an ordering may be employed. In some embodiments, the maxima operation may also depend on the selection vector (e.g., vector gp of code example 63). It is noted that the flow diagram depicted in FIG. 13 is merely an example and that additional operations and different orders of operations are possible and contemplated.

Running Minimum

In some embodiments, conditional recurrent minima operations may be implemented using instructions in the Macroscalar architecture. More particularly, as described further below, running minimum (RunMin) may be implemented.

The RunMin instruction operates by conditionally performing the specified recurrent minima operation on elements of a vector in ascending order, corresponding to a series of iterations of a scalar version of the operation. As with previously described instructions, the RunMin instruction may have the A and B variants. The variants are:

Vec RunMinA(PredV gp, Vec src1, Vec src2, PredV p)
Vec RunMinB(PredV gp, Vec src1, Vec src2, PredV p)

One embodiment of a RunMinA instruction is shown in code example 66. In this embodiment, using a first selected active element from input vector src1 as a basis, the RunMinA instruction calculates cumulative minima using the basis and active elements from input vector src2. It is noted that code example 66 depicts the various element positions of the input vectors being processed in a sequential fashion, in other embodiments, the element positions may be processed in parallel.

EXAMPLE 66

| Program code RunMinA |
|---|
| Vec RunMinA(PredV gp, Vec src1, Vec src2, PredV p) <br> { <br>   Vector r; <br>   int x; <br>   Scalar<F/U><32/64> s; <br>   for(x=0;x<VECLEN;++x) <br>   { <br>     if(gp.v[x] && p.v[x]) <br>     { <br>       s = src1.v[x]; <br>       break; <br>     } <br>     else if(gp.v[x]) <br>       r.v[x] = src1.v[x]; <br>     else <br>       r.v[x] = <Z/M>; <br>   } <br>   for(; x<VECLEN; ++x) <br>   { <br>     if(gp.v[x]) <br>       r.v[x] = s; <br>     else <br>       r.v[x] = <Z/M>; <br>     if(gp.v[x] && p.v[x]) |

-continued

| Program code RunMinA |
|---|
|       s = MIN(s,src2.v[x]); <br>   } <br>   return(r); <br> } |

An example of the RunMinA instruction operating with predication is shown in execution example 67. Portions of the execution of the RunMinA instruction, such as, e.g., the selection of the basis, are similar as described above in reference to execution example 7 of the RunSumA instruction. In the case of the RunMinA instruction, however, the operation performed is a minima operation using the basis and active elements of input vector b, as opposed to arithmetic addition. For example, at element position six, intermediate value s (4) is compared to the value of input vector b at element position six (5), resulting in a value of 4 (the minimum of the two values) being stored in intermediate value s. The updated intermediate value s may then be copied into destination vector r when element position seven is processed.

EXAMPLE 67

| Execution of RunMinA with predication | | | | | | | | |
|---|---|---|---|---|---|---|---|---|
| a = RunMinAM(gp,a,b,p); | | | | | | | | |
| On Entry: | gp = | {0 | 0 | 1 | 1 | 0 | 1 | 1 | 1} |
| | p = | {1 | 0 | 1 | 0 | 0 | 1 | 1 | 0} |
| | a = | {0 | 1 | D | C | B | A | 9 | 8} |
| | b = | {2 | 3 | 4 | 5 | 2 | 5 | 3 | 1} |
| On Exit: | a = | {0 | 1 | D | 4 | B | 4 | 4 | 3} |

An example of the RunMinA instruction operating with zeroing is shown in execution example 68. The execution with zeroing is similar to the execution with predication as described above in reference to execution example 67. When functioning in zeroing mode, however, the RunMinA instruction copies a zero into the element position of destination vector r corresponding to element positions of predicate gp that contain a 0 value. For example, at element position two of execution example 68, the predicate gp is 0, resulting in a 0 being stored in element position two of destination vector r.

EXAMPLE 68

| Execution of RunMinA with zeroing | | | | | | | | |
|---|---|---|---|---|---|---|---|---|
| a = RunMinAZ(gp,a,b,p); | | | | | | | | |
| On Entry: | gp = | {0 | 0 | 1 | 1 | 0 | 1 | 1 | 1} |
| | p = | {1 | 0 | 1 | 0 | 0 | 1 | 1 | 0} |
| | a = | {0 | 1 | D | C | B | A | 9 | 8} |
| | b = | {2 | 3 | 4 | 5 | 2 | 5 | 3 | 1} |
| On Exit: | a = | {0 | 0 | D | 4 | 0 | 4 | 4 | 3} |

An embodiment of the RunMinB instruction is illustrated in code example 69. The illustrated embodiment functions in a similar fashion to the RunMinA instruction described above in reference to code example 66. In the case of the RunMinB instruction, the minima operation is performed before the intermediate value s is stored in destination vector r.

EXAMPLE 69

---
Program code RunMinB
---

```
Vec RunMinB(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x] && p.v[x])
            s = MIN(s,src2.v[x]);
        if(gp.v[x])
            r.v[x] = s;
        else
            r.v[x] = <Z/M>;
    }
    return r;
}
```

An example of the RunMinB instruction with predication is shown in execution example 70. The execution of the RunMinB instruction with predication is similar to the execution of the RunMinA instruction with predication as described above in reference to execution example 67. In the case of the B variant of the RunMin instruction, the minima operation is performed before the intermediate value s is copied into destination vector r.

EXAMPLE 70

---
Execution of RunMinB with predication
---

```
a = RunMinBM(gp,a,b,p);
On Entry:  gp = {0  0  1  1  0  1  1  1}
           p  = {1  0  1  0  0  1  1  0}
           a  = {0  1  D  C  B  A  9  8}
           b  = {2  3  4  5  2  5  3  1}
On Exit:   a  = {0  1  4  4  B  4  3  3}
```

An example of the RunMinB instruction with zeroing is shown in execution example 71. The execution of the RunMinB instruction with zeroing is similar to the execution of the RunMinB with predication as described above in reference to execution example 70. In the case of executing the RunMinB instruction with zeroing, when an element of predicate gp is 0, a value of 0 is copied into destination vector r rather than copying the corresponding element from input vector a into destination vector r. For example, in element position two, predicate gp is 0, and a value of 0 is forced into destination vector r at element position two.

EXAMPLE 71

---
Execution of RunMinB with zeroing
---

```
a = RunMinBM(gp,a,b,p);
On Entry:  gp = {0  0  1  1  0  1  1  1}
           p  = {1  0  1  0  0  1  1  0}
           a  = {0  1  D  C  B  A  9  8}
           b  = {2  3  4  5  2  5  3  1}
On Exit:   a  = {0  0  4  4  0  4  3  3}
```

Wrapping Minimum

In some embodiments, conditional recurrent minima operations may be performed using the Macroscalar instruction wrapping minimum (WMin). As with the previously described instructions, the WMin instruction may have the A and B variants. The variants are:

Vec WMinA(PredV gp, Vec src1, Vec src2, PredV p)

Vec WMinB(PredV gp, Vec src1, Vec src2, PredV p)

One embodiment of a WMinA instruction is shown in code example 72. In this embodiment, using a first active element from input vector src1 as a basis, the WMinA instruction calculates cumulative minima using the basis and active elements from input vector src2. It is noted that code example 72 depicts the various element positions of the input vectors being processed in a sequential fashion, in other embodiments, the element positions may be processed in parallel.

EXAMPLE 72

---
Program code WMinA
---

```
Vec WMinA(PredV gp, Vec src1, Vec src2, PredV p)
{
    Vector r;
    int x;
    Scalar<F/U><32/64> s;
    s = src1.v[VECLEN-1];
    for(x=0;x<VECLEN;++x)
    {
        if(x)
            s = src1.v[x];
        if(gp.v[x])
            break;
        r.v[x] = src1.v[x];
    }
    for(; x<VECLEN; ++x)
    {
        r.v[x] = s;
        if(gp.v[x] && p.v[x])
            s = MIN(s,src2.v[x]);
    }
    return(r);
}
```

An example of the WMinA instruction operating with wrapping is shown in execution example 73. Portions of the execution of the WMinA instruction, such as, e.g., the selection of the basis, are similar to portions of the execution of the WAddA instruction as described above in execution example 13. In the case of WMinA, however, the operation performed is a minima operation using the basis and active elements of input vector b, as opposed to arithmetic addition.

EXAMPLE 73

| Execution of WMinA with wrapping |
| --- |
| a = WMinA(gp,a,b,p);<br>On Entry: gp = {1 1 0 1 1 1 0 0}<br>           p  = {1 1 0 0 1 1 1 0}<br>           a  = {9 10 11 12 13 14 15 16}<br>           b  = {8 7 6 5 4 3 2 1}<br>On Exit:   a  = {16 8 7 7 7 4 3 3} |

An example of the WMinA instruction without wrapping is illustrated in execution example 74. The illustrated embodiment operates in a similar fashion to the WMinA instruction with wrapping as described above in reference to execution example 73. In the non-wrapping case, predicate gp and predicate p are both 0 at element position one which indicates that element position one of input vector a is not an active element and, therefore, is not selected as the basis for the operation. The first active element is found at element position two where predicate gp is 1, resulting in the value of input vector a (10) being selected as the basis. The remaining portion of the execution of the WMinA instruction without wrapping then proceeds as described above in reference to the WMinA instruction with wrapping.

EXAMPLE 74

| Execution of WMinA without wrapping |
| --- |
| a = WMinA(gp,a,b,p);<br>On Entry: gp = {0 1 0 1 1 1 1 1}<br>           p  = {0 0 1 0 1 1 1 1}<br>           a  = {9 10 11 12 13 14 15 16}<br>           b  = {8 7 6 5 4 3 2 1}<br>On Exit:   a  = {9 10 10 10 10 4 3 2} |

An embodiment of the WMinB instruction is illustrated in code example 75. The illustrated embodiment functions in a similar fashion to the WMinA instruction described above in reference to code example 72. In the case of the WMinB instruction, the minima operation is performed before the intermediate value s is stored in destination vector r.

EXAMPLE 75

| Program code WMinB |
| --- |
| Vec WMinB(PredV gp, Vec src1, Vec src2, PredV p)<br>{<br>   Vector r;<br>   int x;<br>   Scalar<F/U><32/64> s;<br>   s = src1.v[VECLEN−1];<br>   for(x=0;x<VECLEN;++x)<br>   {<br>      if(gp.v[x])<br>         break;<br>      r.v[x] = src1.v[x];<br>      s = src1.v[x]; |

| Program code WMinB<br>-continued |
| --- |
| }<br>for(; x<VECLEN; ++x)<br>{<br>   if(gp.v[x] && p.v[x])<br>      s = MIN(s,src2.v[x]);<br>   r.v[x] = s;<br>}<br>return(r);<br>} |

An example of the WMinB instruction with wrapping is shown in execution example 76. The execution of the WMinB instruction with wrapping is similar to the execution of the WMinA instruction with wrapping as described above in reference to execution example 73. In the case of the B variant of the WMin instruction, the minima operation is performed before the intermediate value s is copied into destination vector r.

EXAMPLE 76

| Execution of WMinB with wrapping |
| --- |
| a = WMinB(gp,a,b,p);<br>On Entry: gp = {1 1 0 1 1 1 0 0}<br>           p  = {1 1 0 0 1 1 1 0}<br>           a  = {9 10 11 12 13 14 15 16}<br>           b  = {8 7 6 5 4 3 2 1}<br>On Exit:   a  = {8 7 7 7 4 3 3 3} |

An example of the WMinB instruction without wrapping is shown in execution example 77. The execution of the WMinB instruction without wrapping is similar to the execution of the WMinB with wrapping as described above in reference to execution example 76. In the non-wrapping case, predicate gp and predicate p are both 0 at element position one. The predicate gp is 1 at element position two, resulting in the selection of the value of input vector a (9) at the preceding element position, i.e., element position one, as the basis. The remaining portion of the execution of the WMinB instruction without wrapping then proceeds as described above in reference to the WMinB instruction with wrapping.

EXAMPLE 77

| Execution of WMinB without wrapping |
| --- |
| a = WMinB(gp,a,b,p);<br>On Entry: gp = {0 1 0 1 1 1 1 1}<br>           p  = {0 0 1 0 1 1 1 1}<br>           a  = {9 10 11 12 13 14 15 16}<br>           b  = {8 7 6 5 4 3 2 1}<br>On Exit:   a  = {9 9 9 9 4 3 2 1} |

Figure 14:
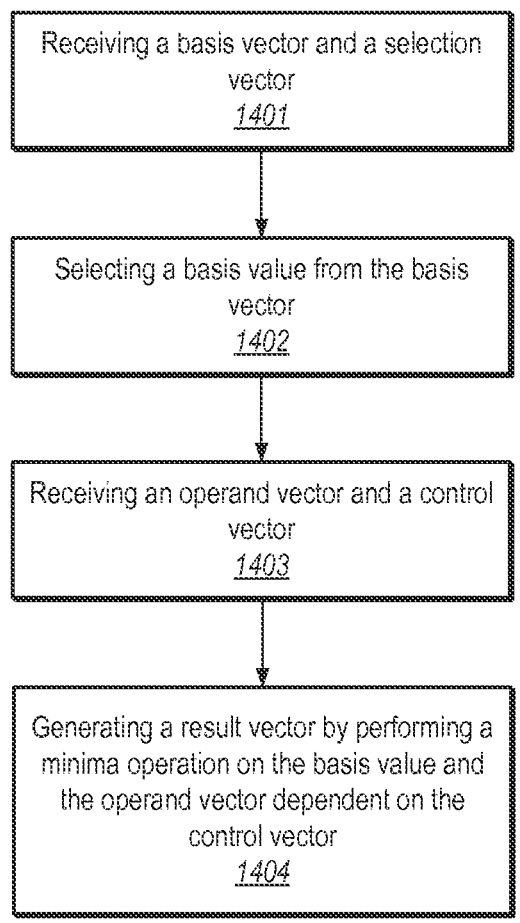
FIG. 14 is a flow diagram depicting the operation of one embodiment of the processor of FIG. 2 during execution of program instructions that implement a wrapping minima operation.

In FIG. 14, a flow diagram depicting the operation of one embodiment of the processor of FIG. 2 during execution of program instructions that implement a running/wrapping minima operation is shown. Referring collectively to FIG. 1, FIG. 2 and Examples 66-77, and beginning in block 1401 of FIG. 14, processor 102 may receive a basis vector (e.g., vector src1 of code example 75) and a selection vector (e.g., vector gp of code example 75). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1402). For example, as described above in reference to the WMinB instruction, the element preceding the first active element of the basis vector is selected as the basis value unless the first active element is in the first element position. In some embodiments, when the first active element is in the first element position, the basis value may be selected from the last element position of the basis vector.

Processor 102 may also receive an operand vector and a control vector, such as, e.g., vectors src2 and p of code example 75 (block 1403). As described above, processor 102 may receive the operand vector from L1 cache 104, L2 cache 106, memory 108, or mass storage device 110. As noted previously, the operand vector and/or control vector may be received concurrently with other inputs to instruction execution (e.g., the basis and selection vectors) or in any other suitable order.

A result vector (e.g., vector r of code example 75) may then be generated by performing a minima operation using the basis value and the operand vector dependent upon the control vector (block 1404). In some embodiments, the minima operation may involve determining an arithmetically minimal value, although any suitable criterion for identifying an extremum according to an ordering may be employed. In some embodiments, the minima operation may also depend on the selection vector (e.g., vector gp of code example 75). It is noted that the flow diagram depicted in FIG. 14 is merely an example and that additional operations and different orders of operations are possible and contemplated.

Running and Wrapping Shift Operations

The following shift left and shift right operations may be referred to collectively as shift operations. As in previous descriptions, each running shift operation is described first, followed by the corresponding wrapping shift operation.

Running Shift Left

In some embodiments, conditional recurrent shift operations may be implemented using instructions in the Macroscalar architecture. More particularly, as described further below, running shift left (RunShl) may be implemented.

The RunShl instruction operates by conditionally performing the specified recurrent shift left operation on elements of a vector in ascending order, corresponding to a series of iterations of a scalar version of the operation. As with previously described instructions, the RunShl instruction may have the A and B variants. The variants are:

Vec RunShlA(PredV gp, Vec src1, Vec src2, PredV p)

Vec RunShlB(PredV gp, Vec src1, Vec src2, PredV p)

One embodiment of a RunShlA instruction is shown in code example 78. In this embodiment, using a first selected active element from input vector src1 as a basis, the RunShlA performs a left shift on the basis by the cumulative number of bits specified by active elements from input vector src2. It is noted that code example 78 depicts the various element positions of the input vectors being processed in a sequential fashion, in other embodiments, the element positions may be processed in parallel.

EXAMPLE 78

| Program code RunShlA |
|---|
| Vec RunShlA(PredV gp, Vec src1, Vec src2, PredV p)<br>{<br>  Vector r;<br>  int x;<br>  Scalar<F/U><32/64> s;<br>  for(x=0;x<VECLEN;++x)<br>  {<br>    if(gp.v[x] && p.v[x])<br>    {<br>      s = src1.v[x];<br>      break;<br>    }<br>    else if(gp.v[x])<br>      r.v[x] = src1.v[x];<br>    else<br>      r.v[x] = <Z/M>;<br>  }<br>  for(; x<VECLEN; ++x)<br>  {<br>    if(gp.v[x])<br>      r.v[x] = s;<br>    else<br>      r.v[x] = <Z/M>;<br>    if(gp.v[x] && p.v[x])<br>      s = s << src2.v[x];<br>  }<br>  return(r);<br>} |

An example of the RunShlA instruction operating with predication is shown in execution example 79. Portions of the execution of the RunShlA instruction, such as, e.g., the selection of the basis, are similar as described above in reference to execution example 7 of the RunSumA instruction. In the case of the RunShlA instruction, however, the operation performed is shift left by the number of bits specified by the active elements of input vector b, as opposed to arithmetic addition. For example, at element position six, intermediate value s (0x4) is shifted left by the number of bits specified by the value of input vector b at element position six (2), resulting in a value of 0x10 (decimal value 16) being stored in intermediate value s. The updated intermediate value s may then be copied into destination vector r when element position seven is processed.

EXAMPLE 79

| Execution of RunShlA with predication |
|---|
| a = RunShlAM(gp,a,b,p);<br>On Entry:  gp =  {1 1 1 1 1 1 1 0}<br>                 p =   {0 1 1 0 0 1 1 0}<br>                 a =   {0 1 2 3 4 5 6 7}<br>                 b =   {0 1 1 1 2 2 2 3}<br>On Exit:    a =   {0 1 2 4 4 4 16 7} |

An example of the RunShlA instruction operating with zeroing is shown in execution example 80. The execution with zeroing is similar to the execution with predication as described above in reference to execution example 79. When functioning in zeroing mode, however, the RunShlA instruction copies a zero into the element position of destination vector r corresponding to element positions of predicate gp that contain a 0 value. For example, at element position eight of execution example 80, the predicate gp is 0, resulting in a 0 being stored in element position eight of destination vector r.

EXAMPLE 80

| Execution of RunShlA with zeroing |
|---|
| a = RunShlAZ(gp,a,b,p); |
| On Entry: gp = {1 1 1 1 1 1 1 0} |
| p = {0 1 1 0 0 1 1 0} |
| a = {0 1 2 3 4 5 6 7} |
| b = {0 1 1 1 2 2 2 3} |
| On Exit: a = {0 1 2 4 4 4 16 0} |

An embodiment of the RunShlB instruction is illustrated in code example 81. The illustrated embodiment functions in a similar fashion to the RunShlA instruction described above in reference to code example 78. In the case of the RunShlB instruction, the shift operation is performed before the intermediate value s is stored in destination vector r.

EXAMPLE 81

| Program code RunShlB |
|---|
| Vec RunShlB(PredV gp, Vec src1, Vec src2, PredV p)<br>{<br>  Vector r;<br>  int x;<br>  Scalar<F/U><32/64> s;<br>  for(x=0;x<VECLEN;++x)<br>  {<br>    if(gp.v[x] && p.v[x])<br>    {<br>      s = src1.v[x];<br>      break;<br>    }<br>    else if(gp.v[x])<br>      r.v[x] = src1.v[x];<br>    else<br>      r.v[x] = <Z/M>;<br>  }<br>  for(; x<VECLEN; ++x)<br>  {<br>  if(gp.v[x] && p.v[x])<br>    s = s << src2.v[x];<br>    if(gp.v[x])<br>      r.v[x] = s;<br>    else<br>      r.v[x] = <Z/M>;<br>  }<br>  return r;<br>} |

An example of the RunShlB instruction with predication is shown in execution example 82. The execution of the RunShlB instruction with predication is similar to the execution of the RunShlA instruction with predication as described above in reference to execution example 79. In the case of the B variant of the RunShl instruction, the shift operation is performed before the intermediate value s is copied into destination vector r.

EXAMPLE 82

| Execution of RunShlB with predication |
|---|
| a = RunShlBM(gp,a,b,p); |
| On Entry: gp = {1 1 1 1 1 1 1 0} |
| p = {0 1 1 0 1 1 1 0} |
| a = {0 1 2 3 4 5 6 7} |
| b = {0 1 1 1 2 2 2 3} |
| On Exit: a = {0 2 4 4 16 64 256 7} |

An example of the RunShlB instruction with zeroing is shown in execution example 83. The execution of the RunShlB instruction with zeroing is similar to the execution of the RunShlB with predication as described above in reference to execution example 82. In the case of executing the RunShlB instruction with zeroing, when an element of predicate gp is 0, a value of 0 is copied into destination vector r rather than copying the corresponding element from input vector a into destination vector r. For example, in element position eight, predicate gp is 0, and a value of 0 is forced into destination vector r at element position eight.

EXAMPLE 83

| Execution of RunShlB with zeroing |
|---|
| a = RunShlBM(gp,a,b,p); |
| On Entry: gp = {1 1 1 1 1 1 1 0} |
| p = {0 1 1 0 1 1 1 0} |
| a = {0 1 2 3 4 5 6 7} |
| b = {0 1 1 1 2 2 2 3} |
| On Exit: a = {0 2 4 4 16 64 256 0} |

Wrapping Shift Left

In some embodiments, conditional recurrent shift operations may be performed using the Macroscalar instruction wrapping multiply (WShl). As with the previously described instructions, the WShl instruction may have the A and B variants. The variants are:

Vec WShlA(PredV gp, Vec src1, Vec src2, PredV p)
Vec WShlB(PredV gp, Vec src1, Vec src2, PredV p)

One embodiment of a WShlA instruction is shown in code example 84. In this embodiment, using a first active element from input vector src1 as a basis, the WShlA instruction performs a left shift on the basis by the cumulative number of bits specified by active elements from input vector src2. It is noted that code example 84 depicts the various element positions of the input vectors being processed in a sequential fashion, in other embodiments, the element positions may be processed in parallel.

EXAMPLE 84

| Program code WShlA |
|---|
| Vec WShlA(PredV gp, Vec src1, Vec src2, PredV p)<br>{<br>  Vector r;<br>  int x;<br>  Scalar<F/U><32/64> s;<br>  s = src1.v[VECLEN−1];<br>  for(x=0;x<VECLEN;++x)<br>  {<br>    if(x)<br>      s = src1.v[x];<br>    if(gp.v[x])<br>      break;<br>    r.v[x] = src1.v[x];<br>  }<br>  for(; x<VECLEN; ++x)<br>  {<br>    r.v[x] = s;<br>    if(gp.v[x] && p.v[x])<br>      s = s << src2.v[x];<br>  }<br>  return(r);<br>} |

An example of the WShlA instruction operating with wrapping is shown in execution example 85. Portions of the execution of the WShlA instruction, such as, e.g., the selection of the basis, are similar to portions of the execution of the WAddA instruction as described above in execution example 13. In the case of WShlA, however, the operation performed is shift left by the number of bits specified by the active elements of input vector b, as opposed to arithmetic addition.

EXAMPLE 85

| Execution of WShlA with wrapping |
|---|
| a = WShlA(gp,a,b,p);<br>On Entry:  gp = {1 1 0 1 1 1 0 0}<br>             p  = {1 1 0 0 1 1 1 0}<br>             a  = {1 2 3 4 5 6 7 8}<br>             b  = {2 3 2 3 2 3 2 3}<br>On Exit:   a  = {8 32 256 256 256 1024 8192 8192} |

An example of the WShlA instruction without wrapping is illustrated in execution example 86. The illustrated embodiment operates in a similar fashion to the WShlA instruction with wrapping as described above in reference to execution example 85. In the non-wrapping case, predicate gp and predicate p are both 0 at element position one which indicates that element position one of input vector a is not an active element and, therefore, is not selected as the basis for the operation. The first active element is found at element position two where predicate gp is 1, resulting in the value of input vector a (2) being selected as the basis. The remaining portion of the execution of the WShlA instruction without wrapping then proceeds as described above in reference to the WShlA instruction with wrapping.

EXAMPLE 86

| Execution of WShlA without wrapping |
|---|
| a = WShlA(gp,a,b,p);<br>On Entry:  gp = {0 1 0 1 1 1 1 1}<br>             p  = {0 0 1 0 1 1 1 1}<br>             a  = {1 2 3 4 5 6 7 8}<br>             b  = {2 3 2 3 2 3 2 3}<br>On Exit:   a  = {1 2 2 2 2 8 64 256} |

An embodiment of the WShlB instruction is illustrated in code example 87. The illustrated embodiment functions in a similar fashion to the WShlA instruction described above in reference to code example 84. In the case of the WShlB instruction, the shift operation is performed before the intermediate value s is stored in destination vector r.

EXAMPLE 87

| Program code WShlB |
|---|
| Vec WShlB(PredV gp, Vec src1, Vec src2, PredV p)<br>{<br>  Vector r;<br>  int x;<br>  Scalar<F/U><32/64> s;<br>  s = src1.v[VECLEN−1];<br>  for(x=0;x<VECLEN;++x)<br>  {<br>    if(gp.v[x])<br>      break;<br>    r.v[x] = src1.v[x];<br>    s = src1.v[x];<br>  }<br>  for(; x<VECLEN; ++x)<br>  {<br>    if(gp.v[x] && p.v[x])<br>      s = s << src2.v[x];<br>    r.v[x] = s;<br>  }<br>  return(r);<br>} |

An example of the WShlB instruction with wrapping is shown in execution example 88. The execution of the WShlB instruction with wrapping is similar to the execution of the WShlA instruction with wrapping as described above in reference to execution example 85. In the case of the B variant of the WShl instruction, the shift left operation is performed before the intermediate value s is copied into destination vector r.

EXAMPLE 88

| Execution of WShlB with wrapping |
|---|
| a = WShlB(gp,a,b,p);<br>On Entry:  gp = {1 1 0 1 1 1 0 0}<br>             p  = {1 1 0 0 1 1 1 0} |

| Execution of WShlB with wrapping |
|---|
| a = {1 2 3 4 5 6 7 8} |
| b = {2 3 2 3 2 3 2 3} |
| On Exit: a = {32 256 256 256 1024 8192 8192 8192} |

An example of the WShlB instruction without wrapping is shown in execution example 89. The execution of the WShlB instruction without wrapping is similar to the execution of the WShlB with wrapping as described above in reference to execution example 88. In the non-wrapping case, predicate gp and predicate p are both 0 at element position one. The predicate gp is 1 at element position two, resulting in the selection of the value of input vector a (1) at the preceding element position, i.e., element position one, as the basis. The remaining portion of the execution of the WShlB instruction without wrapping then proceeds as described above in reference to the WShlB instruction with wrapping.

EXAMPLE 89

| Execution of WShlB without wrapping |
|---|
| a = WShlB(gp,a,b,p); |
| On Entry: gp = {0 1 0 1 1 1 1 1} |
| p = {0 0 1 0 1 1 1 1} |
| a = {1 2 3 4 5 6 7 8} |
| b = {2 3 2 3 2 3 2 3} |
| On Exit: a = {1 1 1 1 4 32 128 1024} |

Running Shift Right

In some embodiments, conditional recurrent shift operations may be implemented using instructions in the Macroscalar architecture. More particularly, as described further below, running shift right (RunShr) may be implemented.

The RunShr instruction operates by conditionally performing the specified recurrent shift right operation on elements of a vector in ascending order, corresponding to a series of iterations of a scalar version of the operation. As with previously described instructions, the RunShr instruction may have the A and B variants. The variants are:

Vec RunShrA(PredV gp, Vec src1, Vec src2, PredV p)
Vec RunShrB(PredV gp, Vec src1, Vec src2, PredV p)

One embodiment of a RunShrA instruction is shown in code example 90. In this embodiment, using a first selected active element from input vector src1 as a basis, the RunShrA performs a right shift on the basis by the cumulative number of bits specified by active elements from input vector src2. It is noted that code example 90 depicts the various element positions of the input vectors being processed in a sequential fashion, in other embodiments, the element positions may be processed in parallel.

EXAMPLE 90

| Program code RunShrA |
|---|
| Vec RunShrA(PredV gp, Vec src1, Vec src2, PredV p) |
| { |
|   Vector r; |
|   int x; |

| Program code RunShrA |
|---|
|   Scalar<F/U><32/64> s; |
|   for(x=0;x<VECLEN;++x) |
|   { |
|     if(gp.v[x] && p.v[x]) |
|     { |
|       s = src1.v[x]; |
|       break; |
|     } |
|     else if(gp.v[x]) |
|       r.v[x] = src1.v[x]; |
|     else |
|       r.v[x] = <Z/M>; |
|   } |
|   for(; x<VECLEN; ++x) |
|   { |
|     if(gp.v[x]) |
|       r.v[x] = s; |
|     else |
|       r.v[x] = <Z/M>; |
|     if(gp.v[x] && p.v[x]) |
|       s = s >> src2.v[x]; |
|   } |
|   return(r); |
| } |

An example of the RunShrA instruction operating with predication is shown in execution example 91. Portions of the execution of the RunShrA instruction, such as, e.g., the selection of the basis, are similar as described above in reference to execution example 7 of the RunSumA instruction. In the case of the RunShrA instruction, however, the operation performed is shift right by the number of bits specified by the active elements of input vector b, as opposed to arithmetic addition. For example, at element position six, intermediate value s (0x4) is shifted right by the number of bits specified by the value of input vector b at element position six (2), resulting in a value of 0x01 (decimal value 1) being stored in intermediate value s. The updated intermediate value s may then be copied into destination vector r when element position seven is processed.

EXAMPLE 91

| Execution of RunShrA with predication |
|---|
| a = RunShrAM(gp,a,b,p); |
| On Entry: gp = {1 1 1 1 1 1 1 0} |
| p = {0 1 1 0 0 1 1 0} |
| a = {64 64 64 64 64 64 64 64} |
| b = {0 1 1 1 2 2 2 3} |
| On Exit: a = {64 64 32 16 16 16 4 64} |

An example of the RunShrA instruction operating with zeroing is shown in execution example 92. The execution with zeroing is similar to the execution with predication as described above in reference to execution example 91. When functioning in zeroing mode, however, the RunShrA instruction copies a zero into the element position of destination vector r corresponding to element positions of predicate gp that contain a 0 value. For example, at element position eight of execution example 92, the predicate gp is 0, resulting in a 0 being stored in element position eight of destination vector r.

EXAMPLE 92

| Execution of RunShrA with zeroing | | |
|---|---|---|
| a = RunShrAZ(gp,a,b,p); | | |
| On Entry: | gp = | {1 1 1 1 1 1 1 0} |
| | p = | {0 1 1 0 0 1 1 0} |
| | a = | {64 64 64 64 64 64 64 64} |
| | b = | {0 1 1 1 2 2 2 3} |
| On Exit: | a = | {64 64 32 16 16 16 2 0} |

An embodiment of the RunShrB instruction is illustrated in code example 93. The illustrated embodiment functions in a similar fashion to the RunShrA instruction described above in reference to code example 90. In the case of the RunShrB instruction, the shift operation is performed before the intermediate value s is stored in destination vector r.

EXAMPLE 93

| Program code RunShrB |
|---|

```
Vec RunShrB(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x] && p.v[x])
            s = s >> src2.v[x];
        if(gp.v[x])
            r.v[x] = s;
        else
            r.v[x] = <Z/M>;
    }
    return r;
}
```

An example of the RunShrB instruction with predication is shown in execution example 94. The execution of the RunShrB instruction with predication is similar to the execution of the RunShrA instruction with predication as described above in reference to execution example 91. In the case of the B variant of the RunShr instruction, the shift operation is performed before the intermediate value s is copied into destination vector r.

EXAMPLE 94

| Execution of RunShrB with predication | | |
|---|---|---|
| a = RunShrBM(gp,a,b,p); | | |
| On Entry: | gp = | {1 1 1 1 1 1 1 0} |
| | p = | {0 1 1 0 1 1 1 0} |
| | a = | {64 64 64 64 64 64 64 64} |
| | b = | {0 1 1 1 2 2 2 3} |
| On Exit: | a = | {64 32 16 16 16 2 0 64} |

An example of the RunShrB instruction with zeroing is shown in execution example 95. The execution of the RunShrB instruction with zeroing is similar to the execution of the RunShrB with predication as described above in reference to execution example 94. In the case of executing the RunShrB instruction with zeroing, when an element of predicate gp is 0, a value of 0 is copied into destination vector r rather than copying the corresponding element from input vector a into destination vector r. For example, in element position eight, predicate gp is 0, and a value of 0 is forced into destination vector r at element position eight.

EXAMPLE 95

| Execution of RunShrB with zeroing | | |
|---|---|---|
| a = RunShrBM(gp,a,b,p); | | |
| On Entry: | gp = | {1 1 1 1 1 1 1 0} |
| | p = | {0 1 1 0 1 1 1 0} |
| | a = | {64 64 64 64 64 64 64 64} |
| | b = | {0 1 1 1 2 2 2 3} |
| On Exit: | a = | {64 32 16 16 16 2 0 0} |

Wrapping Shift Right

In some embodiments, conditional recurrent shift operations may be performed using the Macroscalar instruction wrapping multiply (WShr). As with the previously described instructions, the WShr instruction may have the A and B variants. The variants are:

Vec WShrA(PredV gp, Vec src1, Vec src2, PredV p)

Vec WShrB(PredV gp, Vec src1, Vec src2, PredV p)

One embodiment of a WShrA instruction is shown in code example 96. In this embodiment, using a first active element from input vector src1 as a basis, the WShrA instruction performs a right shift on the basis by the cumulative number of bits specified by active elements from input vector src2. It is noted that code example 96 depicts the various element positions of the input vectors being processed in a sequential fashion, in other embodiments, the element positions may be processed in parallel.

EXAMPLE 96

| Program code WShrA |
| --- |
| Vec WShrA(PredV gp, Vec src1, Vec src2, PredV p)<br>{<br>   Vector r;<br>   int x;<br>   Scalar<F/U><32/64> s;<br>   s = src1.v[VECLEN−1];<br>   for(x=0;x<VECLEN;++x)<br>   {<br>      if(x)<br>         s = src1.v[x];<br>      if(gp.v[x])<br>         break;<br>      r.v[x] = src1.v[x];<br>   }<br>   for(; x<VECLEN; ++x)<br>   {<br>      r.v[x] = s;<br>      if(gp.v[x] && p.v[x])<br>         s = s >> src2.v[x];<br>   }<br>   return(r);<br>} |

An example of the WShrA instruction operating with wrapping is shown in execution example 97. Portions of the execution of the WShrA instruction, such as, e.g., the selection of the basis, are similar to portions of the execution of the WAddA instruction as described above in execution example 13. In the case of WShrA, however, the operation performed is shift right by the number of bits specified by the active elements of input vector b, as opposed to arithmetic addition.

EXAMPLE 97

| Execution of WShrA with wrapping |
| --- |
| a = WShrA(gp,a,b,p);<br>On Entry:  gp = {1 1 0 1 1 1 0 0}<br>                p = {1 1 0 0 1 1 1 0}<br>                a = {1023 1022 3 4 5 6 7 1024}<br>                b = {2 3 2 3 2 3 2 3}<br>On Exit:   a = {1024 256 32 32 32 8 1 1} |

An example of the WShrA instruction without wrapping is illustrated in execution example 98. The illustrated embodiment operates in a similar fashion to the WShrA instruction with wrapping as described above in reference to execution example 97. In the non-wrapping case, predicate gp and predicate p are both 0 at element position one which indicates that element position one of input vector a is not an active element and, therefore, is not selected as the basis for the operation. The first active element is found at element position two where predicate gp is 1, resulting in the value of input vector a (1022) being selected as the basis. The remaining portion of the execution of the WShrA instruction without wrapping then proceeds as described above in reference to the WShrA instruction with wrapping.

EXAMPLE 98

| Execution of WShrA without wrapping |
| --- |
| a = WShrA(gp,a,b,p);<br>On Entry:  gp = {0 1 0 1 1 1 1 1}<br>                p = {0 0 1 0 1 1 1 1}<br>                a = {1023 1022 3 4 5 6 7 1024}<br>                b = {2 3 2 3 2 3 2 3}<br>On Exit:   a = {1023 1022 1022 1022 1022 255 31 7} |

An embodiment of the WShrB instruction is illustrated in code example 99. The illustrated embodiment functions in a similar fashion to the WShrA instruction described above in reference to code example 96. In the case of the WShrB instruction, the shift operation is performed before the intermediate value s is stored in destination vector r.

EXAMPLE 99

| Program code WShrB |
| --- |
| Vec WShrB(PredV gp, Vec src1, Vec src2, PredV p)<br>{<br>   Vector r;<br>   int x;<br>   Scalar<F/U><32/64> s;<br>   s = src1.v[VECLEN−1];<br>   for(x=0;x<VECLEN;++x)<br>   {<br>      if(gp.v[x])<br>         break;<br>      r.v[x] = src1.v[x];<br>      s = src1.v[x];<br>   }<br>   for(; x<VECLEN; ++x)<br>   {<br>      if(gp.v[x] && p.v[x])<br>          s = s >> src2.v[x];<br>      r.v[x] = s;<br>   }<br>   return(r);<br>} |

An example of the WShrB instruction with wrapping is shown in execution example 100. The execution of the WShrB instruction with wrapping is similar to the execution of the WShrA instruction with wrapping as described above in reference to execution example 97. In the case of the B variant of the WShr instruction, the shift right operation is performed before the intermediate value s is copied into destination vector r.

EXAMPLE 100

| Execution of WShrB with wrapping |
| --- |
| a = WShrB(gp,a,b,p);<br>On Entry:  gp = {1 1 0 1 1 1 0 0}<br>                p = {1 1 0 0 1 1 1 0} |

| Execution of WShrB with wrapping | | |
|---|---|---|
| | a = | {1023 1022 3 4 5 6 7 1024} |
| | b = | {2 3 2 3 2 3 2 3} |
| On Exit: | a = | {256 32 32 32 8 1 1 1} |

An example of the WShrB instruction without wrapping is shown in execution example 101. The execution of the WShrB instruction without wrapping is similar to the execution of the WShrB with wrapping as described above in reference to execution example 100. In the non-wrapping case, predicate gp and predicate p are both 0 at element position one. The predicate gp is 1 at element position two, resulting in the selection of the value of input vector a (1023) at the preceding element position, i.e., element position one, as the basis. The remaining portion of the execution of the WShrB instruction without wrapping then proceeds as described above in reference to the WShrB instruction with wrapping.

EXAMPLE 101

| Execution of WShrB without wrapping | | |
|---|---|---|
| a = WShrB(gp,a,b,p); | | |
| On Entry: | gp = | {0 1 0 1 1 1 1 1} |
| | p = | {0 0 1 0 1 1 1 1} |
| | a = | {1023 1022 3 4 5 6 7 1024} |
| | b = | {2 3 2 3 2 3 2 3} |
| On Exit: | a = | {1023 1023 1023 1023 255 31 7 0} |

Running Shift Right Divide-by-Two

In some embodiments, conditional recurrent shift operations may be implemented using instructions in the Macroscalar architecture. More particularly, as described further below, running shift right divide-by-two (RunShrD) may be implemented.

The RunShrD instruction operates by conditionally performing the specified recurrent shift right operation on elements of a vector in ascending order, corresponding to a series of iterations of a scalar version of the operation. As with previously described instructions, the RunShrD instruction may have the A and B variants. The variants are:

Vec RunShrDA(PredV gp, Vec src1, Scalar src2, PredV p)
Vec RunShrDB(PredV gp, Vec src1, Scalar src2, PredV p)

One embodiment of a RunShrDA instruction is shown in code example 102. In this embodiment, using a first selected active element from input vector src1 as a basis, the RunShrDA performs a right shift on the basis by the cumulative number of bits specified by active elements from input scalar src2. The RunShrDA instruction also correctly divides signed integers by powers of two.

EXAMPLE 102

| Program code RunShrDA |
|---|
| Vec RunShrDA(PredV gp, Vec src1, Scalar src2, PredV p) |
| { |
|   Vector r; |
|   int x; |
|   Scalar<F/U><32/64> s; |
|   for(x=0;x<VECLEN;++x) |

| Program code RunShrDA |
|---|
|   { |
|     if(gp.v[x] && p.v[x]) |
|     { |
|       s = src1.v[x]; |
|       break; |
|     } |
|     else if(gp.v[x]) |
|       r.v[x] = src1.v[x]; |
|     else |
|       r.v[x] = <Z/M>; |
|   } |
|   for(; x<VECLEN; ++x) |
|   { |
|     if(gp.v[x]) |
|       r.v[x] = s; |
|     else |
|       r.v[x] = <Z/M>; |
|     if(gp.v[x] && p.v[x]) |
|       s = (s >> src2.v[x])+((s & (s>><31/63>) |
|         & ((1<<src2.v[x])−1)) !=0); |
|   } |
|   return(r); |
| } |

An example of the RunShrDA instruction operating with predication is shown in execution example 103. Portions of the execution of the RunShrDA instruction, such as, e.g., the selection of the basis, are similar as described above in reference to execution example 7 of the RunSumA instruction. In the case of the RunShrDA instruction, however, the operation performed is shift right by the number of bits specified by the active elements of input scalar b, as opposed to arithmetic addition.

EXAMPLE 103

| Execution of RunShrDA with predication | | |
|---|---|---|
| a = RunShrAM(gp,a,b,p); | | |
| On Entry: | gp = | {1 1 0 1 1 1 0 0} |
| | p = | {1 1 0 0 1 1 1 0} |
| | a = | {1023 1022 3 4 5 6 7 1024} |
| | b = | {2 2 2 2 2 2 2 2} |
| On Exit: | a = | {1023 255 3 63 63 15 7 1024} |

An example of the RunShrDA instruction operating with zeroing is shown in execution example 104. The execution with zeroing is similar to the execution with predication as described above in reference to execution example 103. When functioning in zeroing mode, however, the RunShrDA instruction copies a zero into the element position of destination vector r corresponding to element positions of predicate gp that contain a 0 value.

EXAMPLE 104

| Execution of RunShrDA with zeroing | | |
|---|---|---|
| a = RunShrAZ(gp,a,b,p); | | |
| On Entry: | gp = | {1 1 0 1 1 1 0 0} |
| | p = | {1 1 0 0 1 1 1 0} |
| | a = | {1023 1022 3 4 5 6 7 1024} |
| | b = | {2 2 2 2 2 2 2 2} |
| On Exit: | a = | {1023 255 0 63 63 15 0 0} |

An embodiment of the RunShrDB instruction is illustrated in code example 105. The illustrated embodiment functions in a similar fashion to the RunShrDA instruction described above in reference to code example 102. In the case of the RunShrDB instruction, the shift operation is performed before the intermediate value s is stored in destination vector r.

EXAMPLE 105

```
Program code RunShrDB

Vec RunShrDB(PredV gp, Vec src1, Scalar src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x] && p.v[x])
            s = (s >> src2.v[x])+((s & (s>><31/63>)
                & ((1<<src2.v[x])−1)) !=0);
        if(gp.v[x])
            r.v[x] = s;
        else
            r.v[x] = <Z/M>;
    }
    return(r);
}
```

An example of the RunShrDB instruction with predication is shown in execution example 106. The execution of the RunShrDB instruction with predication is similar to the execution of the RunShrDA instruction with predication as described above in reference to execution example 103. In the case of the B variant of the RunShrD instruction, the shift operation is performed before the intermediate value s is copied into destination vector r.

EXAMPLE 106

```
Execution of RunShrDB with predication a = RunShrDBM(gp,a,b,p);
On Entry:  gp =  {1 1 0 1 1 1 0 0}
           p  =  {1 1 0 0 1 1 1 0}
           a  =  {1023 1022 3 4 5 6 7 1024}
           b  =  {2 2 2 2 2 2 2 2}
On Exit:   a  =  {255 63 3 63 15 3 7 1024}
```

An example of the RunShrDB instruction with zeroing is shown in execution example 107. The execution of the RunShrDB instruction with zeroing is similar to the execution of the RunShrDB with predication as described above in reference to execution example 106. In the case of executing the RunShrDB instruction with zeroing, when an element of predicate gp is 0, a value of 0 is copied into destination vector r rather than copying the corresponding element from input vector a into destination vector r.

```
Execution of RunShrDB with zeroing a = RunShrDBM(gp,a,b,p);
On Entry:  gp =  {1 1 0 1 1 1 0 0}
           p  =  {1 1 0 0 1 1 1 0}
           a  =  {1023 1022 3 4 5 6 7 1024}
           b  =  {2 2 2 2 2 2 2 2}
On Exit:   a  =  {255 63 0 63 15 3 0 0}
```

EXAMPLE 107

Wrapping Shift Right Divide-by-Two

In some embodiments, conditional recurrent shift operations may be performed using the Macroscalar instruction wrapping shift right divide-by-two (WShrD). As with the previously described instructions, the WShrD instruction may have the A and B variants. The variants are:

Vec WShrDA(PredV gp, Vec src1, Scalar src2, PredV p)
Vec WShrDB(PredV gp, Vec src1, Scalar src2, PredV p)

One embodiment of a WShrDA instruction is shown in code example 108. In this embodiment, using a first active element from input vector src1 as a basis, the WShrDA instruction performs a right shift on the basis by the cumulative number of bits specified by active elements from input scalar src2. The WshrDA instruction correctly divides signed integers by powers of two.

EXAMPLE 108

```
Program code WShrDA

Vec WShrDA(PredV gp, Vec src1, Scalar src2, PredV p)
{
    Vector r;
    int  x;
    Scalar<F/U><32/64> s;
    Scalar<F/U><32/64> t2;
    s = src1.v[VECLEN−1];
    for(x=0;x<VECLEN;++x)
    {
        if(x)
            s = src1.v[x];
        if(gp.v[x])
            break;
        r.v[x] = src1.v[x];
    }
    for(; x<VECLEN; ++x)
    {
        r.v[x] = s;
        t2 = src2.v[x];
        if(gp.v[x] && p.v[x])
            s = (s >> t2) + ((s & (s>>31)) & ((1<<t2)−1)) != 0);
    }
    return(r);
}
```

An example of the WShrDA instruction operating with wrapping is shown in execution example 109. Portions of the execution the WShrDA instruction, such as, e.g., the selection of the basis, are similar to portions of the execution of the WAddA instruction as described above in execution example 13. In the case of WShrDA, however, the operation performed is shift right by the number of bits specified by the active elements of input vector b, as opposed to arithmetic addition.

EXAMPLE 109

| Execution of WShrDA with wrapping |
|---|
| a = WShrDA(gp,a,b,p); |
| On Entry: gp = {1 1 0 1 1 1 0 0} |
| p = {1 1 0 0 1 1 1 0} |
| a = {1023 1022 3 4 5 6 7 1024} |
| b = {2 2 2 2 2 2 2 2} |
| On Exit: a = {1024 256 64 64 64 16 4 4} |

An example of the WShrDA instruction without wrapping is illustrated in execution example 110. The illustrated embodiment operates in a similar fashion to the WShrDA instruction with wrapping as described above in reference to execution example 109. In the non-wrapping case, predicate gp and predicate p are both 0 at element position one which indicates that element position one of input vector a is not an active element and, therefore, is not selected as the basis for the operation.

EXAMPLE 110

| Execution of WShrDA without wrapping |
|---|
| a = WShrDA(gp,a,b,p); |
| On Entry: gp = {0 1 0 1 1 1 1 1} |
| p = {0 0 1 0 1 1 1 1} |
| a = {1023 1022 3 4 5 6 7 1024} |
| b = {2 2 2 2 2 2 2 2} |
| On Exit: a = {1023 1022 1022 1022 1022 255 63 15} |

An embodiment of the WShrDB instruction is illustrated in code example 111. The illustrated embodiment functions in a similar fashion to the WShrDA instruction described above in reference to code example 108. In the case of the WShrDB instruction, the shift operation is performed before the intermediate value s is stored in destination vector r.

EXAMPLE 111

| Program code WShrDB |
|---|
| Vec WShrDB(PredV gp, Vec src1, Scalar src2, PredV p) |
| { |
|   Vector r; |
|   int x; |
|   Scalar<F/U><32/64> s; |
|   Scalar<F/U><32/64> t2; |
|   s = src1.v[VECLEN−1]; |
|   for(x=0;x<VECLEN;++x) |
|   { |
|     if(gp.v[x]) |
|       break; |
|     r.v[x] = src1.v[x]; |
|     s = src1.v[x]; |
|   } |
|   for(; x<VECLEN; ++x) |
|   { |
|     t2 = src2.v[x]; |
|     if(gp.v[x] && p.v[x]) |

| Program code WShrDB |
|---|
|       s = (s >> t2) + ((s & (s>>31)) & ((1<<t2)−1)) != 0); |
|     r.v[x] = s; |
|   } |
|   return(r); |
| } |

An example of the WShrDB instruction with wrapping is shown in execution example 112. The execution of the WShrDB instruction with wrapping is similar to the execution of the WShrDA instruction with wrapping as described above in reference to execution example 109. In the case of the B variant of the WShrD instruction, the shift right operation is performed before the intermediate value s is copied into destination vector r.

EXAMPLE 112

| Execution of WShrDB with wrapping |
|---|
| a = WShrDB(gp,a,b,p); |
| On Entry: gp = {1 1 0 1 1 1 0 0} |
| p = {1 1 0 0 1 1 1 0} |
| a = {1023 1022 3 4 5 6 7 1024} |
| b = {2 2 2 2 2 2 2 2} |
| On Exit: a = {256 64 64 64 16 4 4 4} |

An example of the WShrDB instruction without wrapping is shown in execution example 113. The execution of the WShrDB instruction without wrapping is similar to the execution of the WShrDB with wrapping as described above in reference to execution example 112. In the non-wrapping case, predicate gp and predicate p are both 0 at element position one.

EXAMPLE 113

| Execution of WShrDB without wrapping |
|---|
| a = WShrDB(gp,a,b,p); |
| On Entry: gp = {0 1 0 1 1 1 1 1} |
| p = {0 0 1 0 1 1 1 1} |
| a = {1023 1022 3 4 5 6 7 1024} |
| b = {2 2 2 2 2 2 2 2} |
| On Exit: a = {1023 1023 1023 1023 255 63 15 3} |

Figure 15:
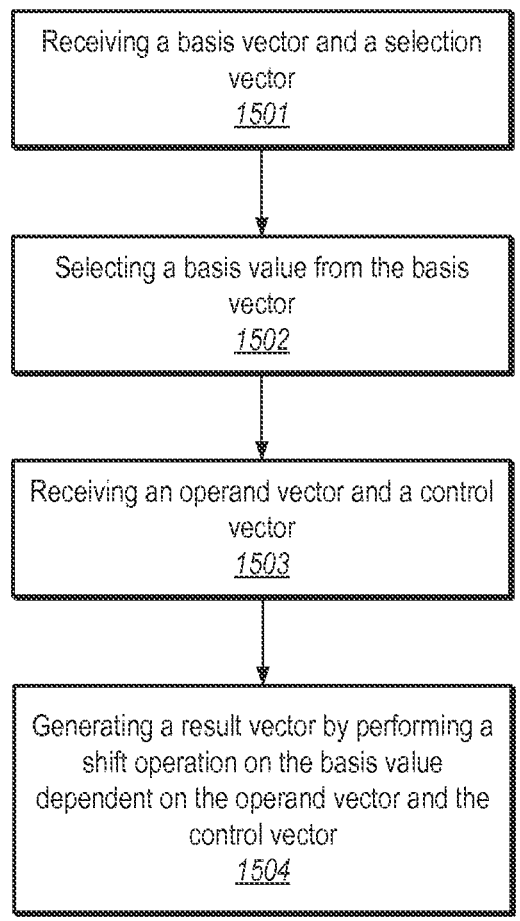
FIG. 15 is a flow diagram depicting the operation of one embodiment of the processor of FIG. 2 during execution of program instructions that implement a wrapping shift operation.

In FIG. 15, a flow diagram depicting the operation of one embodiment of the processor of FIG. 2 during execution of program instructions that implement a running/wrapping shift operations is shown. Referring collectively to FIG. 1, FIG. 2 and Examples 78-113, and beginning in block 1501 of FIG. 15, processor 102 may receive a basis vector (e.g., vector src1 of code example 111) and a selection vector (e.g., vector gp of code example 111). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1502). For example, as described above in reference to the WShrDB instruction, the element preceding the first active element of the basis vector is selected as the basis value unless the first active element is in the first element position. In some embodiments, when the first active element is in the first element position, the basis value may be selected from the last element position of the basis vector.

Processor 102 may also receive an operand vector and a control vector, such as, e.g., vectors src2 and p of code example 111 (block 1503). As described above, processor 102 may receive the operand vector from L1 cache 104, L2 cache 106, memory 108, or mass storage device 110. As noted previously, the operand vector and/or control vector may be received concurrently with other inputs to instruction execution (e.g., the basis and selection vectors) or in any other suitable order.

A result vector (e.g., vector r of code example 111) may then be generated by performing a shift operation using the basis value and the operand vector dependent upon the control vector (block 1504). In some embodiments, the shift operation may be a shift left, shift right, or shift right with a divide-by-two, although any other suitable type of shift, rotate, shuffle, permute, or similar transposition operation may be employed. In some embodiments, the shift operation may also depend on the selection vector (e.g., vector gp of code example 111). It is noted that the flow diagram depicted in FIG. 15 is merely an example and that additional operation and different orders of operations are possible and contemplated.

For any of the foregoing shift operations, it is noted that the underlying hardware that implements the operations may be configured to perform the shift operations in parallel across some or all elements concurrently, rather than in a serial fashion. For example, for a given element position, such an implementation may be configured to shift the basis by the sum of the shift counts for each element position that precedes the given element position. (Whether or not the shift count associated with the given element position is included may depend on whether the A or B variant of the instruction is being performed.) Thus, for example, for a set of elements 1-8, the shift operation for position 5 may be performed based on the sum of at least the shift counts associated with elements 1-4 (assuming these elements are active), and may be performed concurrently with shifts of other elements.

Running and Wrapping Booleans

The following AND, OR and Exclusive-OR (XOR) operations may be referred to collectively as running and wrapping Boolean operations. As above, each running Boolean operation is described first, followed by the corresponding wrapping Boolean operation.

Running AND

In some embodiments, conditional recurrent bitwise AND calculations may be implemented using instructions in the Macroscalar architecture. More particularly, as described further below, running bitwise AND (RunAnd) may be implemented.

The RunAnd instruction operates by conditionally performing the specified AND operation by calculating a cumulative bitwise AND on elements of a vector in ascending order, corresponding to a series of iterations of a scalar version of the operation. As with previously described instructions, the RunAnd instruction may have two embodiments. The instructions are:

Vec RunAndA(PredV gp, Vec src1, Vec src2, PredV p)
Vec RunAndB(PredV gp, Vec src1, Vec src2, PredV p)

One embodiment of a RunAndA instruction is shown in code example 114. In this embodiment, using a first selected active element from input vector src1 as a basis, the RunAndA instruction calculates a cumulative bitwise AND with active elements from input vector src2 and the basis. In the illustrated example code, the RunAndA instruction stores intermediate value s into destination vector r prior to performing the bitwise AND operation.

EXAMPLE 114

Program code RunAndA

```
Vec RunAndA(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x])
            r.v[x] = s;
        else
            r.v[x] = <Z/M>;
        if(gp.v[x] && p.v[x])
            s = s & src2.v[x];
    }
    return(r);
}
```

An example of the RunAndA instruction operating with predication is shown in execution example 115. The RunAndA instruction proceeds in a similar fashion to the execution example described above in reference to the RunAddA instruction. In the case of the RunAndA instruction, a bitwise AND is performed as opposed to arithmetic addition.

EXAMPLE 115

Program code RunAndA with predication

```
a = RunAndAM(gp,a,b,p);
On Entry:  gp = {1 1 1 1 1 0 1 0}
           p  = {0 1 1 0 1 1 1 0}
           a  = {7 15 0 1 2 3 4 5}
           b  = {7 15 7 1 6 1 4 7}
On Exit:   a  = {7 15 15 7 7 3 6 5}
```

An example of the RunAndA instruction operating with zeroing is shown in execution example 116. The execution with zeroing is similar to the execution with predication as described above in reference to execution example 115. When functioning in zeroing mode, however, the RunAndA instruction copies a zero into the element position of destination vector r corresponding to element positions of predicate gp that contain a 0 value.

EXAMPLE 116

| Program code RunAndA with zeroing |
| --- |
| a = RunAndAZ(gp,a,b,p);<br>On Entry: gp = {1 1 1 1 1 0 1 0}<br>            p = {0 1 1 0 1 1 1 0}<br>            a = {7 15 0 1 2 3 4 5}<br>            b = {7 15 7 1 6 1 4 7}<br>On Exit: a = {7 15 15 7 7 0 6 0} |

An embodiment of the RunAndB instruction is illustrated in code example 117. The illustrated embodiment functions in a similar fashion to the RunAndA instruction described above in reference to code example 114. In the case of the RunAndB instruction, the bitwise AND operation is performed before the intermediate value s is stored in destination vector r.

EXAMPLE 117

| Program code RunAndB |
| --- |
| Vec RunAndB(PredV gp, Vec src1, Vec src2, PredV p)<br>{<br>  Vector r;<br>  int x;<br>  Scalar<F/U><32/64> s;<br>  for(x=0;x<VECLEN;++x)<br>  {<br>    if(gp.v[x] && p.v[x])<br>    {<br>      s = src1.v[x];<br>      break;<br>    }<br>    else if(gp.v[x])<br>      r.v[x] = src1.v[x];<br>    else<br>      r.v[x] = <Z/M>;<br>  }<br>  for(; x<VECLEN; ++x)<br>  {<br>  if(gp.v[x] && p.v[x])<br>    s = s & src2.v[x];<br>  if(gp.v[x])<br>    r.v[x] = s;<br>  else<br>    r.v[x] = <Z/M>;<br>  }<br>  return(r);<br>} |

An example of the RunAndB instruction with predication is shown in execution example 118. The execution of the RunAndB instruction with predication is similar to the execution of the RunAndA instruction with predication as described above in reference to execution example 115.

EXAMPLE 118

| Program code RunAndB with predication |
| --- |
| a = RunAndBM(gp,a,b,p);<br>On Entry: gp = {1 1 1 1 1 0 1 0}<br>            p = {0 1 1 0 1 1 1 0}<br>            a = {7 15 0 1 2 3 4 5}<br>            b = {7 15 7 1 6 1 4 7}<br>On Exit: a = {7 15 7 7 6 3 4 5} |

An example of the RunAndB instruction with zeroing is shown in execution example 119. The execution of the RunAndB instruction with zeroing is similar to the execution of the RunAndB with predication as described above in reference to execution example 118. In the case of executing the RunAndB instruction with zeroing, when an element of predicate gp is 0, a value of 0 is copied into destination vector r rather than copying the corresponding element from input vector a into destination vector r.

EXAMPLE 119

| Program code RunAndB with zeroing |
| --- |
| a = RunAndBZ(gp,a,b,p);<br>On Entry: gp = {1 1 1 1 1 0 1 0}<br>            p = {0 1 1 0 1 1 1 0}<br>            a = {7 15 0 1 2 3 4 5}<br>            b = {7 15 7 1 6 1 4 7}<br>On Exit: a = {7 15 7 7 6 0 4 0} |

Wrapping AND

In some embodiments, conditional recurrent bitwise AND calculations may be performed using the Macroscalar instruction wrapping AND (WAnd). As described above in reference to the RunSum instruction, the WAnd instruction also includes A and B variants. The instructions are:

Vec WAndA(PredV gp, Vec src1, Vec src2, PredV p)
Vec WAndB(PredV gp, Vec src1, Vec src2, PredV p)

One embodiment of a WAndA instruction is shown in code example 120. The illustrated embodiment operates as described above in reference to the WAddA instruction. In this embodiment, however, a recurrent bitwise AND is calculated rather than the cumulative sum of the WAddA instruction.

EXAMPLE 120

| Program code WAndA |
| --- |
| Vec WAndA(PredV gp, Vec src1, Vec src2, PredV p)<br>{<br>  Vector r;<br>  int x;<br>  Scalar<F/U><32/64> s;<br>  s = src1.v[VECLEN−1];<br>  for(x=0;x<VECLEN;++x)<br>  { |

Program code WAndA

```
        if(x)
            s = src1.v[x];
        if(gp.v[x])
            break;
        r.v[x] = src1.v[v];
    }
    for(; x<VECLEN; ++x)
    {
        r.v[x] = s;
        if(gp.v[x] && p.v[x])
            s = s & src2.v[x];
    }
    return(r);
}
```

An example of the WAndA instruction operation with wrapping is shown in execution example 121. The WAndA instruction operates in a fashion similar to the WAddA instruction as described above in reference to execution example 13.

EXAMPLE 121

| Execution of WAndA with wrapping | | | |
|---|---|---|---|
| a = WAndA(gp,a,b,p); | | | |
| On Entry: | gp | = | {1 1 0 1 1 1 0 0} |
| | p | = | {1 1 0 0 1 1 1 0} |
| | a | = | {1 127 3 4 5 6 7 255} |
| | b | = | {254 253 251 247 239 223 191 127} |
| On Exit: | a = | | {255 254 252 252 252 236 204 204} |

An example of the WAndA instruction without wrapping is shown in execution example 122. The execution of the WAndA instruction without wrapping is similar to the execution of the WAndA instruction with wrapping as described above in reference to execution example 121. In the case without wrapping, the basis is selected from the first active element from input vector a.

EXAMPLE 122

| Execution of WAndA without wrapping | | | |
|---|---|---|---|
| a = WAndA(gp,a,b,p); | | | |
| On Entry: | gp | = | {0 1 0 1 1 1 1 1} |
| | p | = | {0 0 1 0 1 1 1 1} |
| | a | = | {1 127 3 4 5 6 7 255} |
| | b | = | {254 253 251 247 239 223 191 127} |
| On Exit: | a = | | {1 127 127 127 127 111 79 15} |

An embodiment of the WAndB instruction is illustrated in code example 123. The illustrated embodiment functions in a similar fashion to WAndA instruction described above in reference to code example 120. In the case of the WAndB instruction, the bitwise AND operation is performed before intermediate value s is stored in destination vector, and when the first active element of input vector src1 is not in the first element position, the basis is selected from the preceding element position of input vector src1.

EXAMPLE 123

Program code WAndB

```
Vec WAndB(PredV gp, Vec src1, Vec src2, PredV p)
{
    Vector r;
    int x;
    Scalar<F/U><32/64> s;
    s = src1.v[VECLEN-1];
    for(x=0;x<VECLEN;++x)
    {
        if(gp.v[x])
            break;
        s = src1.v[x];
        r.v[x] = src1.v[x];
    }
    for(; x<VECLEN; ++x)
    {
        if(gp.v[x] && p.v[x])
            s = s & src2.v[x];
        r.v[x] = s;
    }
    return(r);
}
```

An example of the WAndB instruction with wrapping is shown in execution example 124. The execution of the WAndB instruction with wrapping is similar to the execution of the WAndA instruction with wrapping as described above in reference to execution example 121.

EXAMPLE 124

| Execution of WAndB with wrapping | | | |
|---|---|---|---|
| a = WAndB(gp,a,b,p); | | | |
| On Entry: | gp | = | {1 1 0 1 1 1 0 0} |
| | p | = | {1 1 0 0 1 1 1 0} |
| | a | = | {511 127 3 4 5 6 7 255} |
| | b | = | {254 253 251 247 239 233 191 127} |
| On Exit: | a = | | {254 252 252 252 236 204 204 204} |

An example of the WAndB instruction without wrapping is shown in execution example 125. The execution of the WAndB instruction without wrapping is similar to the execution of the WAndA instruction without wrapping as described above in reference to execution example 122.

EXAMPLE 125

| Execution of WAndB without wrapping | | | |
|---|---|---|---|
| a = WAndB(gp,a,b,p); | | | |
| On Entry: | gp | = | {0 1 0 1 1 1 1 1} |
| | p | = | {0 0 1 0 1 1 1 1} |
| | a | = | {511 127 3 4 5 6 7 255} |
| | b | = | {254 253 251 247 239 233 191 127} |
| On Exit: | a = | | {511 511 511 511 239 207 143 15} |

Running OR

In some embodiments, conditional recurrent bitwise OR calculations may be implemented using instructions in the Macroscalar architecture. More particularly, as described further below, running bitwise OR (RunOr) may be implemented.

The RunOr instruction operates by conditionally performing the specified calculates a cumulative bitwise OR on elements of a vector in ascending order, corresponding to a series of iterations of a scalar version of the operation. As with previously described instructions, the RunOr instruction may have two embodiments. The instructions are:

Vec RunOrA(PredV gp, Vec src1, Vec src2, PredV p)
Vec RunOrB(PredV gp, Vec src1, Vec src2, PredV p)

One embodiment of a RunOrA instruction is shown in code example 126. In this embodiment, using a first selected active element from input vector src1 as a basis, the RunOrA instruction calculates a cumulative bitwise OR with active elements from input vector src2 and the basis. In the illustrated example code, the RunOrA instruction stores intermediate value s into destination vector r prior to performing the bitwise OR operation.

EXAMPLE 126

Program code RunOrA

```
Vec RunOrA(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x])
            r.v[x] = s;
        else
            r.v[x] = <Z/M>;
        if(gp.v[x] && p.v[x])
            s = s | src2.v[x];
    }
    return(r);
}
```

An example of the RunOrA instruction operating with predication is shown in execution example 127. The RunOrA instruction proceeds in a similar fashion to the execution example described above in reference to the RunAddA instruction. In the case of the RunOrA instruction, a bitwise OR performed as opposed to arithmetic addition.

EXAMPLE 127

Program code RunOrA with predication

```
a = RunOrAM(gp,a,b,p);
On Entry:   gp  =  {1 1 1 1 1 0 1 0}
             p  =  {0 1 1 0 1 1 1 0}
             a  =  {7 1 9 9 9 9 9 9}
             b  =  {7 2 1 2 3 4 5 6}
On Exit:    a = {7 1 3 3 3 9 3 9}
```

An example of the RunOrA instruction operating with zeroing is shown in execution example 128. The execution with zeroing is similar to the execution with predication as described above in reference to execution example 127. When functioning in zeroing mode, however, the RunOrA instruction copies a zero into the element position of destination vector r corresponding to element positions of predicate gp that contain a 0 value.

EXAMPLE 128

Program code RunOrA with zeroing

```
a = RunOrAZ(gp,a,b,p);
On Entry:   gp  =  {1 1 1 1 1 0 1 0}
             p  =  {0 1 1 0 1 1 1 0}
             a  =  {7 1 9 9 9 9 9 9}
             b  =  {7 2 1 2 3 4 5 6}
On Exit:    a = {7 1 3 3 3 0 3 0}
```

An embodiment of the RunOrB instruction is illustrated in code example 129. The illustrated embodiment functions in a similar fashion to the RunOrA instruction described above in reference to code example 126. In the case of the RunOrB instruction, the bitwise OR operation is performed before the intermediate value s is stored in destination vector r.

EXAMPLE 129

Program code RunOrB

```
Vec RunOrB(PredV gp, Vec src1, Vec src2, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x] && p.v[x])
            s = s | src2.v[x];
        if(gp.v[x])
            r.v[x] = s;
        else
            r.v[x] = <Z/M>;
    }
    return(r);
}
```

An example of the RunOrB instruction with predication is shown in execution example 130. The execution of the RunOrB instruction with predication is similar to the execution of the RunOrA instruction with predication as described above in reference to execution example 127.

EXAMPLE 130

| Program code RunOrB with predication |
|---|
| a = RunOrBM(gp,a,b,p);<br>On Entry:  gp  =  {1 1 1 1 1 0 1 0}<br>               p  =  {0 1 1 0 1 1 1 0}<br>               a  =  {7 1 9 9 9 9 9 9}<br>               b  =  {7 2 1 2 3 4 5 6}<br>On Exit:   a =    {7 3 3 3 3 9 7 9} |

An example of the RunOrB instruction with zeroing is shown in execution example 131. The execution of the RunOrB instruction with zeroing is similar to the execution of the RunOrB with predication as described above in reference to execution example 130. In the case of executing the RunOrB instruction with zeroing, when an element of predicate gp is 0, a value of 0 is copied into destination vector r rather than copying the corresponding element from input vector a into destination vector r.

EXAMPLE 131

| Program code RunOrB with zeroing |
|---|
| a = RunOrBZ(gp,a,b,p);<br>On Entry:  gp  =  {1 1 1 1 1 0 1 0}<br>               p  =  {0 1 1 0 1 1 1 0}<br>               a  =  {7 1 9 9 9 9 9 9}<br>               b  =  {7 2 1 2 3 4 5 6}<br>On Exit:   a =    {7 3 3 3 3 0 7 0} |

Wrapping OR

In some embodiments, conditional recurrent bitwise OR calculations may be performed using the Macroscalar instruction wrapping OR (WOr). As described above in reference to the RunSum instruction, the WOr instruction also includes A and B variants. The instructions are:
   Vec WOrA(PredV gp, Vec src1, Vec src2, PredV p)
   Vec WOrB (PredV gp, Vec src1, Vec src2, PredV p)

One embodiment of a WOrA instruction is shown in code example 132. The illustrated embodiment operates as described above in reference to the WAddA instruction. In this embodiment, however, a cumulative bitwise OR is calculated rather than the cumulative sum of the WAddA instruction.

EXAMPLE 132

| Program code WOrA |
|---|
| Vec WOrA(PredV gp, Vec src1, Vec src2, PredV p)<br>{<br>   Vector r;<br>   int x; |

| Program code WOrA |
|---|
|    Scalar<F/U><32/64> s;<br>   s = src1.v[VECLEN−1];<br>   for(x=0;x<VECLEN;++x)<br>   {<br>      if(x)<br>         s = src1.v[x];<br>      if(gp.v[x])<br>         break;<br>      r.v[x] = src1.v[v];<br>   }<br>   for(; x<VECLEN; ++x)<br>   {<br>      r.v[x] = s;<br>      if(gp.v[x] && p.v[x])<br>         s = s | src2.v[x];<br>   }<br>   return(r);<br>} |

An example of the WOrA instruction operation with wrapping is shown in execution example 133. The WOrA instruction operates in a fashion similar to the WAddA instruction as described above in reference to execution example 13.

EXAMPLE 133

| Execution of WOrA with wrapping |
|---|
| a = WOrA(gp,a,b,p);<br>On Entry:  gp  =  {1 1 0 1 1 1 0 0}<br>               p  =  {1 1 0 0 1 1 1 0}<br>               a  =  {1 2 3 4 5 6 7 8}<br>               b  =  {1 2 4 8 16 32 64 128}<br>On Exit:   a =    {8 9 11 11 11 27 59 59} |

An example of the WOrA instruction without wrapping is shown in execution example 134. The execution of the WOrA instruction without wrapping is similar to the execution of the WOrA instruction with wrapping as described above in reference to execution example 133. In the case without wrapping, the basis is selected from the first active element from input vector a.

EXAMPLE 134

| Execution of WOrA without wrapping |
|---|
| a = WOrA(gp,a,b,p);<br>On Entry:  gp  =  {0 1 0 1 1 1 1 1}<br>               p  =  {0 0 1 0 1 1 1 1}<br>               a  =  {1 2 3 4 5 6 7 8}<br>               b  =  {1 2 4 8 16 32 64 128}<br>On Exit:   a =    {1 2 2 2 2 18 50 114} |

An embodiment of the WOrB instruction is illustrated in code example 135. The illustrated embodiment functions in a similar fashion to WOrA instruction described above in reference to code example 132. In the case of the WOrB instruction, the bitwise OR operation is performed before intermediate value s is stored in destination vector, and when the first active element of input vector src1 is not in the first element position, the basis is selected from the preceding element position of input vector src1.

EXAMPLE 135

---
Program code WOrB
---

```
Vec WOrB(PredV gp, Vec src1, Vec src2, PredV p)
{
  Vector r;
  int x;
  Scalar<F/U><32/64> s;
  s = src1.v[VECLEN-1];
  for(x=0;x<VECLEN;++x)
  {
    if(gp.v[x])
      break;
    s = src1.v[x];
    r.v[x] = src1.v[x];
  }
  for(; x<VECLEN; ++x)
  {
    if(gp.v[x] && p.v[x])
      s = s | src2.v[x];
    r.v[x] = s;
  }
  return(r);
}
```

An example of the WOrB instruction with wrapping is shown in execution example 136. The execution of the WOrB instruction with wrapping is similar to the execution of the WOrA instruction with wrapping as described above in reference to execution example 133.

EXAMPLE 136

---
Execution of WOrB with wrapping
---

```
a = WOrB(gp,a,b,p);
On Entry:  gp =  {1 1 0 1 1 1 0 0}
           p  =  {1 1 0 0 1 1 1 0}
           a  =  {1 2 3 4 5 6 7 8}
           b  =  {1 2 4 8 16 32 64 128}
On Exit:   a  =  {9 11 11 11 27 59 59 59}
```

An example of the WOrB instruction without wrapping is shown in execution example 137. The execution of the WOrB instruction without wrapping is similar to the execution of the WOrA instruction without wrapping as described above in reference to execution example 134.

EXAMPLE 137

---
Execution of WOrB without wrapping
---

```
a = WOrB(gp,a,b,p);
On Entry:  gp =  {0 1 0 1 1 1 1 1}
           p  =  {0 0 1 0 1 1 1 1}
           a  =  {1 2 3 4 5 6 7 8}
           b  =  {1 2 4 8 16 32 64 128}
On Exit:   a  =  {1 1 1 1 17 49 113 241}
```

Running XOR

In some embodiments, conditional recurrent exclusive-OR (XOR) operations may be implemented using instructions in the Macroscalar architecture. More particularly, as described further below, running bitwise XOR (RunXor) may be implemented.

The RunXor instruction operates by conditionally performing the specified calculates a cumulative bitwise XOR on elements of a vector in ascending order, corresponding to a series of iterations of a scalar version of the operation. As with previously described instructions, the RunXor instruction may have two embodiments. The instructions are:

Vec RunXorA(PredV gp, Vec src1, Vec src2, PredV p)

Vec RunXorB(PredV gp, Vec src1, Vec src2, PredV p)

One embodiment of a RunXorA instruction is shown in code example 138. In this embodiment, using a first selected active element from input vector src1 as a basis, the RunXorA instruction calculates a cumulative bitwise XOR with active elements from input vector src2 and the basis. In the illustrated example code, the RunXorA instruction stores intermediate value s into destination vector r prior to performing the bitwise OR operation.

EXAMPLE 138

---
Program code RunXorA
---

```
Vec RunXorA(PredV gp, Vec src1, Vec src2, PredV p)
{
  Vector r;
  int x;
  Scalar<F/U><32/64> s;
  for(x=0;x<VECLEN;++x)
  {
    if(gp.v[x] && p.v[x])
    {
      s = src1.v[x];
      break;
    }
    else if(gp.v[x])
      r.v[x] = src1.v[x];
    else
      r.v[x] = <Z/M>;
  }
  for(; x<VECLEN; ++x)
  {
    if(gp.v[x])
      r.v[x] = s;
    else
      r.v[x] = <Z/M>;
    if(gp.v[x] && p.v[x])
      s = s ^ src2.v[x];
  }
  return(r);
}
```

An example of the RunXorA instruction operating with predication is shown in execution example 139. The RunXorA instruction proceeds in a similar fashion to the execution example described above in reference to the RunAddA instruction. In the case of the RunXorA instruction, each time the operation is performed, a bitwise XOR is performed as opposed to arithmetic addition.

EXAMPLE 139

| Program code RunXorA with predication |
|---|
| a = RunXorAM(gp,a,b,p);<br>On Entry:  gp =  {1 1 1 1 1 0 1 0}<br>             p  =  {0 1 1 0 1 1 1 0}<br>             a  =  {7 6 5 4 3 2 1 0}<br>             b  =  {7 2 1 2 3 4 5 6}<br>On Exit:   a  =  {7 6 4 5 5 2 6 0} |

An example of the RunXorA instruction operating with zeroing is shown in execution example 140. The execution with zeroing is similar to the execution with predication as described above in reference to execution example 139. When functioning in zeroing mode, however, the RunXorA instruction copies a zero into the element position of destination vector r corresponding to element positions of predicate gp that contain a 0 value.

EXAMPLE 140

| Program code RunXorA with zeroing |
|---|
| a = RunXorAZ(gp,a,b,p);<br>On Entry:  gp =  {1 1 1 1 1 0 1 0}<br>             p  =  {0 1 1 0 1 1 1 0}<br>             a  =  {7 6 5 4 3 2 1 0}<br>             b  =  {7 2 1 2 3 4 5 6}<br>On Exit:   a  =  {7 6 4 5 5 0 6 0} |

An embodiment of the RunXorB instruction is illustrated in code example 141. The illustrated embodiment functions in a similar fashion to the RunXorA instruction described above in reference to code example 138. In the case of the RunXorB instruction, the bitwise XOR operation is performed before the intermediate value s is stored in destination vector r.

EXAMPLE 141

| Program code RunXorB |
|---|
| Vec RunXorB(PredV gp, Vec src1, Vec src2, PredV p)<br>{<br>  Vector r;<br>  int x;<br>  Scalar<F/U><32/64> s;<br>  for(x=0;x<VECLEN;++x)<br>  {<br>    if(gp.v[x] && p.v[x])<br>    {<br>      s = src1.v[x];<br>      break;<br>    }<br>    else if(gp.v[x])<br>      r.v[x] = src1.v[x];<br>    else<br>      r.v[x] = <Z/M>;<br>  }<br>  for(; x<VECLEN; ++x) |

| Program code RunXorB |
|---|
| {<br>  if(gp.v[x] && p.v[x])<br>    s = s | src2.v[x];<br>  if(gp.v[x])<br>    r.v[x] = s;<br>  else<br>    r.v[x] = <Z/M>;<br>}<br>return(r);<br>} |

An example of the RunXorB instruction with predication is shown in execution example 142. The execution of the RunXorB instruction with predication is similar to the execution of the RunXorA instruction with predication as described above in reference to execution example 139.

EXAMPLE 142

| Program code RunXorB with predication |
|---|
| a = RunXorBM(gp,a,b,p);<br>On Entry:  gp =  {1 1 1 1 1 0 1 0}<br>             p  =  {0 1 1 0 1 1 1 0}<br>             a  =  {7 6 5 4 3 2 1 0}<br>             b  =  {7 2 1 2 3 4 5 6}<br>On Exit:   a  =  {7 4 5 5 6 2 3 0} |

An example of the RunXorB instruction with zeroing is shown in execution example 143. The execution of the RunXorB instruction with zeroing is similar to the execution of the RunXorB with predication as described above in reference to execution example 142. In the case of executing the RunXorB instruction with zeroing, when an element of predicate gp is 0, a value of 0 is copied into destination vector r rather than copying the corresponding element from input vector a into destination vector r.

EXAMPLE 143

| Program code RunXorB with zeroing |
|---|
| a = RunXorBZ(gp,a,b,p);<br>On Entry:  gp =  {1 1 1 1 1 0 1 0}<br>             p  =  {0 1 1 0 1 1 1 0}<br>             a  =  {7 6 5 4 3 2 1 0}<br>             b  =  {7 2 1 2 3 4 5 6}<br>On Exit:   a  =  {7 4 5 5 6 0 3 0} |

Wrapping XOR

In some embodiments, conditional recurrent summation calculations may be performed using the Macroscalar instruction wrapping XOR (WXor). As described above in reference to the RunSum instruction, the WXor instruction also includes A and B variants. The instructions are:

Vec WXorA(PredV gp, Vec src1, Vec src2, PredV p)
    Vec WXorB(PredV gp, Vec src1, Vec src2, PredV p)

One embodiment of a WXorA instruction is shown in code example 144. The illustrated embodiment operates as described above in reference to the WAddA instruction. In this embodiment, however, a cumulative bitwise XOR is calculated rather than the cumulative sum of the WAddA instruction.

EXAMPLE 144

---
Program code WXorA
---

```
Vec WXorA(PredV gp, Vec src1, Vec src2, PredV p)
{
  Vector r;
  int x;
  Scalar<F/U><32/64> s;
  s = src1.v[VECLEN-1];
  for(x=0;x<VECLEN;++x)
  {
    if(x)
      s = src1.v[x];
    if(gp.v[x])
      break;
    r.v[x] = src1.v[v];
  }
  for(; x<VECLEN; ++x)
  {
    r.v[x] = s;
    if(gp.v[x] && p.v[x])
      s = s ^ src2.v[x];
  }
  return(r);
}
```

An example of the WXorA instruction operation with wrapping is shown in execution example 145. The WXorA instruction operates in a fashion similar to the WAddA instruction as described above in reference to execution example 13.

EXAMPLE 145

---
Execution of WXorA with wrapping
---

```
a = WXorA(gp,a,b,p);
On Entry:  gp = {1 1 0 1 1 1 0 0}
           p  = {1 1 0 0 1 1 1 0}
           a  = {511 127 3 4 5 6 7 255}
           b  = {254 253 251 247 239 223 191 127}
On Exit:   a  = {255 1 252 252 252 19 204 204}
```

An example of the WXorA instruction without wrapping is shown in execution example 146. The execution of the WXorA instruction without wrapping is similar to the execution of the WXorA instruction with wrapping as described above in reference to execution example 145. In the case without wrapping, the basis is selected from the first active element from input vector a.

EXAMPLE 146

---
Execution of WXorA without wrapping
---

```
a = WXorA(gp,a,b,p);
On Entry:  gp = {0 1 0 1 1 1 1 1}
           p  = {0 0 1 0 1 1 1 1}
           a  = {511 127 3 4 5 6 7 255}
```

---
Execution of WXorA without wrapping
---

```
           b  = {254 253 251 247 239 223 191 127}
On Exit:   a  = {511 127 127 127 127 144 79 240}
```

An embodiment of the WXorB instruction is illustrated in code example 147. The illustrated embodiment functions in a similar fashion to WXorA instruction described above in reference to code example 144. In the case of the WXorB instruction, the bitwise XOR operation is performed before intermediate value s is stored in destination vector, and when the first active element of input vector src1 is not in the first element position, the basis is selected from the preceding element position of input vector src1.

EXAMPLE 147

---
Program code WXorB
---

```
Vec WXorB(PredV gp, Vec src1, Vec src2, PredV p)
{
  Vector r;
  int x;
  Scalar<F/U><32/64> s;
  s = src1.v[VECLEN-1];
  for(x=0;x<VECLEN;++x)
  {
    if(gp.v[x])
      break;
    s = src1.v[x];
    r.v[x] = src1.v[x];
  }
  for(; x<VECLEN; ++x)
  {
    if(gp.v[x] && p.v[x])
      s = s ^ src2.v[x];
    r.v[x] = s;
  }
  return(r);
}
```

An example of the WXorB instruction with wrapping is shown in execution example 148. The execution of the WXorB instruction with wrapping is similar to the execution of the WXorA instruction with wrapping as described above in reference to execution example 145.

EXAMPLE 148

---
Execution of WXorB with wrapping
---

```
a = WOrB(gp,a,b,p);
On Entry:  gp = {1 1 0 1 1 1 0 0}
           p  = {1 1 0 0 1 1 1 0}
           a  = {511 127 3 4 5 6 7 255}
           b  = {254 253 251 247 239 223 191 127}
On Exit:   a  = {1 252 252 252 19 204 204 204}
```

An example of the WXorB instruction without wrapping is shown in execution example 149. The execution of the WXorB instruction without wrapping is similar to the execution of the WXorA instruction without wrapping as described above in reference to execution example 146.

EXAMPLE 149

| Execution of WXorB without wrapping |
|---|
| a = WXorB(gp,a,b,p); |
| On Entry: gp = {0 1 0 1 1 1 1 1} |
| p  = {0 0 1 0 1 1 1 1} |
| a  = {511 127 3 4 5 6 7 255} |
| b  = {254 253 251 247 239 223 191 127} |
| On Exit: a  = {1 511 511 511 511 272 463 368 271} |

Figure 16:
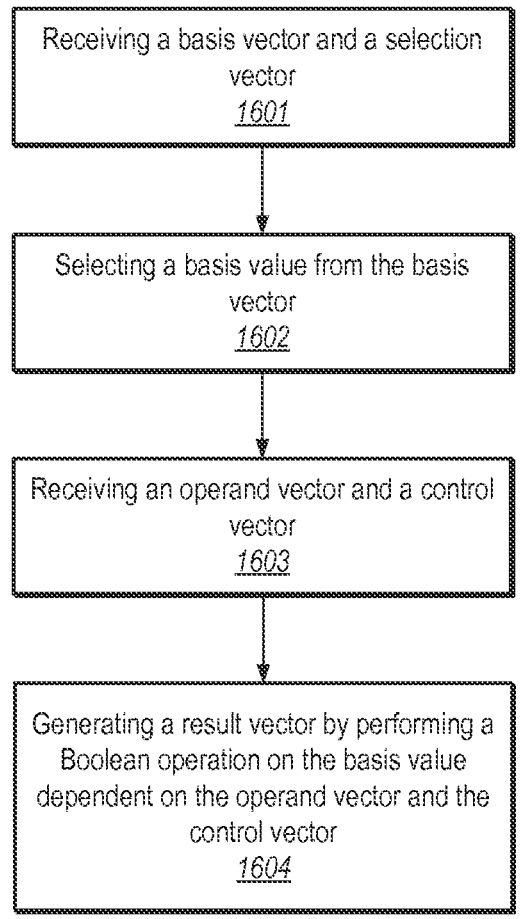
FIG. 16 is a flow diagram depicting the operation of one embodiment of the processor of FIG. 2 during execution of program instructions that implement a wrapping Boolean operation.

In FIG. 16, a flow diagram depicting the operation of one embodiment of the processor of FIG. 2 during execution of program instructions that implement wrapping Boolean operations is shown. Referring collectively to FIG. 1, FIG. 2, and Examples 114-149, and beginning in block 1601 of FIG. 16, the processor 102 receives a basis vector (e.g., vector src1 of code example 120) and a selection vector (e.g., vector gp of code example 120). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1602). For example, as described above in reference to the WAndB instruction, the element preceding the first active element of the basis vector is selected as the basis value unless the first active element is in the first element position. In some embodiments, when the first active element is in the first element position, the basis value may be selected from the last element position of the basis vector.

Processor 102 may also receive an operand vector and a control vector, such as, e.g., vectors src2 and p of code example 120 (block 1603). As described above, processor 102 may receive the operand vector from L1 cache 104, L2 cache 106, memory 108, or mass storage device 110. As noted previously, the operand vector and/or control vector may be received concurrently with other inputs to instruction execution (e.g., the basis and selection vectors) or in any other suitable order.

A result vector (e.g., vector r of code example 120) may then be generated by performing a Boolean operation (e.g., bitwise AND, OR, XOR) using the basis value and the operand vector dependent on the control vector (block 1604). Any suitable Boolean function (including NAND, NOR, XNOR, or other variants) may be employed as the Boolean operation. In some embodiments, the Boolean operation may also depend on the selection vector (e.g., vector gp of code example 120). It is noted that the flow diagram depicted in FIG. 16 is merely an example and that additional operations and different orders of operations are possible and contemplated.

The following instructions (e.g., Inc/Dec; Neg/Not/Inv) are unary instructions, in which the operations are performed on a single input vector src1, in contrast to the above instructions.

Running and Wrapping Increment and Decrement

The following Increment and Decrement operations may be referred to generally as fixed-value accumulation operations since the Increment and Decrement are specific implementations of a fixed-value accumulation, where the fixed value is one or minus one, respectively (although other fixed values by which to increment or decrement may also be used).

As above, each running operation is described first, followed by the corresponding wrapping operation.

Running Increment

In some embodiments, conditional cumulative increment operations may be implemented using instructions in the Macroscalar architecture. More particularly, as described further below, running increment (RunIncr) may be implemented.

The RunIncr instruction operates by conditionally incrementing a basis value for each active element specified by the predicate p. As with previously described instructions, the RunIncr instruction may have two embodiments. The instructions are:

Vec RunIncrA(PredV gp, Vec src1, PredV p)

Vec RunIncrB(PredV gp, Vec src1, PredV p)

One embodiment of a RunIncrA instruction is shown in code example 150. In this embodiment, using a first selected active element from input vector src1 as a basis, the RunIncrA instruction increments the basis for each active element specified by predicate p. In the illustrated example code, the RunIncrA instruction stores intermediate value s into destination vector r prior to performing the increment operation.

EXAMPLE 150

| Program code RunIncrA |
|---|
| Vec RunIncrA(PredV gp, Vec src1, PredV p) |
| { |
|     Vector r; |
|     int x; |
|     Scalar<F/U><32/64> s; |
|     for(x=0;x<VECLEN;++x) |
|     { |
|         if(gp.v[x] && p.v[x]) |
|         { |
|             s = src1.v[x]; |
|             break; |
|         } |
|         else if(gp.v[x]) |
|             r.v[x] = src1.v[x]; |
|         else |
|             r.v[x] = <Z/M>; |
|     } |
|     for(; x<VECLEN; ++x) |
|     { |
|         if(gp.v[x]) |
|             r.v[x] = s; |
|         else |
|             r.v[x] = <Z/M>; |
|         if(gp.v[x] && p.v[x]) |
|             s = s + 1; |
|     } |
|     return(r); |
| } |

An example execution result of the RunIncrA instruction operating with predication is shown in execution example 151. The RunIncrA instruction proceeds in a similar fashion to the execution example described above in reference to the RunAddA instruction. In the case of the RunIncrA instruction, each time the operation is performed, an increment operation is performed as opposed to arithmetic addition.

EXAMPLE 151

| Execution of RunIncrA with predication |
|---|
| a = RunIncrAM(gp,b,p);<br>On Entry: gp = {1 1 1 1 1 0 1 0}<br>           p  = {0 1 1 0 0 1 1 0}<br>           a  = {9 9 9 9 9 9 9 9}<br>           b  = {3 3 3 3 3 3 3 3}<br>On Exit: a = {3 3 4 5 5 3 5 3} |

An example of the RunIncrA instruction operating with zeroing is shown in execution example 152. The execution with zeroing is similar to the execution with predication as described above in reference to execution example 151. When functioning in zeroing mode, however, the RunIncrA instruction copies a zero into the element position of destination vector r corresponding to element positions of predicate gp that contain a 0 value.

EXAMPLE 152

| Execution of RunIncrA with zeroing |
|---|
| a = RunIncrAZ(gp,b,p);<br>On Entry: gp = {1 1 1 1 1 0 1 0}<br>           p  = {0 1 1 0 0 1 1 0}<br>           a  = {9 9 9 9 9 9 9 9}<br>           b  = {3 3 3 3 3 3 3 3}<br>On Exit: a = {3 3 4 5 5 0 5 0} |

An embodiment of the RunIncrB instruction is illustrated in code example 153. The illustrated embodiment functions in a similar fashion to the RunIncrA instruction described above in reference to code example 150. In the case of the RunIncrB instruction, the increment operation is performed before the intermediate value s is stored in destination vector r.

EXAMPLE 153

| Program code RunIncrB |
|---|
| Vec RunIncrB(PredV gp, Vec src1, PredV p)<br>{<br>    Vector r;<br>    int x;<br>    Scalar<F/U><32/64> s;<br>    for(x=0;x<VECLEN;++x)<br>    {<br>        if(gp.v[x] && p.v[x])<br>        {<br>            s = src1.v[x];<br>            break;<br>        }<br>        else if(gp.v[x])<br>            r.v[x] = src1.v[x];<br>        else<br>            r.v[x] = <Z/M>;<br>    }<br>    for(; x<VECLEN; ++x) |

| Program code RunIncrB (-continued) |
|---|
|     {<br>        if(gp.v[x] && p.v[x])<br>            s = s + 1;<br>        if(gp.v[x])<br>            r.v[x] = s;<br>        else<br>            r.v[x] = <Z/M>;<br>    }<br>    return(r);<br>} |

An example of the RunIncrB instruction with predication is shown in execution example 154. The execution of the RunIncrB instruction with predication is similar to the execution of the RunIncrA instruction with predication as described above in reference to execution example 151.

EXAMPLE 154

| Execution of RunIncrB with predication |
|---|
| a = RunIncrBM(gp,b,p);<br>On Entry: gp = {1 1 1 1 1 0 1 0}<br>           p  = {0 1 1 0 0 1 1 0}<br>           a  = {9 9 9 9 9 9 9 9}<br>           b  = {3 3 3 3 3 3 3 3}<br>On Exit: a = {3 4 5 5 6 3 6 3} |

An example of the RunIncrB instruction with zeroing is shown in execution example 155. The execution of the RunIncrB instruction with zeroing is similar to the execution of the RunIncrB with predication as described above in reference to execution example 154. In the case of executing the RunIncrB instruction with zeroing, when an element of predicate gp is 0, a value of 0 is copied into destination vector r rather than copying the corresponding element from input vector a into destination vector r.

EXAMPLE 155

| Execution of RunIncrB with zeroing |
|---|
| a = RunIncrBZgp,b,p);<br>On Entry: gp = {1 1 1 1 1 0 1 0}<br>           p  = {0 1 1 0 0 1 1 0}<br>           a  = {9 9 9 9 9 9 9 9}<br>           b  = {3 3 3 3 3 3 3 3}<br>On Exit: a = {3 4 5 5 5 0 6 0} |

Wrapping Increment

In some embodiments, conditional cumulative increment operations may be implemented using instructions in the Macroscalar architecture. More particularly, as described further below, wrapping increment (WIncr) may be implemented. As described above in reference to the RunSum instruction, the WIncr instruction also includes A and B variants. The instructions are:
    Vec WIncrA(PredV gp, Vec src1, PredV p)
    Vec WIncrB(PredV gp, Vec src1, PredV p)
    One embodiment of a WIncrA instruction is shown in code example 156. The illustrated embodiment operates as described above in reference to the WAddA instruction. In this embodiment, however, a cumulative increment is performed rather than the cumulative sum of the WAddA instruction.

EXAMPLE 156

---
Program code WIncrA
---

```
Vec WIncrA(PredV gp, Vec src1, PredV p)
{
    Vector r;
    int x;
    Scalar<F/U><32/64> s;
    s = src1.v[VECLEN-1];
    for(x=0;x<VECLEN;++x)
    {
        if(x)
            s = src1.v[x];
        if(gp.v[x])
            break;
        r.v[x] = src1.v[v];
    }
    for(; x<VECLEN; ++x)
    {
        r.v[x] = s;
        if(gp.v[x] && p.v[x])
            s = s + 1;
    }
    return(r);
}
```

An example of the WIncrA instruction operation with wrapping is shown in execution example 157. The WIncrA instruction operates in a fashion similar to the WAddA instruction as described above in reference to execution example 13.

EXAMPLE 157

---
Execution of WIncrA with wrapping
---

```
b = WIncrA(gp,a,p);
On Entry:  gp =  {1 1 0 1 1 1 0 0}
           p  =  {1 1 0 0 1 1 1 0}
           a  =  {1 2 3 4 5 6 7 8}
On Exit:   b  =  {8 9 10 10 10 11 12 12}
```

An example of the WIncrA instruction without wrapping is shown in execution example 158. The execution of the WIncrA instruction without wrapping is similar to the execution of the WIncrA instruction with wrapping as described above in reference to execution example 157. In the case without wrapping, the basis is selected from the first active element from input vector a.

EXAMPLE 158

---
Execution of WIncrA without wrapping
---

```
b = WIncrA(gp,a,p);
On Entry:  gp =  {0 1 0 1 1 1 1 1}
           p  =  {0 0 1 0 1 1 1 1}
           a  =  {1 2 3 4 5 6 7 8}
On Exit:   b  =  {1 2 2 2 2 3 4 5}
```

An embodiment of the WIncrB instruction is illustrated in code example 159. The illustrated embodiment functions in a similar fashion to WIncrA instruction described above in reference to code example 156. In the case of the WIncrB instruction, the increment operation is performed before intermediate value s is stored in destination vector, and when the first active element of input vector src1 is not in the first element position, the basis is selected from the preceding element position of input vector src1.

EXAMPLE 159

---
Program code WIncrB
---

```
Vec WIncrB(PredV gp, Vec src1, PredV p)
{
    Vector r;
    int x;
    Scalar<F/U><32/64> s;
    s = src1.v[VECLEN-1];
    for(x=0;x<VECLEN;++x)
    {
        if(gp.v[x])
            break;
        s = src1.v[x];
        r.v[x] = src1.v[x];
    }
    for(; x<VECLEN; ++x)
    {
        if(gp.v[x] && p.v[x])
            s = s + 1;
        r.v[x] = s;
    }
    return(r);
}
```

An example of the WIncrB instruction with wrapping is shown in execution example 160. The execution of the WIncrB instruction with wrapping is similar to the execution of the WIncrA instruction with wrapping as described above in reference to execution example 157.

EXAMPLE 160

---
Execution of WIncrB with wrapping
---

```
b = WIncrB(gp,a,p);
On Entry:  gp =  {1 1 0 1 1 1 0 0}
           p  =  {1 1 0 0 1 1 1 0}
           a  =  {1 2 3 4 5 6 7 8}
On Exit:   b  =  {9 10 10 10 11 12 12 12}
```

An example of the WIncrB instruction without wrapping is shown in execution example 161. The execution of the WIncrB instruction without wrapping is similar to the execution of the WIncrA instruction without wrapping as described above in reference to execution example 158.

EXAMPLE 161

Execution of WIncrB without wrapping

```
b = WIncrB(gp,a,p);
On Entry:  gp =  {0 1 0 1 1 1 1 1}
           p  =  {0 0 1 0 1 1 1 1}
           a  =  {1 2 3 4 5 6 7 8}
           b  =  {2 3 2 3 2 3 2 3}
On Exit:   b  =  {1 1 1 1 2 3 4 5}
```

Running Decrement

In some embodiments, conditional cumulative decrement operations may be implemented using instructions in the Macroscalar architecture. More particularly, as described further below, running decrement (RunDecr) may be implemented.

The RunDecr instruction operates by conditionally decrementing a basis value for each active element specified by the predicate p. As with previously described instructions, the RunDecr instruction may have two embodiments. The instructions are:

Vec RunDecrA(PredV gp, Vec src1, PredV p)
Vec RunDecrB(PredV gp, Vec src1, PredV p)

One embodiment of a RunDecrA instruction is shown in code example 162. In this embodiment, using a first selected active element from input vector src1 as a basis, the RunDecrA instruction decrements the basis for each active element specified by predicate p. In the illustrated example code, the RunDecrA instruction stores intermediate value s into destination vector r prior to performing the decrement operation.

EXAMPLE 162

Program code RunDecrA

```
Vec RunDecrA(PredV gp, Vec src1, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
        else if(gp.v[x])
            r.v[x] = src1.v[x];
        else
            r.v[x] = <Z/M>;
    }
    for(; x<VECLEN; ++x)
    {
        if(gp.v[x])
            r.v[x] = s;
        else
            r.v[x] = <Z/M>;
        if(gp.v[x] && p.v[x])
            s = s - 1;
    }
    return(r);
}
```

An example of the RunDecrA instruction operating with predication is shown in execution example 163. The RunDecrA instruction proceeds in a similar fashion to the execution example described above in reference to the RunAddA instruction. In the case of the RunDecrA instruction, each time the operation is performed, a decrement operation is performed as opposed to arithmetic addition.

EXAMPLE 163

Execution of RunDecrA with predication

```
a = RunDecrAM(gp,b,p);
On Entry:  gp =  {1 1 1 1 1 1 1 0}
           p  =  {0 1 1 0 0 1 1 0}
           a  =  {9 9 9 9 9 9 9 9}
           b  =  {7 7 7 7 7 7 7 7}
On Exit:   a  =  {7 7 6 5 5 5 4 9}
```

An example of the RunDecrA instruction operating with zeroing is shown in execution example 164. The execution with zeroing is similar to the execution with predication as described above in reference to execution example 163. When functioning in zeroing mode, however, the RunDecrA instruction copies a zero into the element position of destination vector r corresponding to element positions of predicate gp that contain a 0 value.

EXAMPLE 164

Execution of RunDecrA with zeroing

```
a = RunDecrAZ(gp,b,p);
On Entry:  gp =  {1 1 1 1 1 1 1 0}
           p  =  {0 1 1 0 0 1 1 0}
           a  =  {9 9 9 9 9 9 9 9}
           b  =  {7 7 7 7 7 7 7 7}
On Exit:   a  =  {7 7 6 5 5 5 4 0}
```

An embodiment of the RunDecrB instruction is illustrated in code example 165. The illustrated embodiment functions in a similar fashion to the RunDecrA instruction described above in reference to code example 162. In the case of the RunDecrB instruction, the decrement operation is performed before the intermediate value s is stored in destination vector r.

EXAMPLE 165

Program code RunDecrB

```
Vec RunDecrB(PredV gp, Vec src1, PredV p)
{
    Vector r;
    int x;
    Scalar<F/U><32/64> s;
    for(x=0;x<VECLEN;++x)
    {
        if(gp.v[x] && p.v[x])
        {
            s = src1.v[x];
            break;
        }
```

-continued

Program code RunDecrB

```
    else if(gp.v[x])
        r.v[x] = src1.v[x];
    else
        r.v[x] = <Z/M>;
}
for(; x<VECLEN; ++x)
{
    if(gp.v[x] && p.v[x])
        s = s – 1;
    if(gp.v[x])
        r.v[x] = s;
    else
        r.v[x] = <Z/M>;
}
return(r);
}
```

An example of the RunDecrB instruction with predication is shown in execution example 166. The execution of the RunDecrB instruction with predication is similar to the execution of the RunDecrA instruction with predication as described above in reference to execution example 163.

EXAMPLE 166

Execution of RunDecrB with predication

```
a = RunDecrBM(gp,b,p);
On Entry:  gp =  {1 1 1 1 1 1 1 0}
           p  =  {0 1 1 0 0 1 1 0}
           a  =  {9 9 9 9 9 9 9 9}
           b  =  {7 7 7 7 7 7 7 7}
On Exit:   a  =  {7 6 5 5 5 4 3 7}
```

An example of the RunDecrB instruction with zeroing is shown in execution example 167. The execution of the RunDecrB instruction with zeroing is similar to the execution of the RunDecrB with predication as described above in reference to execution example 166. In the case of executing the RunDecrB instruction with zeroing, when an element of predicate gp is 0, a value of 0 is copied into destination vector r rather than copying the corresponding element from input vector a into destination vector r.

EXAMPLE 167

Execution of RunDecrB with zeroing

```
a = RunDecrBZ(gp,b,p);
On Entry:  gp =  {1 1 1 1 1 0 1 0}
           p  =  {0 1 1 0 0 1 1 0}
           a  =  {9 9 9 9 9 9 9 9}
           b  =  {7 7 7 7 7 7 7 7}
On Exit:   a  =  {7 6 5 5 5 0 4 0}
```

Wrapping Decrement

In some embodiments, conditional cumulative decrement operations may be implemented using instructions in the Macroscalar architecture. More particularly, as described further below, wrapping decrement (WDecr) may be implemented. As described above in reference to the RunSum instruction, the WDecr instruction also includes A and B variants. The instructions are:

Vec WDecrA(PredV gp, Vec src1, PredV p)

Vec WDecrB(PredV gp, Vec src1, PredV p)

One embodiment of a WDecrA instruction is shown in code example 168. The illustrated embodiment operates as described above in reference to the WAddA instruction. In this embodiment, however, a cumulative decrement is performed rather than the cumulative sum of the WAddA instruction.

EXAMPLE 168

Program code WDecrA

```
Vec WDecrA(PredV gp, Vec src1, PredV p)
{
    Vector r;
    int x;
    Scalar<F/U><32/64> s;
    s = src1.v[VECLEN–1];
    for(x=0;x<VECLEN;++x)
    {
        if(x)
            s = src1.v[x];
        if(gp.v[x])
            break;
        r.v[x] = src1.v[v];
    }
    for(; x<VECLEN; ++x)
    {
        r.v[x] = s;
        if(gp.v[x] && p.v[x])
            s = s – 1;
    }
    return(r);
}
```

An example of the WDecrA instruction operation with wrapping is shown in execution example 169. The WDecrA instruction operates in a fashion similar to the WAddA instruction as described above in reference to execution example 13.

EXAMPLE 169

Execution of WDecrA with wrapping

```
b = WDecrA(gp,a,p);
On Entry:  gp =  {1 1 0 1 1 1 0 0}
           p  =  {1 1 0 0 1 1 1 0}
           a  =  {1 2 3 4 5 6 7 8}
On Exit:   b  =  {8 7 6 6 6 5 4 4}
```

An example of the WDecrA instruction without wrapping is shown in execution example 170. The execution of the WDecrA instruction without wrapping is similar to the execution of the WDecrA instruction with wrapping as described above in reference to execution example 169. In the case without wrapping, the basis is selected from the first active element from input vector a.

EXAMPLE 170

Execution of WDecrA without wrapping

```
b = WDecrA(gp,a,p);
On Entry:  gp = {0 1 0 1 1 1 1 1}
           p  = {0 0 1 0 1 1 1 1}
           a  = {1 2 3 4 5 6 7 8}
On Exit:   b  = {1 1 1 1 1 0 -1 -2}
```

An embodiment of the WDecrB instruction is illustrated in code example 171. The illustrated embodiment functions in a similar fashion to WDecrA instruction described above in reference to code example 168. In the case of the WDecrB instruction, the decrement operation is performed before intermediate value s is stored in destination vector, and when the first active element of input vector src1 is not in the first element position, the basis is selected from the preceding element position of input vector src1.

EXAMPLE 171

Program code WDecrB

```
Vec WDecrB(PredV gp, Vec src1, PredV p)
{
    Vector r;
    int x;
    Scalar<F/U><32/64> s;
    s = src1.v[VECLEN-1];
    for(x=0;x<VECLEN;++x)
    {
        if(gp.v[x])
            break;
        s = src1.v[x];
        r.v[x] = src1.v[x];
    }
    for(; x<VECLEN; ++x)
    {
        if(gp.v[x] && p.v[x])
            s = s - 1;
        r.v[x] = s;
    }
    return(r);
}
```

An example of the WDecrB instruction with wrapping is shown in execution example 172. The execution of the WDecrB instruction with wrapping is similar to the execution of the WDecrA instruction with wrapping as described above in reference to execution example 169.

EXAMPLE 172

Execution of WDecrB with wrapping

```
b = WDecrB(gp,a,p);
On Entry:  gp = {1 1 0 1 1 1 0 0}
           p  = {1 1 0 0 1 1 1 0}
```

-continued

Execution of WDecrB with wrapping

```
           a  = {1 2 3 4 5 6 7 8}
On Exit:   b  = {7 6 6 6 5 4 4 4}
```

An example of the WDecrB instruction without wrapping is shown in execution example 173. The execution of the WDecrB instruction without wrapping is similar to the execution of the WDecrA instruction without wrapping as described above in reference to execution example 170.

EXAMPLE 173

Execution of WDecrB without wrapping

```
b = WDecrB(gp,a,p);
On Entry:  gp = {0 1 0 1 1 1 1 1}
           p  = {0 0 1 0 1 1 1 1}
           a  = {1 2 3 4 5 6 7 8}
On Exit:   b  = {1 1 1 1 0 -1 -2 -3}
```

Figure 17:
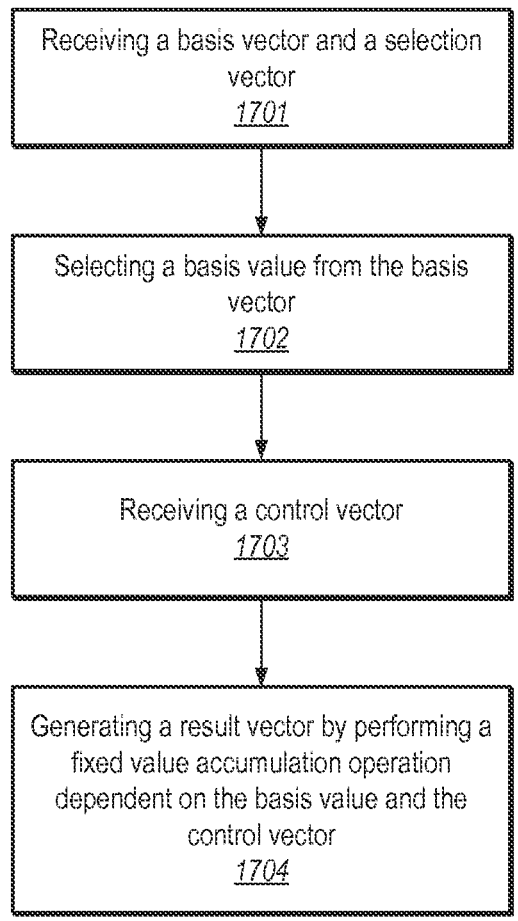
FIG. 17 is a flow diagram depicting the operation of one embodiment of the processor of FIG. 2 during execution of program instructions that implement a wrapping fixed-value accumulation operation.

In FIG. 17, a flow diagram depicting the operation of one embodiment of the processor of FIG. 2 during execution of program instructions that implement a wrapping fixed-value accumulation operation is shown. Referring collectively to FIG. 1, FIG. 2, and Examples 150-173, and beginning in block 1701 of FIG. 17, the processor 102 receives a basis vector (e.g., vector src1 of code example 156) and a selection vector (e.g., vector gp of code example 156). In some embodiments, the basis vector and the selection vector may be received from L1 cache 104 or L2 cache 106, while in other embodiments, the vectors may reside in memory 108 or mass storage device 110.

A basis value may then be selected from the basis vector (block 1702). For example, as described above in reference to the WIncB instruction, the element preceding the first active element of the basis vector is selected as the basis value unless the first active element is in the first element position. In some embodiments, when the first active element is in the first element position, the basis value may be selected from the last element position of the basis vector.

Processor 102 may also receive a control vector, such as, e.g., vector p of code example 120 (block 1703). As described above, processor 102 may receive the control vector from L1 cache 104, L2 cache 106, memory 108, or mass storage device 110. As noted previously, the control vector may be received concurrently with other inputs to instruction execution (e.g., the basis and selection vectors) or in any other suitable order. In embodiments where the wrapping fixed value accumulation operation is implemented as a unary instruction, a separate operand vector may not be received, unlike the previously discussed instructions. However, in some embodiments, the wrapping fixed value accumulation operation may be implemented as a binary or dyadic instruction that receives distinct basis and operand vectors. For example, the operand vector might be employed to supply the fixed value used for accumulation in embodiments where the fixed value is not implicitly defined.

A result vector (e.g., vector r of code example 156) may then be generated by performing a fixed value accumulation operation (e.g., increment or decrement) dependent on the basis value and on the control vector (block 1704). Although the increment or decrement operation may use a fixed value of +1 or −1, other fixed values may be employed in other embodiments as noted previously. In some embodiments, the fixed value accumulation operation may further depend on the selection vector (e.g., vector gp of code example 156). It is noted that the flow diagram depicted in FIG. 17 is merely an example and that additional operations and different orders of operations are possible and contemplated.

As shown in the various examples above, some embodiments of the increment/decrement operations are implemented as unary operations in which no src2 operand is explicitly specified. Rather, the increment/decrement operation that is performed may be implicit and non-parameterized. However, in other embodiments, a src2 operand may be specified and either ignored or utilized.

Also, for any of the foregoing increment/decrement operations, it is noted that the underlying hardware that implements the operations may be configured to perform the operations in parallel across some or all elements concurrently, rather than in a serial fashion. For example, for a given element position, such an implementation may be configured to add to the basis value the number of active element positions prior to the given element position. (Whether or not the given element position is included in the count of active elements may depend on whether the A or B variant of the instruction is being performed.) Thus, for example, for a set of elements 1-8, the increment or decrement operation for position 5 may be performed by adding the number of active ones of at least elements 1-4 to the basis, and doing so concurrently with similar operations on other elements.

Running and Wrapping Negation Operations

The following Negation, Inversion and Not operations may be referred to generally as negation operations. For example, the negation operations may include arithmetic negation (Neg), logical negation (Not), and bitwise inversion (Inv). As above, each running operation is described first, followed by the corresponding wrapping operation. As noted above with respect to the increment and decrement operations, the negation operations may be implemented as unary operations that specify only a single operand src1 while omitting src2, although in other embodiment, src2 may be specified but unused.

Running Negation

In some embodiments, recurrent negation operations may be implemented using instructions in the Macroscalar architecture. More particularly, as described further below, running arithmetic negation (RunNeg) may be implemented. The RunNeg instruction operates by conditionally arithmetically negating a basis value for each active element specified by the predicate p. As described above in reference to the RunSum instruction, the RunNeg instruction also includes A and B variants. The instructions are:

Vec RunNegA(PredV gp, Vec src1, PredV p);

Vec RunNegB(PredV gp, Vec src1, PredV p);

One embodiment of the RunNegA instruction is shown in code Example 174. In this embodiment, using a first selected active element from input vector src1 as a basis, the RunNegA instruction cumulatively arithmetically negates this basis for each active element specified by predicate p. In the illustrated example code, the RunNegA instruction stores intermediate value s into destination vector r prior to performing the arithmetic negation operation.

EXAMPLE 174

```
Program Code RunNegA

Vec RunNegA(PredV gp, Vec src1, PredV p)
{
    Vec r;
    Scalar<F/U><32/64> s;
    int x;
    for (x=0; x<VECLEN; ++x)
    {
        if (gp.v[x] && p.v[x])
        {
            s=src1.v[x];
            break;
        }
        else if (gp.v[x])
            r.v[x]=src1.v[x];
        else
            r.v[x]=<Z/M>;
    }
    for (; x<VECLEN; ++x)
    {
        if (gp.v[x] && p.v[x])
            s = -s;
        if (gp.v[x])
            r.v[x] = s;
        else
            r.v[x] = <Z/M>;
    }
    return(r);
}
```

An example execution result of the RunNegA instruction operating with predication is shown in execution example 175. The RunNegA instruction proceeds in a similar fashion to the execution example described above in reference to the RunIncrA instruction. However, in the case of the RunNegA instruction, each time the operation is performed, an arithmetic negation operation is performed rather than an increment operation.

EXAMPLE 175

```
Execution result of RunNegA with predication.

a = RunNegAM(gp,a,p);
On Entry:  gp = { 0 1 0 1 1 1 1 1 }
           a  = { 2 1 3 4 5 6 7 8 }
           p  = { 0 1 1 0 1 1 1 1 }
On Exit:   a  = { 2 1 3 -1 -1 1 -1 1 }
```

An example execution result of the RunNegA instruction operating with zeroing is shown in execution example 176.

EXAMPLE 176

```
Execution of RunNegA with zeroing a = RunNegAZ(gp,a,p);
On Entry:  gp = { 0 1 0 1 1 1 1 1 }
```

Execution of RunNegA with zeroing

```
           a  =  { 2 1 3 4 5 6 7 8 }
           p  =  { 0 1 1 0 1 1 1 1 }
On Exit:   a  =  { 0 1 0 -1 -1 1 -1 1 }
```

An embodiment of the RunNegB instruction is illustrated in code example 177. The illustrated embodiment of the RunNegB instruction functions in a similar fashion to the RunNegA instruction described above in reference to code example 174. However, in the case of the RunNegB instruction, the arithmetic negation operation is performed before the intermediate value s is stored in destination vector r.

EXAMPLE 177

Program Code RunNegB

```
Vec RunNegB(PredV gp, Vec src1, PredV p)
{
  Vec r;
  Scalar<F/U><32/64> s;
  int x;
  for (x=0; x<VECLEN; ++x)
  {
    if (gp.v[x] && p.v[x])
    {
      s=src1.v[x];
      break;
    }
    else if (gp.v[x])
      r.v[x]=src1.v[x];
    else r.v[x]=<Z/M>;
  }
  for (; x<VECLEN; ++x)
  {
    if (gp.v[x] && p.v[x])
      s = -s;
    if (gp.v[x])
      r.v[x] = s;
    else
      r.v[x] = <Z/M>;
  }
  return(r);
}
```

An example execution result of the RunNegB instruction operating with predication is shown in execution example 178. The RunNegB instruction proceeds in a similar fashion to the execution example described above in reference to the RunIncrB instruction. However, in the case of the RunNegB instruction, each time the operation is performed, an arithmetic negation operation is performed rather than an increment operation.

EXAMPLE 178

Execution of RunNegB with predication.

```
a = RunNegBM(gp,a,p);
On Entry:  gp =  { 0 1 0 1 1 1 1 1 }
           a  =  { 2 1 3 4 5 6 7 8 }
           p  =  { 0 1 1 0 1 1 1 1 }
On Exit:   a  =  { 2 -1 3 -1 1 -1 1 -1 }
```

An example execution result of the RunNegB instruction operating with zeroing is shown in execution example 179.

EXAMPLE 179

Execution of RunNegB with zeroing.

```
a = RunNegBZ(gp,a,p);
On Entry:  gp =  { 0 1 0 1 1 1 1 1 }
           a  =  { 2 1 3 4 5 6 7 8 }
           p  =  { 0 1 1 0 1 1 1 1 }
On Exit:   a  =  { 0 -1 0 -1 1 -1 1 -1 }
```

Wrapping Negation

In some embodiments, recurrent negation operations may be implemented using instructions in the Macroscalar architecture. More particularly, as described further below, wrapping negation (WNeg) may be implemented. As described above in reference to the RunSum instruction, the WNeg instruction also includes A and B variants. The instructions are:

Vec WNegA(PredV gp, Vec src1, PredV p)

Vec WNegB(PredV gp, Vec src1, PredV p)

One embodiment of a WNegA instruction is shown in code example 180. The illustrated embodiment of the WNegA instruction operates as described above in reference to the WAddA instruction. In this embodiment, however, a recurrent arithmetic negation is performed rather than the cumulative sum of the WAddA instruction.

EXAMPLE 180

Program Code WNegA

```
Vec WNegA(PredV gp, Vec src1, PredV p)
{
  Vec r;
  Scalar<32/64> s;
  int x;
  s = src1.v[VECLEN-1];
  for (x=0; x<VECLEN; ++x)
  {
    if (x) s = src1.v[x];
    if (gp.v[x])
      break;
    r.v[x] = src1.v[x];
  }
  for (; x<VECLEN; ++x)
  {
    r.v[x] = s;
    if (gp.v[x] && p.v[x])
      s = -s;
  }
  return(r);
}
```

An example of the WNegA instruction operation with wrapping is shown in execution example 181. The WNegA instruction operates in a fashion similar to the WAddA instruction as described above in reference to execution example 13.

EXAMPLE 181

| Execution of WNegA with wrapping |
| --- |
| b = WNegA(gp,a,p);<br>On Entry:  gp = {1 1 0 1 1 1 0 0}<br>              p = {1 1 0 0 1 1 1 0}<br>              a = {1 2 3 4 5 6 7 8}<br>On Exit:   b = {8 −8 8 8 8 −8 8 8} |

An example of the WNegA instruction without wrapping is shown in execution example 182. The execution of the WNegA instruction without wrapping is similar to the execution of the WNegA instruction with wrapping as described above in reference to execution example 181. However, in the case without wrapping, the basis is selected from the first active element from input vector a.

EXAMPLE 182

| Execution of WNegA without wrapping |
| --- |
| b = WNegA(gp,a,p);<br>On Entry:  gp = {0 1 0 1 1 1 1 1}<br>              p = {0 0 1 0 1 1 1 1}<br>              a = {1 2 3 4 5 6 7 8}<br>On Exit:   b = {1 2 2 2 2 −2 2 −2} |

An embodiment of the WNegB instruction is illustrated in code example 183. The embodiment of the WNegB instruction functions in a similar fashion to the WNegA instruction described above in reference to code example 180. In the case of the WNegB instruction, the arithmetic negation operation is performed before intermediate value s is stored in destination vector, and when the first active element of input vector src1 is not in the first element position, the basis is selected from the preceding element position of input vector src1.

EXAMPLE 183

| Program code WNegB |
| --- |
| ```
Vec WNegB(PredV gp, Vec src1, PredV p)
{
    Vector r;
    int x;
    Scalar<F/U><32/64> s;
    s = src1.v[VECLEN−1];
    for(x=0;x<VECLEN;++x)
    {
        if(gp.v[x])
            break;
        s = src1.v[x];
        r.v[x] = src1.v[x];
    }
    for(; x<VECLEN; ++x)
    {
        if(gp.v[x] && p.v[x])
            s = −s;
``` |

| Program code WNegB |
| --- |
| ```
        r.v[x] = s;
    }
    return(r);
}
``` |

An example of the WNegB instruction with wrapping is shown in execution example 184. The execution of the WNegB instruction with wrapping is similar to the execution of the WNegA instruction with wrapping as described above in reference to execution example 181.

EXAMPLE 184

| Execution of WNegB with wrapping |
| --- |
| b = WNegB(gp,a,p);<br>On Entry:  gp = {1 1 0 1 1 1 0 0}<br>              p = {1 1 0 0 1 1 1 0}<br>              a = {1 2 3 4 5 6 7 8}<br>On Exit:   b = {−8 8 8 8 −8 8 8 8} |

An example of the WNegB instruction without wrapping is shown in execution example 185. The execution of the WNegB instruction without wrapping is similar to the execution of the WNegA instruction without wrapping as described above in reference to execution example 182.

EXAMPLE 185

| Execution of WNegB without wrapping |
| --- |
| b = WNegB(gp,a,p);<br>On Entry:  gp = {0 1 0 1 1 1 1 1}<br>              p = {0 0 1 0 1 1 1 1}<br>              a = {1 2 3 4 5 6 7 8}<br>On Exit:   b = {1 1 1 1 −1 1 −1 1} |

Running Not

In some embodiments, recurrent negation operations may be implemented using instructions in the Macroscalar architecture. More particularly, as described further below, running logical negation (Not) (RunNot) may be implemented. The RunNot instruction operates by conditionally logically negating a basis value for each active element specified by the predicate p. As described above in reference to the RunSum instruction, the RunNot instruction also includes A and B variants. The instructions are:

Vec RunNotA(PredV gp, Vec src1, PredV p);

Vec RunNotB(PredV gp, Vec src1, PredV p);

One embodiment of the RunNotA instruction is shown in code example 186. In this embodiment, using a first selected active element from input vector src1 as a basis, the RunNotA instruction cumulatively logically negates this basis for each active element specified by predicate p. In the illustrated example code, the RunNotA instruction stores intermediate value s into destination vector r prior to performing the logical negation operation.

EXAMPLE 186

```
Program Code RunNotA

Vec RunNotA(PredV gp, Vec src1, PredV p)
    Vec r;
    Scalar<F/U/><32/64> s;
    int x;
    for (x=0; x<VECLEN; ++x)
    {
        if (gp.v[x] && p.v[x])
        {
            s=src1.v[x];
            break;
        }
        else
            if (gp.v[x])
                r.v[x]=src1.v[x];
            else
                r.v[x]=<Z/M>;
    }
    for (; x<VECLEN; ++x)
    {
        if (gp.v[x] && p.v[x])
            s = !s;
        if (gp.v[x])
            r.v[x] = s;
        else
            r.v[x] = <Z/M>;
    }
    return(r);
}
```

An example execution result of the RunNotA instruction operating with predication is shown in execution example 187. The RunNotA instruction proceeds in a similar fashion to the execution example described above in reference to the RunIncrA instruction. However, in the case of the RunNotA instruction, each time the operation is performed, a logical negation operation is performed rather than an increment operation.

EXAMPLE 187

```
Execution result of RunNotA with predication.

a = RunNotAM(gp,a,p);
On Entry:  gp = { 0 1 0 1 1 1 1 1 }
           a  = { 2 1 3 4 5 6 7 8 }
           p  = { 0 1 1 0 1 1 1 1 }
On Exit:   a  = { 2 1 3 0 0 1 0 1 }
```

An example execution result of the RunNotA instruction operating with zeroing is shown in execution example 188.

EXAMPLE 188

```
Execution result of RunNotA with zeroing.

a = RunNotAZ(gp,a,p);
On Entry:  gp = { 0 1 0 1 1 1 1 1 }
```

```
Execution result of RunNotA with zeroing.

a  = { 2 1 3 4 5 6 7 8 }
           p  = { 0 1 1 0 1 1 1 1 }
On Exit:   a  = { 0 1 0 0 0 1 0 1 }
```

An embodiment of the RunNotB instruction is illustrated in code example 189. The illustrated embodiment of the RunNotB instruction functions in a similar fashion to the RunNotA instruction described above in reference to code example 186. However, in the case of the RunNotB instruction, the logical negation operation is performed before the intermediate value s is stored in destination vector r.

EXAMPLE 189

```
Program Code RunNotB

Vec RunNegB(PredV gp, Vec src1, PredV p)
{
    Vec r;
    Scalar<F/U><32/64> s;
    int x;
    for (x=0; x<VECLEN; ++x)
    {
        if (gp.v[x] && p.v[x])
        {
            s=src1.v[x];
            break;
        }
        else if (gp.v[x])
            r.v[x]=src1.v[x];
        else r.v[x]=<Z/M>;
    }
    for (; x<VECLEN; ++x)
    {
        if (gp.v[x] && p.v[x])
            s = !s;
        if (gp.v[x])
            r.v[x] = s;
        else r.v[x] = <Z/M>;
    }
    return(r);
}
```

An example execution result of the RunNotB instruction operating with predication is shown in execution example 190. The RunNotB instruction proceeds in a similar fashion to the execution example described above in reference to the RunIncrB instruction. However, in the case of the RunNotB instruction, each time the operation is performed, a logical negation operation is performed rather than an increment operation.

EXAMPLE 190

```
Execution of RunNotB with predication.

a = RunNotBM(gp,a,p);
On Entry:  gp = { 0 1 0 1 1 1 1 1 }
           a  = { 2 1 3 4 5 6 7 8 }
           p  = { 0 1 1 0 1 1 1 1 }
On Exit:   a  = { 2 0 3 0 1 0 1 0 }
```

An example execution result of the RunNotB instruction operating with zeroing is shown in execution example 191.

EXAMPLE 191

Execution of RunNotB with zeroing.

a = RunNotBZ(gp,a,p);
On Entry: gp = { 0 1 0 1 1 1 1 1 }
          a  = { 2 1 3 4 5 6 7 8 }
          p  = { 0 1 1 0 1 1 1 1 }
On Exit:  a  = { 0 0 0 0 1 0 1 0 }

Wrapping Not

In some embodiments, recurrent logical not operations may be implemented using instructions in the Macroscalar architecture. More particularly, as described further below, wrapping logical negation (WNot) may be implemented. As described above in reference to the RunSum instruction, the WNot instruction also includes A and B variants. The instructions are:

Vec WNotA(PredV gp, Vec src1, PredV p)

Vec WNotB(PredV gp, Vec src1, PredV p)

One embodiment of a WNotA instruction is shown in code example 192. The illustrated embodiment of the WNotA instruction operates as described above in reference to the WAddA instruction. In this embodiment, however, a recurrent logical not is performed rather than the cumulative sum of the WAddA instruction.

EXAMPLE 192

Program Code WNotA

```
Vec WNotA(PredV gp, Vec src1, PredV p)
{
    Vec r;
    Scalar<F/U><32/64> s;
    int x;
    s = src1.v[VECLEN-1];
    for (x=0; x<VECLEN; ++x)
    {
        if (x) s = src1.v[x];
        if (gp.v[x])break;
            r.v[x] = src1.v[x];
    }
    for (; x<VECLEN; ++x)
    {
        r.v[x] = s;
        if (gp.v[x] && p.v[x])
            s = !s;
    }
    return(r);
}
```

An example result of the WNotA instruction operation with wrapping is shown in execution example 193. The WNotA instruction operates in a fashion similar to the WAddA instruction as described above in reference to execution example 13.

EXAMPLE 193

Execution of WNotA with wrapping b = WNotA(gp,a,p);
On Entry: gp = {1 1 0 1 1 1 0 0}
          p  = {1 1 0 0 1 1 1 0}
          a  = {2 3 4 5 6 7 8 9}
On Exit:  b  = {9 0 1 1 1 0 1 1}

An example result of the WNotA instruction without wrapping is shown in execution example 194. The execution of the WNotA instruction without wrapping is similar to the execution of the WNotA instruction with wrapping as described above in reference to execution example 193. In the case without wrapping, the basis is selected from the first active element from input vector a.

EXAMPLE 194

Execution of WNotA without wrapping b = WNotA(gp,a,p);
On Entry: gp = {0 1 0 1 1 1 1 1}
          p  = {0 0 1 0 1 1 1 1}
          a  = {2 3 4 5 6 7 8 9}
On Exit:  b  = {2 2 2 2 2 0 1 0}

An embodiment of the WNotB instruction is illustrated in code example 195. The illustrated embodiment of the WNotB instruction functions in a similar fashion to WNotA instruction described above in reference to code example 192. In the case of the WNotB instruction, the logical not operation is performed before intermediate value s is stored in destination vector, and when the first active element of input vector src1 is not in the first element position, the basis is selected from the preceding element position of input vector src1.

EXAMPLE 195

Program code WNotB

```
Vec WNotB(PredV gp, Vec src1, PredV p)
{
    Vector r;
    int x;
    Scalar<F/U><32/64> s;
    s = src1.v[VECLEN-1];
    for(x=0;x<VECLEN;++x)
    {
        if(gp.v[x])
            break;
        s = src1.v[x];
        r.v[x] = src1.v[x];
    }
    for(; x<VECLEN; ++x)
    {
        if(gp.v[x] && p.v[x])
            s = !s;
```

-continued

```
Program code WNotB r.v[x] = s;
    }
    return(r);
}
```

An example result of the WNotB instruction with wrapping is shown in execution example 196. The execution of the WNotB instruction with wrapping is similar to the execution of the WNotA instruction with wrapping as described above in reference to execution example 193.

EXAMPLE 196

```
Execution of WNotB with wrapping b = WNotB(gp,a,p);
On Entry:  gp = {1 1 0 1 1 1 0 0}
           p  = {1 1 0 0 1 1 1 0}
           a  = {2 3 4 5 6 7 8 9}
On Exit:   b  = {0 1 1 1 0 1 1 1}
```

An example result of the WNotB instruction without wrapping is shown in execution example 197. The execution of the WNotB instruction without wrapping is similar to the execution of the WNotA instruction without wrapping as described above in reference to execution example 194.

EXAMPLE 197

```
Execution of WNotB without wrapping b = WNotB(gp,a,p);
On Entry:  gp = {0 1 0 1 1 1 1 1}
           p  = {0 0 1 0 1 1 1 1}
           a  = {2 3 4 5 6 7 8 9}
On Exit:   b  = {2 2 2 2 0 1 0 1}
```

Running Inversion

In some embodiments, recurrent negation operations may be implemented using instructions in the Macroscalar architecture. More particularly, as described further below, running bitwise inversion (RunInv) may be implemented. The RunInv instruction operates by conditionally inverting each bit of a binary representation of a basis value for each active element specified by the predicate p. As described above in reference to the RunSum instruction, the RunInv instruction also includes A and B variants. The instructions are:

Vec RunInvA(PredV gp, Vec src1, PredV p);

Vec RunInvB(PredV gp, Vec src1, PredV p);

One embodiment of the RunInvA instruction is shown in code example 198. In this embodiment, using a first selected active element from input vector src1 as a basis, the RunInvA instruction cumulatively inverts the basis for each active element specified by predicate p. In this illustrated example, the RunInvA instruction stores the intermediate value s into destination vector r after performing the inversion operation.

EXAMPLE 198

```
Program Code RunInvA

Vec RunNotA(PredV gp, Vec src1, PredV p)
    Vec r;
    Scalar<F/U><32/64> s;
    int x;
    for (x=0; x<VECLEN; ++x)
    {
        if (gp.v[x] && p.v[x])
        {
            s=src1.v[x];
            break;
        }
        else
            if (gp.v[x])
                r.v[x]=src1.v[x];
            else r.v[x]=<Z/M>;
    }
    for (; x<VECLEN; ++x)
    {
        if (gp.v[x] && p.v[x])
            s = ~s;
        if (gp.v[x])
            r.v[x] = s;
        else
            r.v[x] = <Z/M>;
    }
    return(r);
}
```

An example execution result of the RunInvA instruction operating with predication is shown in execution example 199. The RunInvA instruction proceeds in a similar fashion to the execution example described above in reference to the RunNotA instruction. However, in the case of the RunInvA instruction, each time the operation is performed, a bitwise inversion operation is performed rather than a logical negation operation. The result vector a in Example 199 is shown in both a decimal and a hexadecimal representation to more effectively show the effect of the bitwise inversion operation.

EXAMPLE 199

```
Execution result of RunInvA with predication.

a = RunInvAM(gp,a,p);
On Entry:  gp = { 0  1  0  1  1  1  1  1  }
           a  = { 2  1  3  4  5  6  7  8  }
           p  = { 0  1  1  0  1  1  1  1  }
Exit(dec): a  = { 2  1  3 -2 -2  1 -2  1  }
Exit(hex): a  = { 2  1  3  fffffffe  fffffffe  1  fffffffe  1 }
```

An example execution result of the RunInvA instruction operating with zeroing is shown in execution example 200. As above, the result vector a in Example 199 is shown in both a decimal and hexadecimal.

EXAMPLE 200

Execution result of RunInvA with zeroing.

```
a = RunInvAZ(gp,a,p);
On Entry:   gp  =  {  0   1   0   1   1   1   1   1  }
            a   =  {  2   1   3   4   5   6   7   8  }
            p   =  {  0   1   1   0   1   1   1   1  }
Exit (dec): a   =  {  0   1   0  -2  -2   1  -2   1  }
Exit (hex): a   =  {  0   1   0   fffffffe fffffffe 1 fffffffe 1  }
```

An embodiment of the RunInvB instruction is illustrated in code example 201. The illustrated embodiment of the RunInvB instruction functions in a similar fashion to the RunInvA instruction described above in reference to code example 198. However, in the case of the RunInvB instruction, the bitwise inversion operation is performed before the intermediate value s is stored in destination vector r.

EXAMPLE 201

Program Code RunInvB

```
Vec RunNegB(PredV gp, Vec src1, PredV p)
{
    Vec r;
    Scalar<F/U><32/64> s;
    int x;
    for (x=0; x<VECLEN; ++x)
    {
        if (gp.v[x] && p.v[x])
        {
            s=src1.v[x];
            break;
        }
        else if (gp.v[x])
            r.v[x]=src1.v[x];
        else
            r.v[x]=<Z/M>;
    }
    for (; x<VECLEN; ++x)
    {
        if (gp.v[x] && p.v[x])
            s = ~s;
        if (gp.v[x])
            r.v[x] = s;
        else r.v[x] = <Z/M>;
    }
    return(r);
}
```

An example execution result of the RunInvB instruction operating with predication is shown in execution example 202. The RunInvB instruction proceeds in a similar fashion to the execution example described above in reference to the RunNotB instruction. However, in the case of the RunInvB instruction, each time the operation is performed, a bitwise inversion operation is performed rather than a logical negation operation. As above, the result vector a in Example 202 is shown in both a decimal representation and a hexadecimal representation.

EXAMPLE 202

Execution of RunInvB with predication.

```
a = RunInvBM(gp,a,p);
On Entry:   gp  =  {  0   1   0   1   1   1   1   1  }
            a   =  {  2   1   3   4   5   6   7   8  }
            p   =  {  0   1   1   0   1   1   1   1  }
Exit (dec): a   =  {  2  -2   3  -2   1  -2   1  -2  }
Exit (hex): a   =  {  2  fffffffe  3  fffffffe  1  fffffffe  1  fffffffe  }
```

An example execution result of the RunInvB instruction operating with zeroing is shown in execution example 203. As above, the result vector a in Example 203 is shown in both a decimal representation and a hexadecimal representation.

EXAMPLE 203

Execution of RunInvB with zeroing.

```
a = RunInvBZ(gp,a,p);
On Entry:   gp  =  {  0   1   0   1   1   1   1   1  }
            a   =  {  2   1   3   4   5   6   7   8  }
            p   =  {  0   1   1   0   1   1   1   1  }
Exit (dec): a   =  {  0  -2   0  -2   1  -2   1  -2  }
Exit (hex): a   =  {  0  fffffffe  0  fffffffe  1  fffffffe  1  fffffffe  }
```

Wrapping Inversion

In some embodiments, recurrent bitwise inversion operations may be implemented using instructions in the Macroscalar architecture. More particularly, as described further below, wrapping bitwise inversion (WInv) may be implemented. As described above in reference to the RunSum instruction, the WInv instruction also includes A and B variants. The instructions are:

Vec WInvA(PredV gp, Vec src1, PredV p)
Vec WInvB(PredV gp, Vec src1, PredV p)

One embodiment of a WInvA instruction is shown in code example 204. The illustrated embodiment of the WInvA instruction operates as described above in reference to the WAddA instruction. In this embodiment, however, a recurrent bitwise inversion is performed rather than the cumulative sum of the WAddA instruction.

EXAMPLE 204

Program Code WInvA

```
Vec WInvA(PredV gp, Vec src1, PredV p)
{
    Vec r;
    Scalar<32/64> s;
    int x;
    s = src1.v[VECLEN-1];
    for (x=0; x<VECLEN; ++x)
    {
```

-continued

Program Code WInvA

```
        if (x) s = src1.v[x];
        if (gp.v[x])break;
            r.v[x] = src1.v[x];
    }
    for (; x<VECLEN; ++x)
    {
        r.v[x] = s;
        if (gp.v[x] && p.v[x])
            s = ~s;
    }
    return(r);
}
```

An example result of the WInvA instruction operation with wrapping is shown in execution example 205. The WInvA instruction operates in a fashion similar to the WAddA instruction as described above in reference to execution example 13.

EXAMPLE 205

| Execution of WInvA with wrapping | | |
|---|---|---|
| b = WInvA(gp,a,p); | | |
| On Entry: | gp = | {1 1 0 1 1 1 0 0} |
| | p = | {1 1 0 0 1 1 1 0} |
| | a = | {1 2 3 4 5 6 7 8} |
| On Exit: | b = | {8 247 8 8 8 247 8 8} |

An example result of the WInvA instruction without wrapping is shown in execution example 206. The execution of the WInvA instruction without wrapping is similar to the execution of the WInvA instruction with wrapping as described above in reference to execution example 205. In the case without wrapping, the basis is selected from the first active element from input vector a.

EXAMPLE 206

| Execution of WInvA without wrapping | | |
|---|---|---|
| b = WInvA(gp,a,p); | | |
| On Entry: | gp = | {0 1 0 1 1 1 1 1} |
| | p = | {0 0 1 0 1 1 1 1} |
| | a = | {1 2 3 4 5 6 7 8} |
| On Exit: | b = | {1 2 2 2 2 253 2 253} |

An embodiment of the WInvB instruction is illustrated in code example 207. The illustrated embodiment of the WInvB instruction functions in a similar fashion to WInvA instruction described above in reference to code example 204. In the case of the WInvB instruction, the bitwise inversion operation is performed before intermediate value is stored in destination vector, and when the first active element of input vector src1 is not in the first element position, the basis is selected from the preceding element position of input vector src1.

EXAMPLE 207

Program code WInvB

```
Vec WInvB(PredV gp, Vec src1, PredV p)
{
    Vector r;
    int x;
    Scalar<F/U><32/64> s;
    s = src1.v[VECLEN-1];
    for(x=0;x<VECLEN;++x)
    {
        if(gp.v[x])
            break;
        s = src1.v[x];
        r.v[x] = src1.v[x];
    }
    for(; x<VECLEN; ++x)
    {
        if(gp.v[x] && p.v[x])
            s = ~s;
        r.v[x] = s;
    }
    return(r);
}
```

An example of the WInvB instruction with wrapping is shown in execution example 208. The execution of the WInvB instruction with wrapping is similar to the execution of the WInvA instruction with wrapping as described above in reference to execution example 205. In execution example 208, 8-bits of data storage are assumed for each number. Other embodiments may employ differing numbers of data storage bits which may result in different result values.

EXAMPLE 208

| Execution of WInvB with wrapping | | |
|---|---|---|
| b = WInvB(gp,a,p); | | |
| On Entry: | gp = | {1 1 0 1 1 1 0 0} |
| | p = | {1 1 0 0 1 1 1 0} |
| | a = | {1 2 3 4 5 6 7 8} |
| On Exit: | b = | {247 8 8 8 247 8 8 8} |

An example of the WInvB instruction without wrapping is shown in execution example 209. The execution of the WInvB instruction without wrapping is similar to the execution of the WInvA instruction without wrapping as described above in reference to execution example 206.

EXAMPLE 209

| Execution of WInvB without wrapping | | |
|---|---|---|
| b = WInvB(gp,a,p); | | |
| On Entry: | gp = | {0 1 0 1 1 1 1 1} |
| | p = | {0 0 1 0 1 1 1 1} |
| | a = | {1 2 3 4 5 6 7 8} |
| On Exit: | b = | {1 2 2 2 253 2 253 2} |

Figure 18:
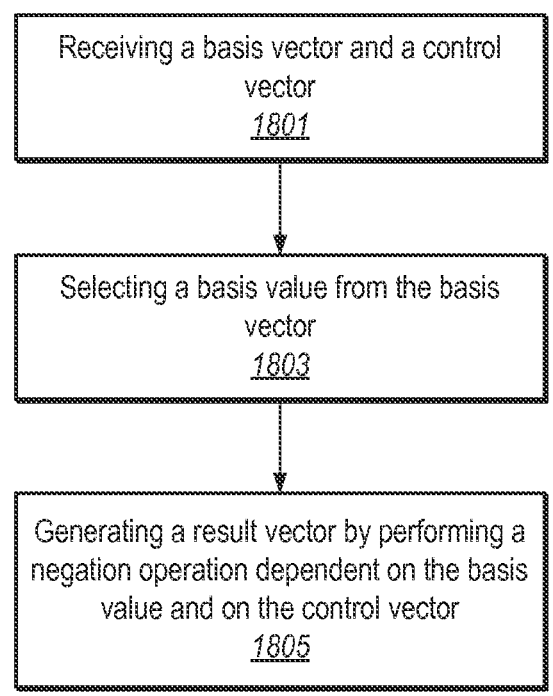
FIG. 18 is a flow diagram depicting the operation of one embodiment of the processor of FIG. 2 during execution of program instructions that implement wrapping negation operations.

In FIG. 18, a flow diagram depicting the operation of one embodiment of the processor of FIG. 2 during execution of program instructions that implement running and wrapping negation operations is shown. Referring collectively to FIG. 1, FIG. 2, and Examples 174-209, and beginning in block 1801 of FIG. 18, the processor 102 receives a basis vector (e.g., vector src1 of code examples 174 and 180) and a control vector (e.g., vector gp of code examples 174 and 180). In some embodiments, the basis vector and the control vector may be received from L1 cache 104 or L2 cache 106, while in other embodiments, the vectors may be received from memory 108 or from mass storage device 100.

In one embodiment, a basis value may be selected from the basis vector (block 1803). For example, as described above in reference to the WNegB instruction, the element preceding the first active element of the input vector may be selected as the basis value unless the first active element is in the first element position. In some embodiments, when the first active element is in the first element position, the basis value may be selected from the last position of the input vector.

A result vector (e.g., vector r of code examples 174 and 180) may then be generated by performing a negation operation (e.g., arithmetic negation, logical negation, bitwise inversion) dependent on the basis value and on the control vector (block 1805). More particularly, the negation operation may be repeatedly performed on the basis value for various element positions of the output vector, dependent on the control vector. It is noted that the flow diagram depicted in FIG. 18 is merely an example and that additional operations and different orders of operations are possible and contemplated.

For any of the foregoing negation operations, it is noted that the underlying hardware that implements the operations may be configured to perform the operations in parallel across some or all elements concurrently, rather than in a serial fashion. For example, for a given element position, such an implementation may be configured to determine whether the number of active element positions prior to the given element position is even or odd, and dependent upon this determination, either using the basis value or the negated basis value as the result for the given element position. (Whether or not the given element position is included in the count of active elements for the purpose of determining whether that count is even or odd may depend on whether the A or B variant of the instruction is being performed.) Thus, for example, for a set of elements 1-8, the negation operation for position 5 may be performed by determining whether the number of active ones of at least elements 1-4 is even or odd and correspondingly using the basis or negated basis value as the result for the given element position, and doing so concurrently with similar operations on other elements.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method, comprising:
performing, by a processor:
receiving an input vector, a basis vector, a selection vector, and a control vector;
selecting a basis value from the basis vector dependent upon the selection vector; and
generating a result vector dependent upon the selected basis value;
wherein each of the input vector, the basis vector, the selection vector, the control vector, and the result vector includes a respective plurality of elements that occupy N ordered element positions, wherein the N ordered element positions include an initial element position and a last element position;
wherein N is an integer greater than one;
wherein for each given one of the N ordered element positions, said generating comprises performing a product or quotient operation across selected elements of the input vector dependent upon the control vector and the basis value, such that for a particular one of the N ordered element positions, performing the product or quotient operation for the particular element position is dependent upon one or more element positions prior to the particular element position.

2. The method of claim 1, wherein the selecting the basis value comprises:
selecting the basis value from the basis vector at an element position in the basis vector that corresponds to an initial active element position of the ordered element positions in the selection vector, wherein the initial active element position precedes any other active element positions in the selection vector.

3. The method of claim 2, wherein selecting the basis value further comprises selecting the basis value from a last ordered element position of the basis vector in response to a determination that a first ordered element position of the selection vector is active.

4. The method of claim 1, wherein selecting the basis value further comprises selecting the basis value from an element position of the basis vector corresponding to an element position immediately preceding an initial active element position of the selection vector, wherein the initial active element position precedes any other active element positions in the selection vector.

5. A system, comprising:
one or more memories that, during operation of the system, store instructions; and
one or more processors that, during operation of the system, retrieve one or more instructions from the one or more memories and execute the one or more instructions to cause the system to perform operations comprising:
receiving an input vector;
receiving a basis vector;
receiving a selection vector;
receiving a control vector; and
selecting a basis value from the basis vector dependent upon the selection vector; and
generating a result vector dependent upon the selected basis value;
wherein each of the input vector, the control vector, the basis vector, the selection vector, and the result vector includes a respective plurality of elements that occupy N ordered element positions, wherein the N ordered element positions include an initial element position and a last element position;
wherein N is an integer greater than one;
wherein generating the result vector comprises performing a product or quotient operation across selected elements of the input vector dependent upon the control vector and the basis value, such that for a particular one of the N ordered element positions, performing the product or quotient operation for the particular element position is dependent upon one or more element positions prior to the particular element position.

6. The system of claim 5, wherein the product or quotient operation comprises arithmetic multiplication or division.

7. The system of claim 6, wherein selecting the basis value from the basis vector dependent upon the selection vector comprises selecting the basis value from the basis vector at an element position that corresponds to an initial active element position of the ordered element positions in the selection vector, wherein the initial active element position precedes any other active element positions in the selection vector.

8. A processor, comprising:
one or more processor cores, wherein a given one of the one or more processor cores is configured to:
receive an input vector, a selection vector, a basis vector, and a control vector;
select a basis value from the basis vector dependent upon the selection vector; and
generate a result vector dependent upon the selected basis value;
wherein each of the input vector, the selection vector, the basis vector, the control vector, and the result vector includes a respective plurality of elements that occupy N ordered element positions, wherein the N ordered element positions include an initial element position and a last element position;
wherein N is an integer greater than one;
wherein to generate the result vector, the given processor core is further configured to perform a product or quotient operation across selected elements of the input vector dependent upon the control vector and the basis value, such that to generate an element of the result vector at a particular one of the N ordered element positions of the result vector, the given processor core is configured to perform the product or quotient operation for the particular element position dependent upon one or more element positions prior to the particular element position.

9. The processor of claim 8, wherein to select the basis value, the given one of the one or more processor cores is further configured to select the basis value from an element position of the basis vector corresponding to an element position immediately preceding an initial active element position of the selection vector, wherein the initial active element position precedes any other active element positions in the selection vector.

10. The processor of claim 8, wherein to select the basis value, the given one of the one or more processor cores is further configured to select the basis value from the last element position of the basis vector responsive to a determination that an element in the initial element position of the selection vector is active.

11. The processor of claim 10, wherein to generate the result vector, the given one of the one or more processor cores is further configured to set a given element position of the result vector to a value that is equivalent to performing a product or quotient operation on a set of elements that includes the basis value and elements of the input vector corresponding to active element positions of the control vector.

12. A method, comprising:
performing, by one or more processors:
receiving a basis vector, an operand vector, a selection vector, and a control vector;
selecting a basis value from the basis vector at a last element position in the basis vector responsive to a determination that an initial active element is in an initial element position of the selection vector; and
generating a result vector dependent upon the selected basis value;
wherein each of the basis vector, the operand vector, the selection vector, the control vector, and the result vector includes a respective plurality of elements that occupy N ordered element positions, wherein the N ordered element positions include an initial element position and a last element position;
wherein N is an integer greater than one;
wherein for each given one of the N ordered element positions, said generating comprises performing a product or quotient operation across selected elements of the operand vector dependent upon the control vector and the selection vector.

13. The method of claim 12, wherein for a given element position indicated by the control vector, generating the result vector comprises setting the given element position of the result vector to a value that is equivalent to performing a product or quotient operation on a set of elements that includes the basis value and elements of the operand vector corresponding to active element positions of the control vector that are prior to and including the given element position.

14. The method of claim 12, wherein for a given element position indicated by the control vector, generating the result vector comprises setting the given element position of the result vector to a value that is equivalent to performing a product or quotient operation on a set of elements that includes the basis value and elements of the operand vector corresponding to active element positions of the control vector that are prior to and excluding the given element position.

15. A system, comprising:
one or more memories that, during operation of the system, store instructions; and
one or more processors that, during operation of the system, retrieve one or more instructions from the one or more memories and execute the one or more instructions to cause the system to perform operations comprising:
receiving a basis vector, an operand vector, a selection vector, and a control vector;
generating a result vector;
wherein each of the basis vector, the control vector, the operand vector, the selection vector and the result vector includes a respective plurality of elements that occupy N ordered element positions, wherein the N ordered element positions include an initial element position and a last element position;
wherein N is an integer greater than one;
selecting a basis value from the last element position of the basis vector responsive to a determination that an initial active element of the selection vector is in the initial element position of the selection vector;
wherein generating the result vector comprises performing a product or quotient operation across selected elements of the operand vector dependent upon the control vector and the basis value.

16. The system of claim 15, wherein selecting the basis value comprises selecting the basis value from an element position in the basis vector that corresponds to an initial active element of the ordered element positions in the selection vector, wherein the initial active element position precedes any other active element positions in the selection vector.

17. The system of claim 15, wherein for element positions prior to an first initial active element position of the ordered element positions in the selection vector, wherein the initial active element position precedes any other active element position in the selection vector, generating the result vector further comprises copying a value from an element position of the basis vector into a corresponding inactive element position of the result vector, wherein the inactive element position of the result vector is indicated by the control vector.

* * * * *

UNITED STATES PATENT AND TRADEMARK OFFICE
CERTIFICATE OF CORRECTION

PATENT NO. : 8,539,205 B2
APPLICATION NO. : 13/625131
DATED : September 17, 2013
INVENTOR(S) : Gonion It is certified that error appears in the above-identified patent and that said Letters Patent is hereby corrected as shown below:

In the Specification

In column 1, line 8, please delete "Ser. No. 12/541,505" and insert --Ser. No. 12/541,526-- therefor.

Signed and Sealed this
Twenty-ninth Day of October, 2013

Teresa Stanek Rea
*Deputy Director of the United States Patent and Trademark Office*